(12) United States Patent
Endo

(10) Patent No.: US 9,300,023 B2
(45) Date of Patent: Mar. 29, 2016

(54) THIN FILM BALUN

(71) Applicant: TDK CORPORATION, Tokyo (JP)

(72) Inventor: Makoto Endo, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 14/723,242

(22) Filed: May 27, 2015

(65) Prior Publication Data
US 2015/0263404 A1 Sep. 17, 2015

Related U.S. Application Data

(60) Continuation of application No. 14/031,655, filed on Sep. 19, 2013, now Pat. No. 9,077,059, which is a division of application No. 12/823,450, filed on Jun. 25, 2010, now Pat. No. 8,648,667.

(30) Foreign Application Priority Data

| Jun. 30, 2009 | (JP) | ................................. 2009-156239 |
| Jun. 30, 2009 | (JP) | ................................. 2009-156241 |
| Jul. 2, 2009 | (JP) | ................................. 2009-157726 |
| Aug. 21, 2009 | (JP) | ................................. 2009-192593 |
| Aug. 21, 2009 | (JP) | ................................. 2009-192594 |

(51) Int. Cl.
*H03H 7/42* (2006.01)
*H01P 5/10* (2006.01)
(Continued)

(52) U.S. Cl.
CPC ................. *H01P 5/10* (2013.01); *H03H 7/422* (2013.01); *H03H 2001/0078* (2013.01)

(58) Field of Classification Search
CPC ..................................... H03H 7/42; H01P 3/08
USPC .............................................. 333/25, 26, 238
See application file for complete search history.

(56) References Cited

U.S. PATENT DOCUMENTS

| 5,497,137 A | 3/1996 | Fujiki |
| 7,183,872 B2 | 2/2007 | Lee et al. |

(Continued)

FOREIGN PATENT DOCUMENTS

| JP | 2001-168607 A | 6/2001 |
| JP | 2002-271111 A | 9/2002 |

(Continued)

OTHER PUBLICATIONS

Dec. 4, 2014 Office Action issued in U.S. Appl. No. 14/031,655.
(Continued)

*Primary Examiner* — Dean Takaoka
(74) *Attorney, Agent, or Firm* — Oliff PLC

(57) ABSTRACT

A thin film balun that can be made smaller and thinner while maintaining required balun characteristics is provided. A thin film balun 1 includes: an unbalanced transmission line UL including a first coil portion C1 and a second coil portion C2; a balanced transmission line BL including a third coil portion C3 and a fourth coil portion C4 that are positioned facing and magnetically coupled to the first coil portion C1 and the second coil portion C2 respectively; an unbalanced terminal UT connected to the first coil portion C1; a ground terminal G connected to the second coil portion C2 via a C component D; and an electrode D2 connected to the ground terminal G and facing a part of the second coil portion C2. The C component D is formed by the electrode D2 and the part D1 of the second coil portion C2.

18 Claims, 90 Drawing Sheets

(51) Int. Cl.
*H01P 3/08* (2006.01)
*H03H 1/00* (2006.01)

(56) References Cited

U.S. PATENT DOCUMENTS

| | | |
|---|---|---|
| 7,471,166 B2 | 12/2008 | Wei et al. |
| 7,511,591 B2 | 3/2009 | Ezzendine |
| 7,528,676 B2 | 5/2009 | Kearns et al. |
| 7,629,860 B2 | 12/2009 | Liu et al. |
| 7,692,511 B2 | 4/2010 | Degani et al. |
| 7,948,331 B2 | 5/2011 | Endo |
| 8,085,111 B2 | 12/2011 | Endo |
| 8,143,968 B2 | 3/2012 | Endo |
| 8,203,396 B2 | 6/2012 | Endo |
| 8,212,630 B2 | 7/2012 | Endo |
| 2003/0025571 A1 | 2/2003 | Maekawa et al. |
| 2006/0061429 A1 | 3/2006 | Lee et al. |
| 2008/0303606 A1 | 12/2008 | Liu et al. |

FOREIGN PATENT DOCUMENTS

| | | |
|---|---|---|
| JP | 2004-056745 A | 2/2004 |
| JP | 2004-320561 A | 11/2004 |
| JP | 2006-094462 A | 4/2006 |
| JP | 2006-270444 A | 10/2006 |
| JP | 2007-274501 A | 10/2007 |

OTHER PUBLICATIONS

Mar. 2, 2015 Notice of Allowance issued in U.S. Appl. No. 14/031,655.

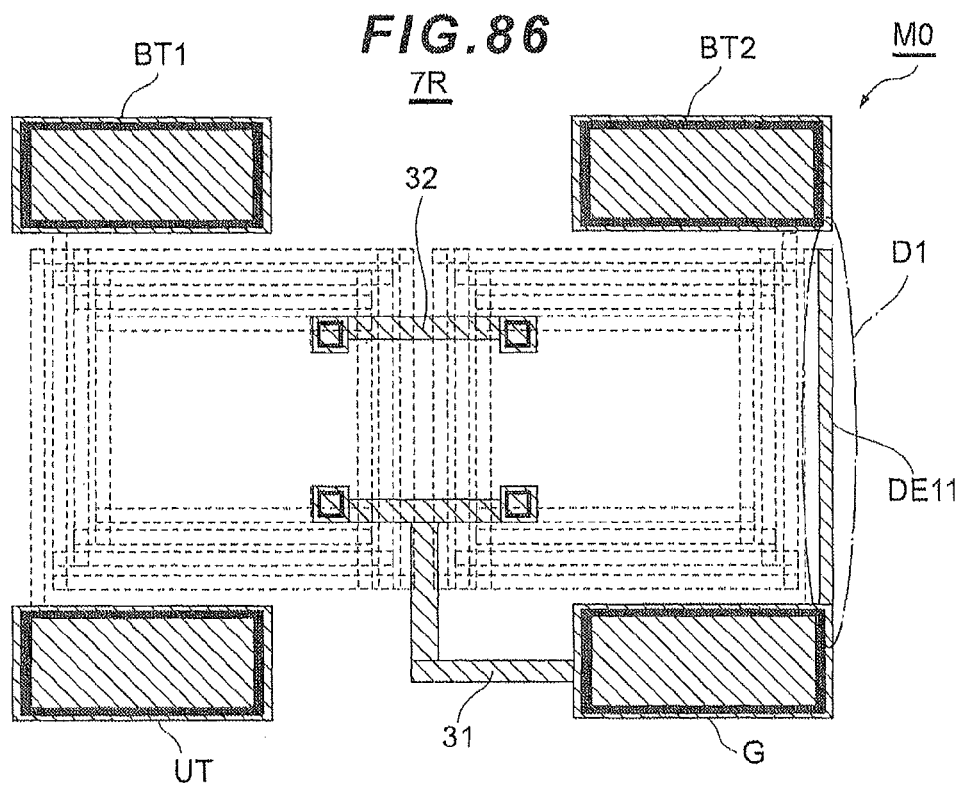

THIN FILM BALUN

CROSS REFERENCE TO RELATED APPLICATION

This application is a continuation application of U.S. application Ser. No. 14/031,655, filed Sep. 19, 2013, which is a divisional application of U.S. application Ser. No. 12/823,450, filed Jun. 25, 2010 and claims the benefit of Japanese Application Nos. 2009-156239 filed on Jun. 30, 2009, No. 2009-157726 filed on Jul. 2, 2009, No. 2009-156241 filed on Jun. 30, 2009, No. 2009-192593 filed on Aug. 21, 2009 and No. 2009-192594 filed on Aug. 21, 2009, which are incorporated herein by reference.

BACKGROUND OF THE INVENTION

1. Field of the Invention

The present invention relates to a balun (balun transformer) that performs conversion between unbalanced and balanced signals, and in particular relates to a thin film balun that is formed by a thin film process advantageous for smaller and thinner models.

2. Description of the Related Art

A wireless communication device includes various high frequency elements such as an antenna, a filter, an RF switch, a power amplifier, an RF-IC, and a balun. Of these elements, a resonant element such as an antenna or a filter handles (transmits) an unbalanced signal which is based on a ground potential, whereas an RF-IC which generates or processes a high frequency signal handles (transmits) a balanced signal. Accordingly, when electromagnetically connecting these two elements, a balun that functions as an unbalanced-balanced converter is used.

Recently, there is a demand for smaller and thinner baluns for use in wireless LAN devices, mobile communication devices such as a mobile phone and a portable terminal, and so on. As one of such baluns, for example, Japanese Patent Application Laid-Open No. 2006-270444 and Japanese Patent Application Laid-Open No. 2001-168607 each propose a balun having a structure in which a capacitor is connected to at least one of an unbalanced circuit and a balanced circuit.

SUMMARY OF THE INVENTION

In view of this, it is desired to provide a thin film balun that can be made smaller and thinner while maintaining required balun characteristics.

A thin film balun according to a first aspect of the present invention is a thin film balun including: an unbalanced circuit; a balanced circuit magnetically coupled to the unbalanced circuit; and a capacitor connected to the unbalanced circuit, wherein a part of a line portion constituting the unbalanced circuit serves as one electrode of the capacitor.

According to this structure, the part of the line portion constituting the unbalanced circuit serves as one electrode of the capacitor, thereby introducing a capacitance C in a resonant circuit of the thin film balun. This enables the thin film balun to be made smaller and thinner. As a result of conducting intense study, the present inventor has found that, when the part of the line portion serves as the electrode of the capacitor, balance characteristics of a transmission signal can be adjusted while suppressing an increase in resonant frequency in passage characteristics of the transmission signal and maintaining the passage characteristics in a desired range (specifications).

Though details of a functional mechanism are still unclear, the following assumption can be made. When the part of the line portion constituting the unbalanced circuit serves as the electrode of the capacitor, the capacitor is positioned near the unbalanced circuit. Therefore, not only the capacitance C is introduced directly, but also a capacitance like a stray capacitance is induced with its neighboring line portions, which leads to an increase in effective capacitance on the unbalanced circuit side. Hence, by changing a position or an area of the line portion serving as the electrode of the capacitor, the balance characteristics can be adjusted easily while maintaining desired passage characteristics according to the specifications of the thin film balun. Note, however, that the function is not limited to such.

For example, the thin film balun according to the first aspect of the present invention is a thin film balun including: an unbalanced transmission line; and a balanced transmission line positioned facing the unbalanced transmission line and magnetically coupled to the unbalanced transmission line, wherein one end of the unbalanced transmission line is connected to an unbalanced terminal, and an other end of the unbalanced transmission line is connected to a ground terminal via a C component, and wherein the C component is formed by an opposite electrode and a part of a line portion constituting the unbalanced transmission line. As a more specific example, the thin film balun according to the present invention is a thin film balun including: an unbalanced transmission line including a first line portion and a second line portion; a balanced transmission line including a third line portion and a fourth line portion that are positioned facing the first line portion and the second line portion and magnetically coupled to the first line portion and the second line portion, respectively; an unbalanced terminal connected to the first line portion; a ground terminal connected to the second line portion via a C component; and an opposite electrode connected to the ground terminal and facing a part of the second line portion, wherein the C component is formed by the opposite electrode and the part of the second line portion. According to this structure, the same function as described above can be attained.

Preferably, the second line portion has an extension that extends from (that is formed by being extended from) a line portion of the second line portion corresponding to the first line portion, wherein the opposite electrode faces the extension of the second line portion, and wherein the C component is formed by the opposite electrode and the extension of the second line portion. Here, the following assumption can be made. According to this structure, the second line portion includes the extension. Therefore, the magnetic coupling between the first line portion and the third line portion and the magnetic coupling between the second line portion and the fourth line portion are maintained equivalently. Moreover, since the C component is positioned outside a region directly coupled to the balanced transmission line, the capacitance is effectively introduced in the resonant circuit of the thin film balun, so that the thin film balun can be made smaller and thinner. As a result, the suppression of the resonant frequency increase and the improvement of the balance characteristics of the transmission signal can both be achieved. Note, however, that the function is not limited to such.

For example, the thin film balun according to the first aspect of the present invention is a thin film balun including: an unbalanced transmission line including a first coil portion and a second coil portion; a balanced transmission line including a third coil portion and a fourth coil portion that are positioned facing the first coil portion and the second coil portion and magnetically coupled to the first coil portion and the second coil portion, respectively; an unbalanced terminal connected to the first coil portion; a ground terminal connected to the second coil portion via a C component; and an opposite electrode connected to the ground terminal and facing a part of the second coil portion, wherein the C component is formed by the opposite electrode and the part of the second coil portion. According to this structure, the same function as described above can be attained.

For example, the opposite electrode faces a part of a coil conductor that is closer to an outer peripheral coil conductor than an inner peripheral coil conductor in the second coil portion. Here, the following assumption can be made. According to this structure, the opposite electrode can be appropriately separated from a coil opening through which a magnetic flux generated by the magnetic coupling of the second coil portion and the fourth coil portion passes. Therefore, as described above, while maintaining the magnetic coupling between the first coil portion and the third coil portion and the magnetic coupling between the second coil portion and the fourth coil portion in a near-equivalent state, the capacitance is effectively introduced in the resonant circuit of the thin film balun, as a result of which the suppression of the resonant frequency increase and the improvement of the balance characteristics of the transmission signal can both be achieved. Note, however, that the function is not limited to such. In this case, preferably, the opposite electrode faces a part of the outer peripheral coil conductor in the second coil portion.

Moreover, as a result of further conducting intense study, the present inventor has found more favorable structural examples of the opposite electrode. As an example, it is useful that the opposite electrode is parallel to (i.e., provided along with) an extending direction of a part of a space between adjacent coil conductors of the second coil portion, and faces a part of the coil conductors on both sides of the space. It is also preferable that the opposite electrode is parallel to (i.e., provided along with) an extending direction of a part of a coil conductor of the second coil portion, and faces the part of the coil conductor.

According to the first aspect of the present invention, a part of the line portion constituting the unbalanced circuit serves as one electrode of the capacitor connected to the unbalanced circuit, which enables the thin film balun to be made smaller and thinner while maintaining required balun characteristics.

A thin film balun according to a second aspect of the present invention is a thin film balun including: an unbalanced transmission line; and a balanced transmission line positioned facing the unbalanced transmission line and magnetically coupled to the unbalanced transmission line, wherein one end of the unbalanced transmission line is connected to an unbalanced terminal, and an other end of the unbalanced transmission line is connected to a ground terminal via a C component, and wherein the C component is formed by a first electrode and a second electrode, the first electrode being formed in a first layer that includes the unbalanced transmission line, and the second electrode being formed in a second layer that faces the first layer and includes the balanced transmission line.

According to this structure, the C component introduced in the resonant circuit of the thin film balun is formed by the first electrode that is formed in the first layer including the unbalanced transmission line and the second electrode that is formed in the second layer facing the first layer and including the balanced transmission line. Since there is no need for a new layer for introducing the C component, the thin film balun can be made smaller and thinner. As a result of conducting intense study, the present inventor has found that, when the C component is provided in this manner, the balance characteristics of the transmission signal can be adjusted while maintaining the passage characteristics of the transmission signal in the desired range (specifications).

Though details of a functional mechanism are still unclear, the following assumption can be made. Since the C component is positioned near the balanced-unbalanced circuit, not only the capacitance C is introduced directly, but also a capacitance like a stray capacitance is induced with its neighboring line portions, which leads to an increase in effective capacitance on the unbalanced circuit side. This enables the thin film balun to be made smaller and thinner while maintaining desired passage characteristics of the thin film balun. Note, however, that the function is not limited to such.

Furthermore, since there is no need for a new layer for introducing the C component, this structure of the thin film balun according to the present invention also leads to a reduction in the number of manufacturing process steps, which contributes to improved productivity and simplified process control.

For example, the thin film balun according to the second aspect of the present invention is a thin film balun including: an unbalanced transmission line including a first line portion and a second line portion; a balanced transmission line including a third line portion and a fourth line portion that are positioned facing the first line portion and the second line portion and magnetically coupled to the first line portion and the second line portion, respectively; an unbalanced terminal connected to the first line portion; and a ground terminal connected to the second line portion via a C component, wherein the C component is provided between a first layer that includes the unbalanced transmission line and a second layer that faces the first layer via a dielectric layer and includes the balanced transmission line. According to this structure, the same function as described above can be attained.

Preferably, the first layer includes a first electrode that extends from the second line portion of the unbalanced transmission line, wherein the second layer includes a second electrode that is connected to the ground terminal and positioned facing the first electrode via the dielectric layer, and wherein the C component is formed by the first electrode and the second electrode. Here, the following assumption can be made. According to this structure, the first electrode extends from the second line portion, thereby allowing the second line portion to be equal in length to the first line portion. Therefore, while equivalently maintaining the magnetic coupling between the first line portion and the third line portion and the magnetic coupling between the second line portion and the fourth line portion, the capacitance is effectively introduced in the resonant circuit of the thin film balun. As a result, the suppression of the resonant frequency increase and the improvement of the balance characteristics of the transmission signal can both be achieved. Note, however, that the function is not limited to such.

For example, the thin film balun according to the second aspect of the present invention is a thin film balun including: an unbalanced transmission line including a first coil portion and a second coil portion; a balanced transmission line including a third coil portion and a fourth coil portion that are positioned facing the first coil portion and the second coil portion and magnetically coupled to the first coil portion and the second coil portion, respectively; an unbalanced terminal connected to the first coil portion; and a ground terminal connected to the second coil portion via a C component, wherein the C component is provided between a first layer that includes the unbalanced transmission line and a second layer that faces the first layer via a dielectric layer and includes the balanced transmission line. According to this structure, the same function as described above can be attained.

Preferably, the first layer includes a first electrode that extends from an outer peripheral end of the second coil portion of the unbalanced transmission line, wherein the second layer includes a second electrode that is connected to the ground terminal and positioned facing the first electrode via the dielectric layer, and wherein the C component is formed by the first electrode and the second electrode. Here, the following assumption can be made. According to this structure, since the C component is positioned near the balanced-unbalanced circuit, not only the capacitance C is introduced directly, but also a capacitance like a stray capacitance is induced with its neighboring line portions, which leads to an increase in effective capacitance on the unbalanced circuit side. Hence, the thin film balun can be made smaller and thinner while maintaining desired passage characteristics of the thin film balun. In addition, according to this structure, the first electrode can be appropriately separated from a coil opening through which a magnetic flux generated by the magnetic coupling of the second coil portion and the fourth coil portion passes. Therefore, as described above, while maintaining the magnetic coupling between the first coil portion and the third coil portion and the magnetic coupling between the second coil portion and the fourth coil portion in a near-equivalent state, the capacitance is effectively introduced in the resonant circuit of the thin film balun. Note, however, that the function is not limited to such.

According to the second aspect of the present invention, the C component connected to the second line portion is provided between the first layer including the unbalanced transmission line and the second layer including the balanced transmission line, which enables the thin film balun to be further made smaller and thinner.

A thin film balun according to a third aspect of the present invention is a thin film balun including: an unbalanced transmission line; a balanced transmission line facing the unbalanced transmission line and electromagnetically coupled to the unbalanced transmission line; a capacitor electrode facing a part of the unbalanced transmission line that faces the balanced transmission line, to form a capacitor; and an unbalanced terminal connected to the unbalanced transmission line and the capacitor electrode.

According to this structure, the capacitor is introduced in the resonant circuit of the thin film balun, so that the resonant frequency of the thin film balun is shifted toward lower frequencies. This suppresses an increase in resonant frequency caused by miniaturization of the thin film balun. It has also been found that the balance characteristics of the thin film balun can be improved by providing the capacitor so that the capacitor electrode faces the part of the unbalanced transmission line facing the balanced transmission line.

Though details of a functional mechanism are still unclear, the following assumption can be made. The part of the unbalanced transmission line facing the balanced transmission line in the capacitor is a dominant part of electromagnetic coupling with the balanced transmission line. This being so, by forming the capacitor in such a manner that the capacitor electrode faces this part, a state of coupling of the unbalanced transmission line with the balanced transmission line can be changed significantly. That is, by introducing the capacitor (capacitance) in a predetermined position of the unbalanced transmission line, the part of the unbalanced transmission line that contributes to the coupling with the balanced transmission line can be changed. Moreover, by introducing the capacitor in this way, characteristic impedance of the entire transmission line can be changed. The change of the part contributing to the coupling and the change of the characteristic impedance allow the balance characteristics of the thin film balun to be improved favorably. Note, however, that the function is not limited to such.

The structure according to the third aspect of the present invention also includes the case where another capacitor electrode connected to the unbalanced transmission line is provided between the part of the unbalanced transmission line and the capacitor electrode facing the part of the unbalanced transmission line. Here, it is preferable that the part of the unbalanced transmission line serves as another capacitor electrode. According to this structure, there is no need for a new layer for providing another capacitor electrode, which leads to a reduction in the number of manufacturing process steps. This contributes to improved productivity and simplified process control.

Moreover, the thin film balun according to the third aspect of the present invention is a thin film balun including: an unbalanced transmission line including a first line portion and a second line portion; a balanced transmission line including a third line portion and a fourth line portion that are positioned facing the first line portion and the second line portion and electromagnetically coupled to the first line portion and the second line portion, respectively; a capacitor electrode facing a part of the second line portion that faces the fourth line portion, to form a capacitor; and an unbalanced terminal connected to the first line portion and the capacitor electrode. According to this structure, the same function as described above can be attained.

Preferably, the thin film balun further includes a capacitor electrode facing a part of the first line portion that faces the third line portion, to form a capacitor, wherein the unbalanced terminal is connected to the first line portion, the capacitor electrode facing the part of the second line portion, and the capacitor electrode facing the part of the first line portion. Here, the following assumption can be made. According to this structure, the part contributing to the coupling between the third line portion and the first line portion can be changed in addition to the coupling between the fourth line portion and the second line portion. This allows the balance characteristics of the thin film balun to be further improved because the two couplings can be adjusted. Note, however, that the function is not limited to such.

Furthermore, the thin film balun according to the third aspect of the present invention is a thin film balun including: an unbalanced terminal; an unbalanced circuit, one end of the unbalanced circuit being connected to the unbalanced terminal and an other end of the unbalanced circuit being an open end; and a balanced circuit electromagnetically coupled to the unbalanced circuit, wherein a capacitor is connected to a part of the unbalanced circuit except the open end, and also connected to the unbalanced terminal.

Here, the following assumption can be made. According to this structure, the capacitor is introduced in the resonant circuit of the thin film balun, so that the resonant frequency of the thin film balun is shifted toward lower frequencies. This suppresses an increase in resonant frequency caused by miniaturization of the thin film balun. Moreover, an inner region than the open end of the unbalanced transmission line is a part where the electromagnetic coupling with the balanced transmission line is relatively strong as compared with the open end. By forming the capacitor in such a manner that the capacitor electrode faces this part, the part of the unbalanced transmission line that contributes to the coupling with the balanced transmission line can be changed. Moreover, by introducing the capacitor, the characteristic impedance of the entire transmission line can be changed. The change of the part contributing to the coupling and the change of the characteristic impedance allow the balance characteristics of the thin film balun to be improved. Note, however, that the function is not limited to such.

According to the third aspect of the present invention, by introducing the capacitor between the unbalanced terminal and the part of the unbalanced transmission line facing the balanced transmission line, the balance characteristics of the thin film balun can be improved while suppressing the frequency increase of the thin film balun caused by miniaturization. This enables the thin film balun to be further made smaller and thinner.

A thin film balun according to a fourth aspect of the present invention is a thin film balun including: an unbalanced transmission line including a first line portion and a second line portion; a balanced transmission line including a third line portion and a fourth line portion that are positioned facing the first line portion and the second line portion and magnetically coupled to the first line portion and the second line portion, respectively; an unbalanced terminal connected to the first line portion; a ground terminal connected to the first line portion via a C component; and an opposite electrode connected to the ground terminal and facing a part of the first line portion, wherein the C component is formed by the opposite electrode and the part of the first line portion.

According to this structure, the C component introduced in the resonant circuit of the thin film balun is formed using the part of the first line portion constituting the unbalanced transmission line. This makes it unnecessary to add a new layer for introducing the C component, so that the thin film balun can be made smaller and thinner. As a result of conducting intense study, the present inventor has found that, when the C component is provided in this manner, the balance characteristics of the transmission signal can be adjusted while improving the passage characteristics of the transmission signal.

Though details of a functional mechanism are still unclear, the following assumption can be made. When the part of the first line portion constituting the unbalanced transmission line serves as the electrode of the capacitor, the capacitor is positioned near the unbalanced transmission line. Therefore, not only the capacitance C is introduced directly, but also a capacitance like a stray capacitance is induced with its neighboring line portions, which influences the characteristic impedance. Note, however, that the function is not limited to such.

As a result of further conducting intense study, the present inventor has found more favorable structural examples of the opposite electrode. As an example, it has been found useful that any of the second line portion and the fourth line portion has a larger width than a corresponding one of the first line portion and the third line portion.

For example, the thin film balun according to the fourth aspect of the present invention is a thin film balun including: an unbalanced transmission line including a first coil portion and a second coil portion; a balanced transmission line including a third coil portion and a fourth coil portion that are positioned facing the first coil portion and the second coil portion and magnetically coupled to the first coil portion and the second coil portion, respectively; an unbalanced terminal connected to the first coil portion; a ground terminal connected to the first coil portion via a C component; and an opposite electrode connected to the ground terminal and facing a part of the first coil portion, wherein the C component is formed by the opposite electrode and the part of the first coil portion. According to this structure, the same function as described above can be attained.

Preferably, the opposite electrode faces a part of a coil conductor that is closer to an outer peripheral coil conductor than an inner peripheral coil conductor in the first coil portion. According to this structure, the opposite electrode can be appropriately separated from a coil opening through which a magnetic flux generated by the magnetic coupling of the second coil portion and the fourth coil portion passes. Hence, while maintaining the magnetic coupling between the first coil portion and the third coil portion and the magnetic coupling between the second coil portion and the fourth coil portion in a near-equivalent state, the capacitance is effectively introduced in the resonant circuit of the thin film balun. This makes it possible to adjust the balance characteristics while maintaining high passage characteristics of the transmission signal. Note, however, that the function is not limited to such.

According to the fourth aspect of the present invention, the part of the first line portion that constitutes the unbalanced transmission line and is connected to the unbalanced terminal serves as one electrode of the capacitor. This has a significant effect of making the thin film balun smaller and thinner, and also achieves balance characteristic adjustment and insertion loss reduction.

A thin film balun according to a fifth aspect of the present invention is a thin film balun including: an unbalanced transmission line; a balanced transmission line facing the unbalanced transmission line and electromagnetically coupled to the unbalanced transmission line; and a capacitor electrode facing a part of the balanced transmission line to form a capacitor, and connected to a ground terminal.

Here, the following assumption can be made. According to this structure, a state of coupling of the balanced transmission line with the unbalanced transmission line can be significantly changed by the capacitor electrode facing the part of the balanced transmission line. That is, by introducing the capacitor (capacitance) in a predetermined position of the balanced transmission line, the part of the balanced transmission line that contributes to the coupling with the unbalanced transmission line can be changed. Moreover, by introducing the capacitor in this way, the characteristic impedance of the entire transmission line can be changed. The change of the part contributing to the coupling and the change of the characteristic impedance allow the passage characteristics of the thin film balun to be improved favorably. Note, however, that the function is not limited to such.

This structure according to the present invention also includes the case where another capacitor electrode connected to the balanced transmission line is provided between the part of the balanced transmission line and the capacitor electrode facing the part of the balanced transmission line. Here, it is preferable that the part of the balanced transmission line serves as another capacitor electrode. According to this structure, there is no need for a new layer for providing another capacitor electrode, which leads to a reduction in the number of manufacturing process steps. This contributes to improved productivity and simplified process control.

Moreover, the thin film balun according to the fifth aspect of the present invention is a thin film balun including: an unbalanced transmission line including a first line portion and a second line portion; a balanced transmission line including a third line portion and a fourth line portion that are positioned facing the first line portion and the second line portion and electromagnetically coupled to the first line portion and the second line portion, respectively; and a capacitor electrode facing a part of at least one of the third line portion and the fourth line portion to form a capacitor, and connected to a ground terminal. According to this structure, the same function as described above can be attained.

Preferably, a connector electrically connecting the third line portion and the fourth line portion and the capacitor electrode are formed in a first layer, wherein the third line portion and the fourth line portion of the balanced transmission line are formed in a second layer, and wherein the first line portion and the second line portion of the unbalanced transmission line are formed in a third layer. By forming the capacitor electrode in the same layer as the connector, there is no need for a new layer for providing another capacitor electrode. Therefore, the thin film balun can be made smaller and thinner. This also leads to a reduction in the number of manufacturing process steps, thereby contributing to improved productivity and simplified process control.

Furthermore, the thin film balun according to the fifth aspect of the present invention is a thin film balun including: an unbalanced circuit; a balanced circuit electromagnetically coupled to the unbalanced circuit; and a ground terminal, wherein a capacitor is connected to a part of the balanced circuit, and also connected to the ground terminal.

Here, the following assumption can be made. According to this structure, by connecting the capacitor to the part of the balanced circuit, a state of coupling of the balanced circuit with the unbalanced circuit can be changed significantly. That is, by introducing the capacitor (capacitance) in a predetermined position of the balanced circuit, the part of the balanced circuit that contributes to the coupling with the unbalanced circuit can be changed. Furthermore, by introducing the capacitor in this way, the characteristic impedance of the entire circuit can be changed. The change of the part contributing to the coupling and the change of the characteristic impedance allow the passage characteristics of the thin film balun to be improved favorably. Note, however, that the function is not limited to such.

According to the fifth aspect of the present invention, the capacitor is introduced between the part of the balanced transmission line and the ground terminal, with it being possible to achieve excellent passage characteristics for the thin film balun which is made smaller and thinner.

BRIEF DESCRIPTION OF THE DRAWINGS

FIG. 86 is a horizontal sectional view showing the wiring layer M0 of the thin film balun 7R.

FIG. 87 is a horizontal sectional view showing the wiring layer M1 of the thin film balun 7R.

DESCRIPTION OF THE PREFERRED EMBODIMENTS

Figure 1:
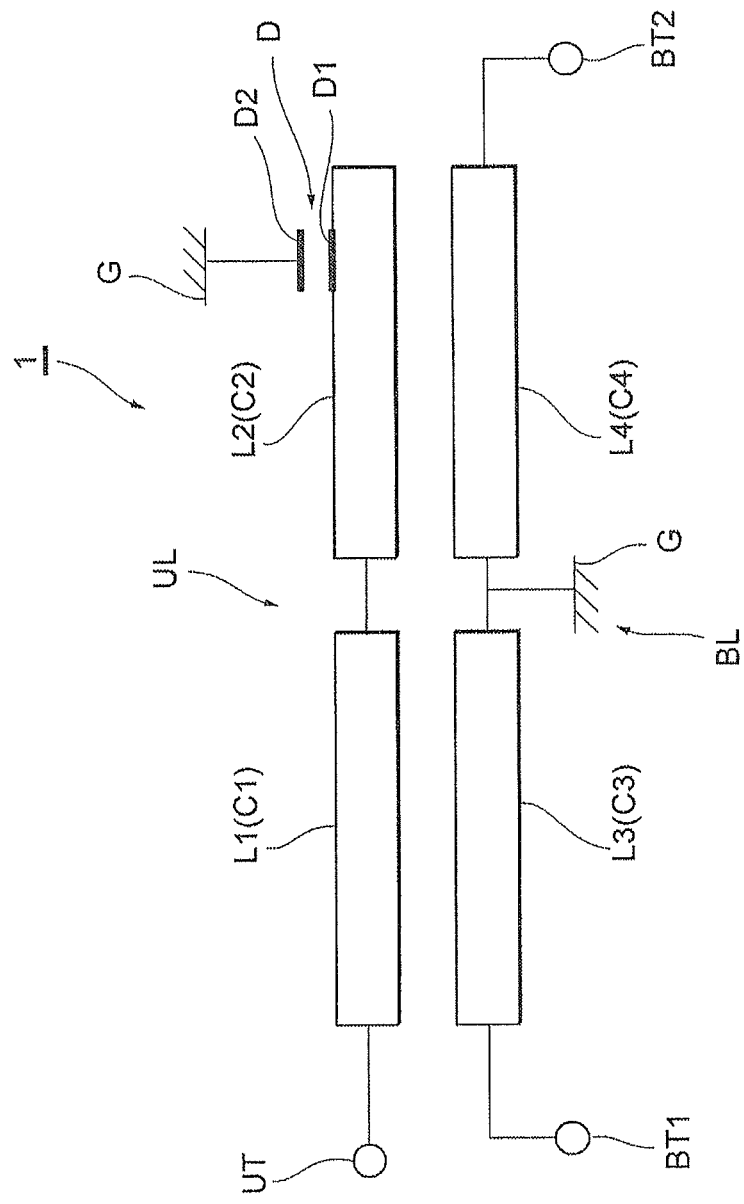
FIG. 1 is an equivalent circuit diagram showing a structure of a thin film balun 1 in a first embodiment of the present invention.

The following describes embodiments of the present invention with reference to drawings. Note that the same components in the drawings are given the same reference signs, and repeated description is omitted. Moreover, the positional relationships such as top, bottom, left, and right are based on the positional relationships shown in the drawings, unless otherwise specified. Furthermore, scale ratios of the drawings are not limited to the illustrated ratios. Note also that the following embodiments are merely examples for describing the present invention, and the present invention is not limited to the embodiments. Various changes can be made without departing from the scope of the present invention.

First Embodiment

A thin film balun in a first embodiment corresponding to the first aspect of the present invention is described first. FIG. 1 is an equivalent circuit diagram showing a structure of the thin film balun in the first embodiment of the present invention. A thin film balun 1 includes an unbalanced transmission line (unbalanced circuit) UL in which a line portion L1 (first line portion) and a line portion L2 (second line portion) are connected in series, and a balanced transmission line (balanced circuit) BL in which a line portion L3 (third line portion) and a line portion L4 (fourth line portion) are connected in series. The line portions L1 and L3 form magnetic coupling, and the line portions L2 and L4 form magnetic coupling.

In the thin film balun 1, an end of the line portion L1 other than an end connected to the line portion L2 is connected to an unbalanced terminal UT, and a part of an end of the line portion L2 other than an end connected to the line portion L1 is connected to a ground terminal G (ground potential) via a capacitor D which is a C component (capacitance component). The capacitor D is formed by an electrode D1 composed of the part of the other end of the line portion L2 and an electrode D2 (opposite electrode) connected to the ground terminal G where the electrodes D1 and D2 face each other via an appropriate dielectric. On the other hand, an end of the line portion L3 other than an end connected to the line portion L4 is connected to a balanced terminal BT1, and an end of the line portion L4 other than an end connected to the line portion L3 is connected to a balanced terminal BT2. Moreover, the connected parts of the line portions L3 and L4 are grounded to the same potential as the ground terminal G.

Lengths of the above-mentioned line portions L1 to L4 vary depending on specifications of the thin film balun 1. For example, the lengths may be set so as to form a quarter-wavelength ($\lambda/4$) resonator circuit of a transmission signal which is subject to conversion. Moreover, the line portions L1 to L4 may be arbitrarily shaped so long as the above-mentioned magnetic coupling is formed. Example shapes include a spiral (coil form), a zigzag, a straight line, and a curved line.

A basic operation of the thin film balun 1 is described below, with reference to FIG. 1. In the thin film balun 1, when an unbalanced signal is input to the unbalanced terminal UT, the unbalanced signal propagates through the line portions L1 and L2. By the magnetic coupling (first magnetic coupling) of the line portions L1 and L3 and the magnetic coupling (second magnetic coupling) of the line portions L2 and L4, the input unbalanced signal is converted to two balanced signals that differ in phase by 180° ($\pi$), and the two balanced signals are output from the balanced terminals BT1 and BT2. A converting operation from balanced signals to an unbalanced signal is the reverse of the above-mentioned converting operation from an unbalanced signal to balanced signals.

Figure 2:
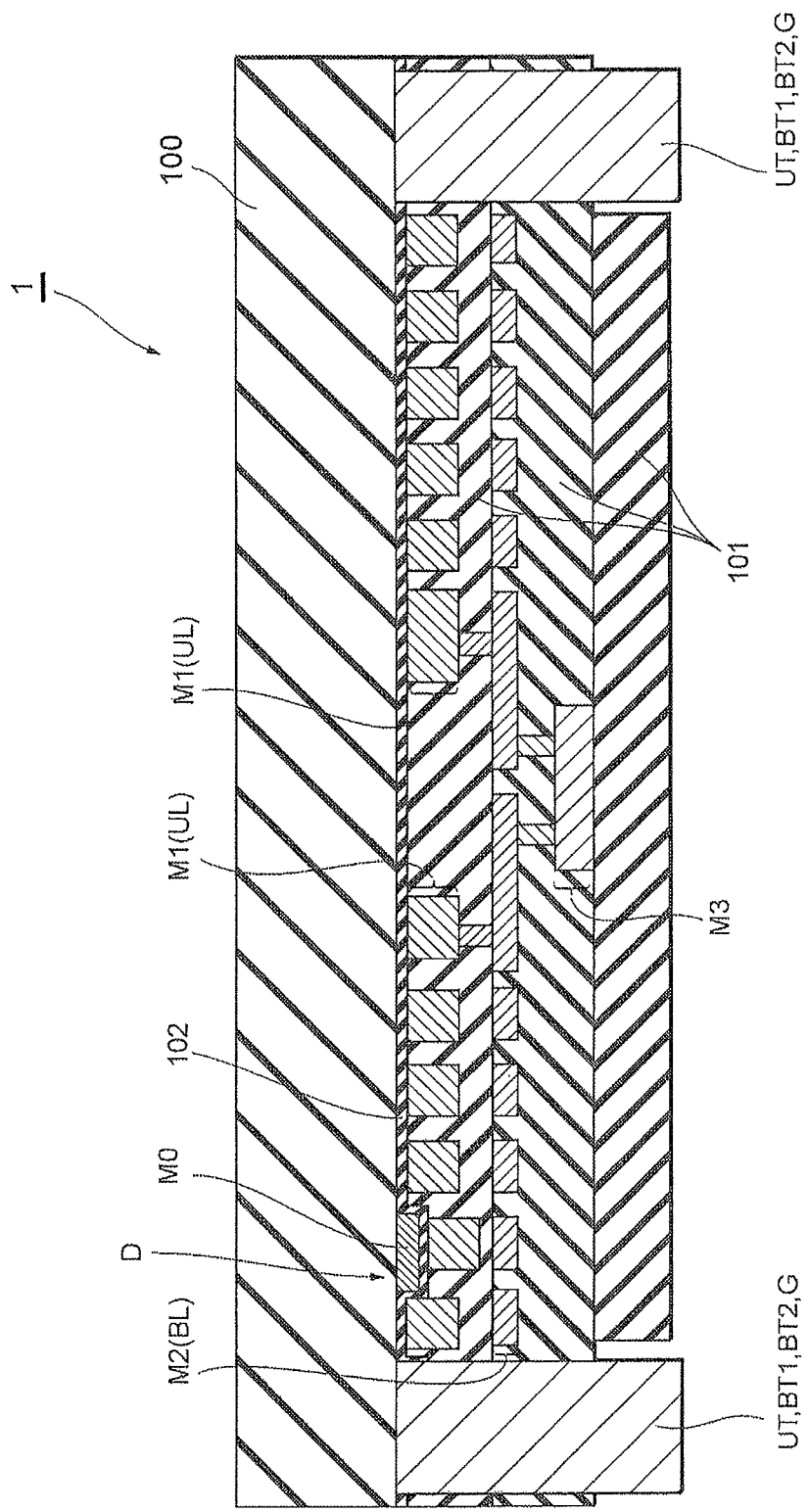
FIG. 2 is a vertical sectional view showing the structure of the thin film balun 1.

A wiring structure of the thin film balun is described below. FIG. 2 is a vertical sectional view schematically showing the wiring structure of the thin film balun 1. As shown in FIG. 2, wiring layers M0, M1, M2, and M3 are formed in this order on an insulating substrate 100 of alumina or the like. For instance, the unbalanced transmission line UL mentioned above is formed by the wiring layer M1, and the balanced transmission line BL is formed by the wiring layer M2. Insulating layers are formed between wires in the same wiring layer and between different wiring layers. For example, an insulating layer 102 made of silicon nitride is formed between the wiring layers M0 and M1. Polyimide or the like is used as an insulating layer 101 in other parts. Note that the materials are not limited to the above, and not only inorganic insulators such as silicon nitride, alumina, and silica but also organic insulators such as polyimide and epoxy resin may be selected according to need. The unbalanced terminal UT, the balanced terminals BT1 and BT2, and the ground terminal G are formed through all insulating layers. Thus, the thin film balun 1 is composed of a thin film multilayer structure formed on the insulating substrate 100.

A pattern of each of the wiring layers M0, M1, M2, and M3 of the thin film balun in the first embodiment is described in detail below. Coil portions are used as the line portions L1 to L4 in each of the following examples 1 and 2.

Example 1

FIGS. 3 to 6 are each a horizontal sectional view schematically showing a different one of the wiring layers of the thin film balun 1 of the example 1 in the first embodiment of the present invention. As shown in FIGS. 3 to 6, the unbalanced terminal UT, the balanced terminals BT1 and BT2, and the ground terminal G are formed in all of the wiring layers M0 to M3. Each of the terminals UT, BT1, BT2, and G is electrically connected between different layers via a through hole P. Note that all through holes P shown in FIGS. 3 to 6 are plated with a metal conductor for electrical conduction of upper and lower layers. A structure of each wiring layer is described in detail below.

Figure 3:
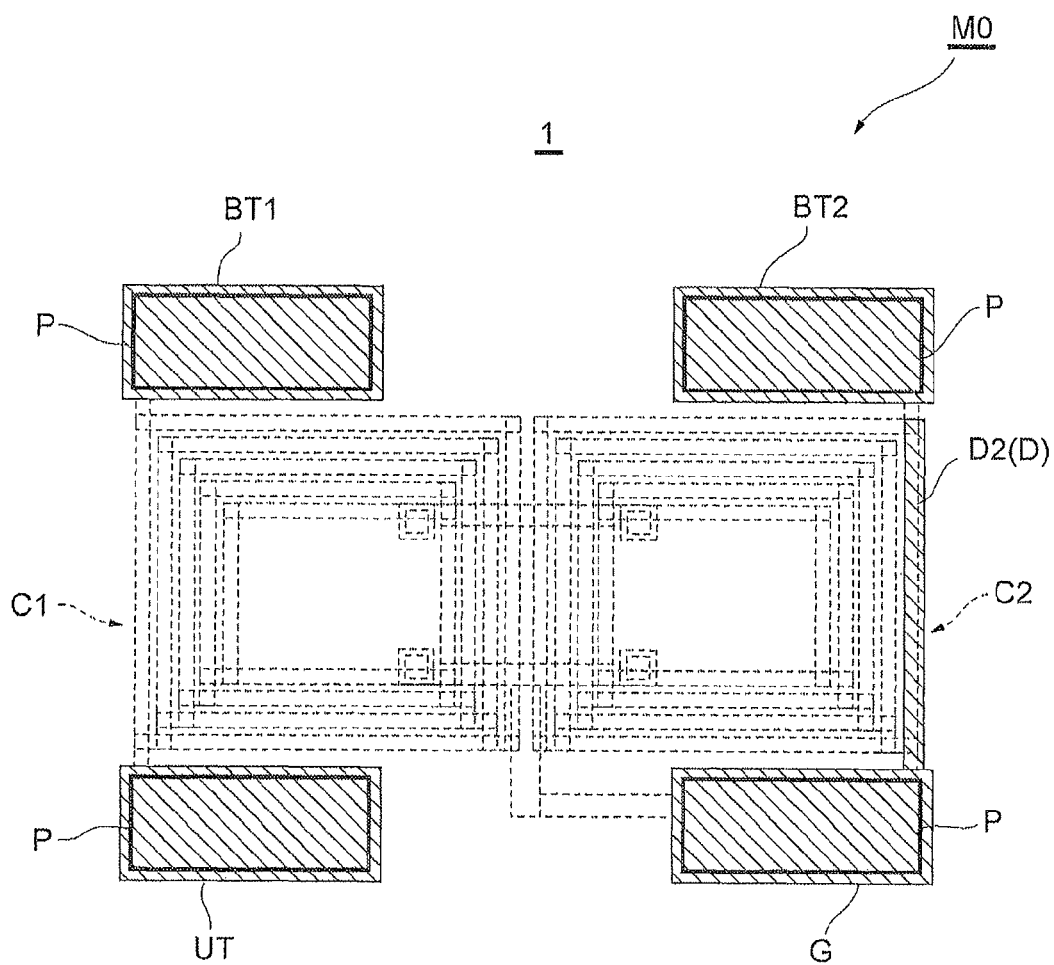
FIG. 3 is a horizontal sectional view showing a wiring layer M0 of the thin film balun 1.

As shown in FIG. 3, the electrode D2 of the capacitor D is formed in the wiring layer M0 on the insulating substrate 100, at a position facing a part of a coil portion C2 in the wiring layer M1. The electrode D2 is connected to the ground terminal G. In the first embodiment, the electrode D2 of the capacitor D is parallel to a coil conductor that is an outer peripheral coil conductor in the coil portion C2 and extends from the ground terminal G toward the balanced terminal BT2.

Figure 4:
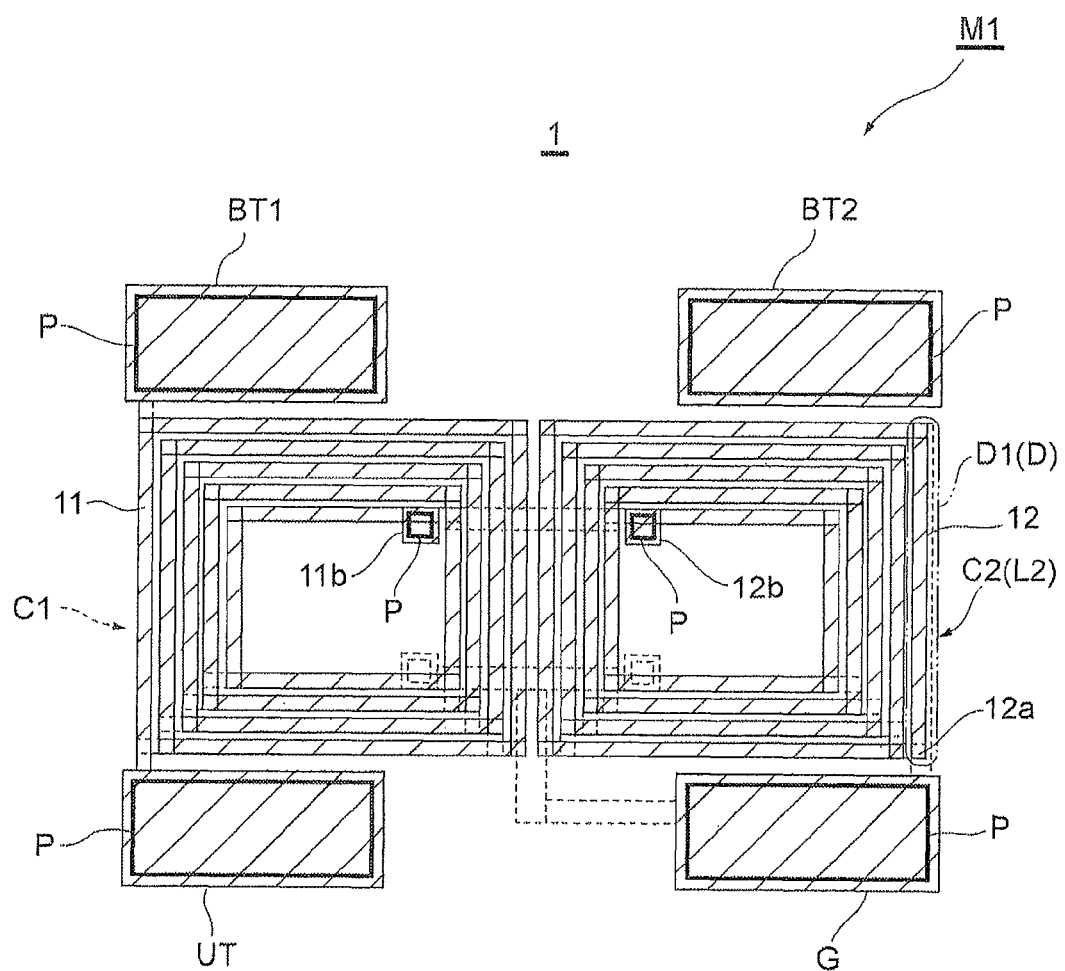
FIG. 4 is a horizontal sectional view showing a wiring layer M1 of the thin film balun 1.

As shown in FIG. 4, a coil portion C1 (first coil portion, first line portion) and the coil portion C2 (second coil portion, second line portion) that constitute the unbalanced transmission line UL are formed adjacent to each other in the wiring layer M1. Each of the coil portions C1 and C2 forms an equivalent of a quarter-wavelength (λ/4) resonator. An outer end 11a of a coil conductor 11 constituting the coil portion C1 is connected to the unbalanced terminal UT, and an inner end 11b of the coil conductor 11 is connected to a through hole P. An inner end 12b of a coil conductor 12 constituting the coil portion C2 is connected to a through hole P. An outer end 12a of the coil conductor 12 is open, but a part of the outer peripheral coil conductor 12 serves as the electrode D1 of the capacitor D and faces the electrode D2 in the wiring layer M0.

Figure 5:
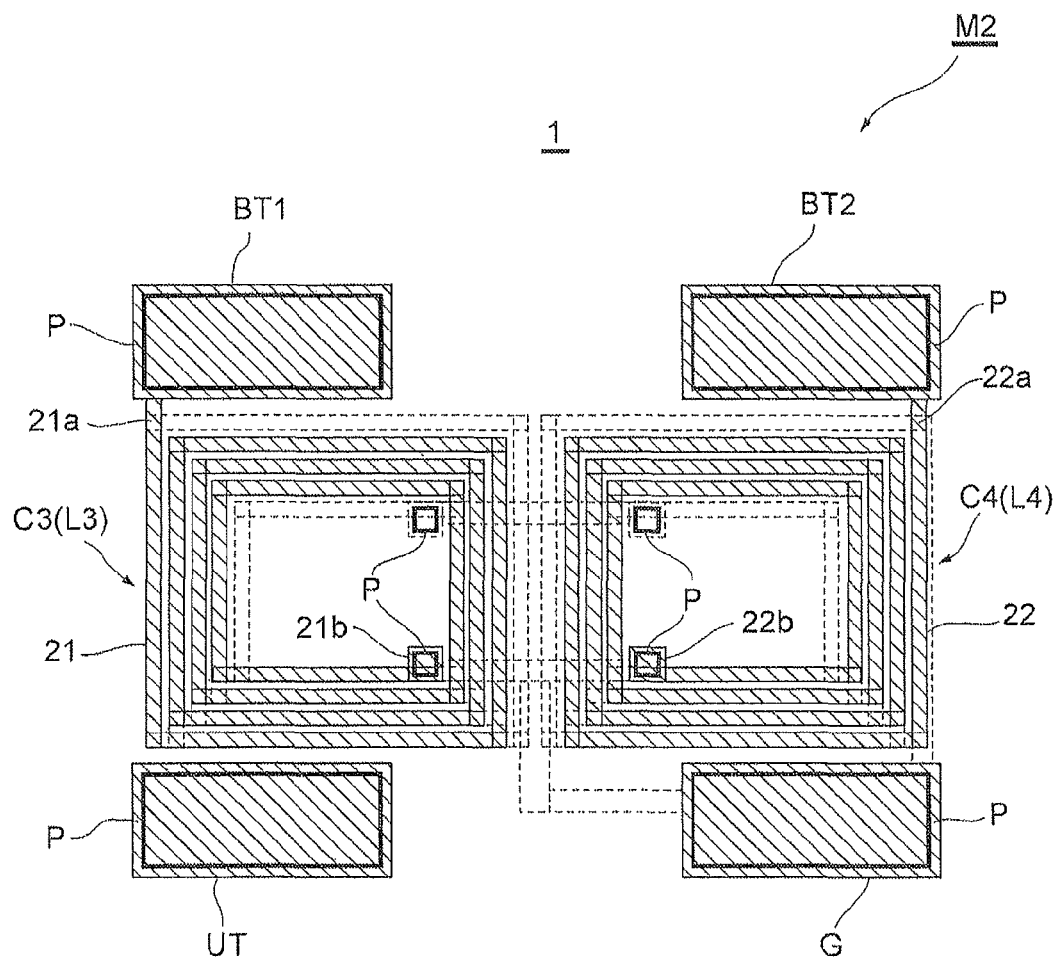
FIG. 5 is a horizontal sectional view showing a wiring layer M2 of the thin film balun 1.

As shown in FIG. 5, a coil portion C3 (third coil portion, third line portion) and a coil portion C4 (fourth coil portion, fourth line portion) that constitute the balanced transmission line BL are formed adjacent to each other in the wiring layer M2. Each of the coil portions C3 and C4 forms an equivalent of a quarter-wavelength (λ/4) resonator, as with the coil portions C1 and C2. The coil portions C3 and C4 of the balanced transmission line BL are positioned facing the coil portions C1 and C2 of the unbalanced transmission line UL respectively, and the facing portions are magnetically coupled to form couplers. An outer end 21a of a coil conductor 21 constituting the coil portion C3 is connected to the balanced terminal BT1, and an inner end 21b of the coil conductor 21 is connected to a through hole P. An outer end 22a of a coil conductor 22 constituting the coil portion C4 is connected to the balanced terminal BT2, and an inner end 22b of the coil conductor 22 is connected to a through hole P.

Figure 6:
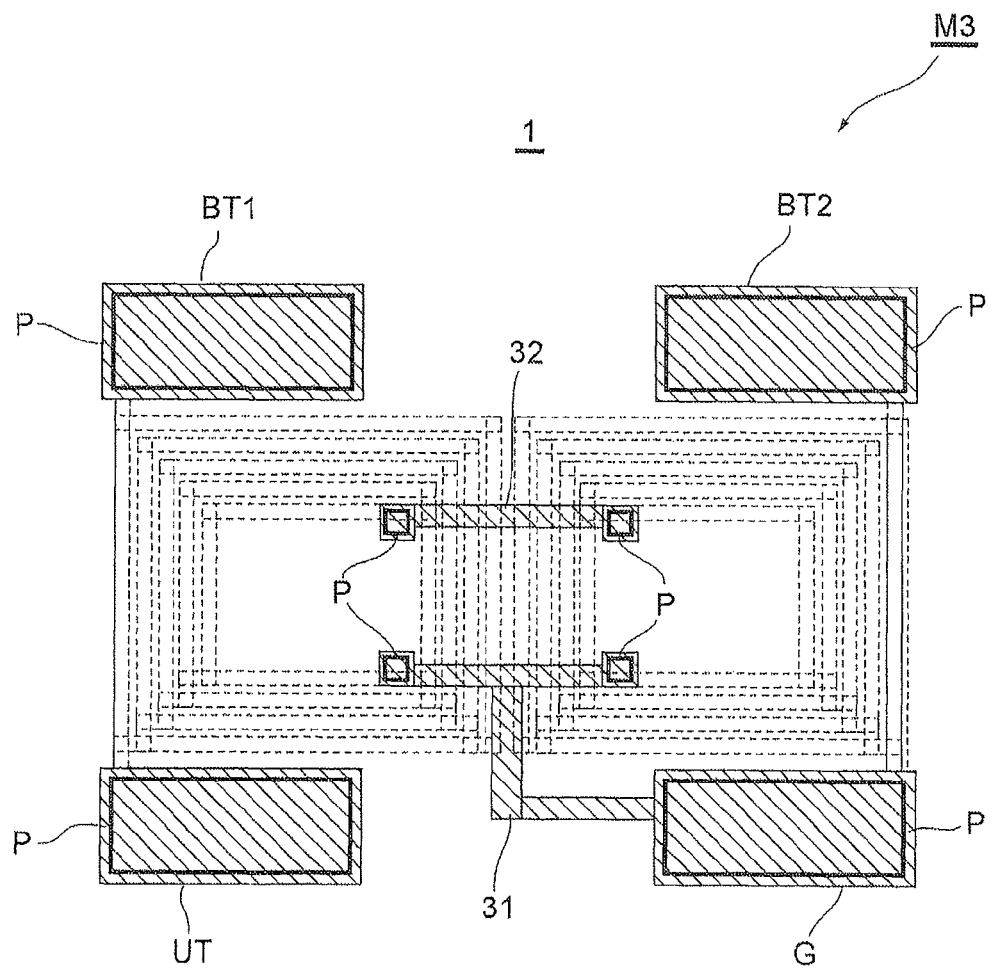
FIG. 6 is a horizontal sectional view showing a wiring layer M3 of the thin film balun 1.

As shown in FIG. 6, a wire 31 for connecting the coil portions C3 and C4 to the ground terminal G and a wire 32 for connecting the coil portions C1 and C2 are formed in the wiring layer M3. The wire 31 is a branch wire formed so as to connect two through holes P to the ground terminal G. The wire 31 is connected to the end 21b of the coil conductor 21 and the end 22b of the coil conductor 22 formed in the wiring layer M2, via the two through holes P. The wire 32 is connected to the end 11b of the coil conductor 11 and the end 12b of the coil conductor 12 formed in the wiring layer M1, via through holes P.

Thus, in the example 1, the thin film balun 1 forming the equivalent circuit shown in FIG. 1 is obtained by a multilayer wiring structure in which the two coil portions C1 and C2 constituting the unbalanced transmission line are formed in the wiring layer M1 which is one layer, the two coil portions C3 and C4 constituting the balanced transmission line are formed in the wiring layer M2 which is another layer adjacent to the wiring layer M1, the wire 32 connecting the coil portions C1 and C2 and the wire 31 connecting the coil portions C3 and C4 are formed in the wiring layer M3 which is another layer adjacent to the wiring layer M2 on an opposite side to the wiring layer M1, and the electrode D2 facing the part of the coil conductor 12 in the coil portion C2 to form the capacitor D is formed in the wiring layer M0 which is another layer adjacent to the wiring layer M1 on an opposite side to the wiring layer M2.

Example 1A

Figure 7:
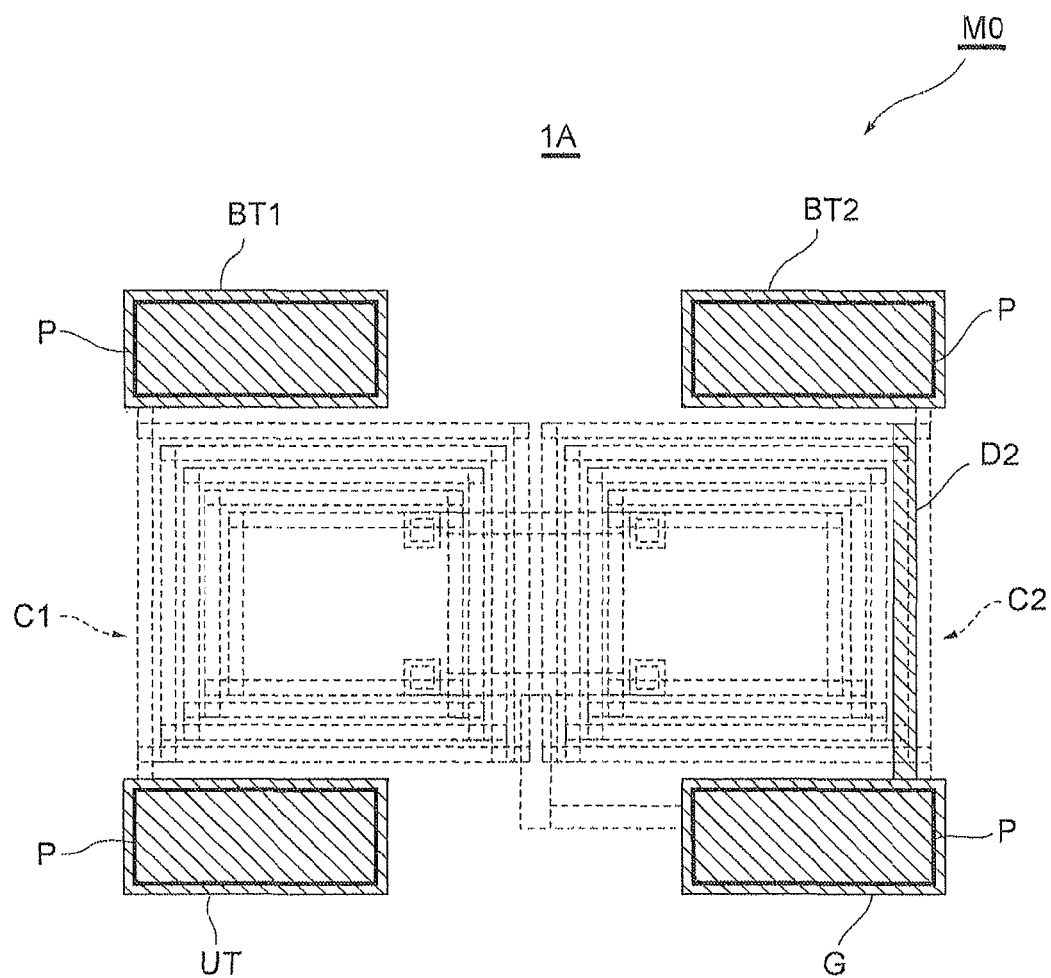
FIG. 7 is a horizontal sectional view showing the wiring layer M0 of a thin film balun 1A.

FIG. 7 is a horizontal sectional view schematically showing the wiring layer M0 of a thin film balun 1A of an example 1A. Structures other than the wiring layer M0 are the same as those in the example 1. In the thin film balun 1A shown in FIG. 7, the electrode D2 of the capacitor D is positioned so as to be parallel to an extending direction of the coil conductor of the second line from the right of the coil portion C2 and face a part of the coil conductor in plan view.

Example 1B

Figure 8:
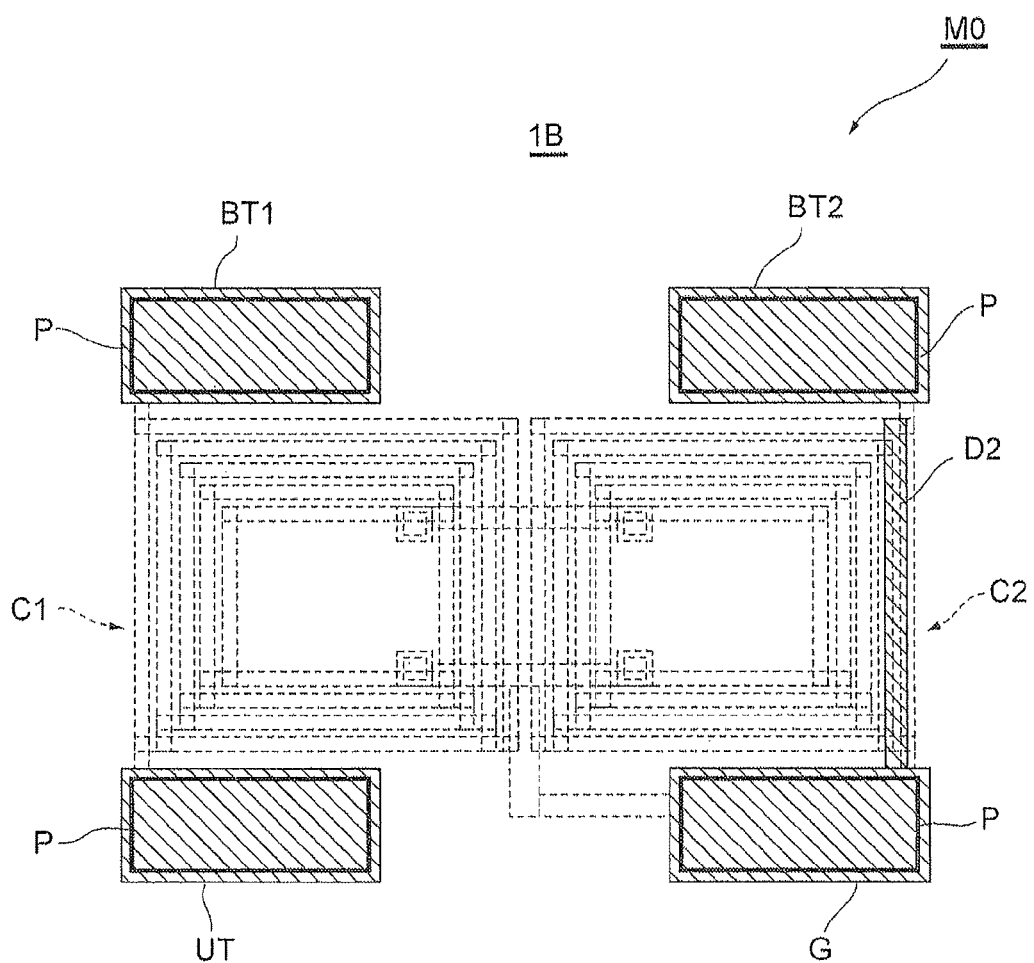
FIG. 8 is a horizontal sectional view showing the wiring layer M0 of a thin film balun 1B.

FIG. 8 is a horizontal sectional view schematically showing the wiring layer M0 of a thin film balun 1B of an example 1B. Structures other than the wiring layer M0 are the same as those in the example 1. In the thin film balun 1B shown in FIG. 8, the electrode D2 of the capacitor D is positioned so as to be parallel to an extending direction of a space between the coil conductors of the first (outermost) and second lines from the right of the coil portion C2 and face a part of the coil conductors on both sides of the space in plan view.

Example 1C

Figure 9:
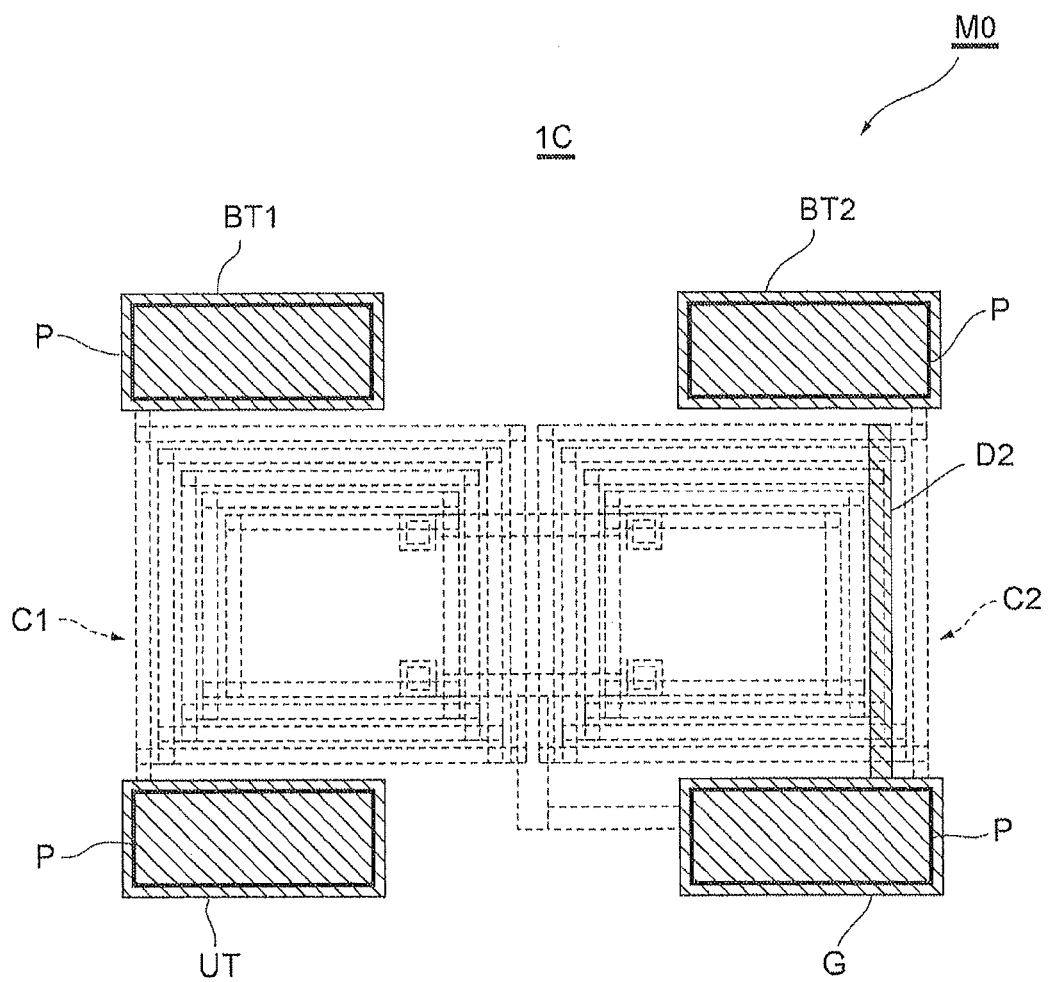
FIG. 9 is a horizontal sectional view showing the wiring layer M0 of a thin film balun 1C.

FIG. 9 is a horizontal sectional view schematically showing the wiring layer M0 of a thin film balun 1C of an example 1C. Structures other than the wiring layer M0 are the same as those in the example 1. In the thin film balun 1C shown in FIG. 9, the electrode D2 of the capacitor D is positioned so as to be parallel to an extending direction of the coil conductor of the third line from the right of the coil portion C2 and face a part of the coil conductor in plan view.

Example 1D

Figure 10:
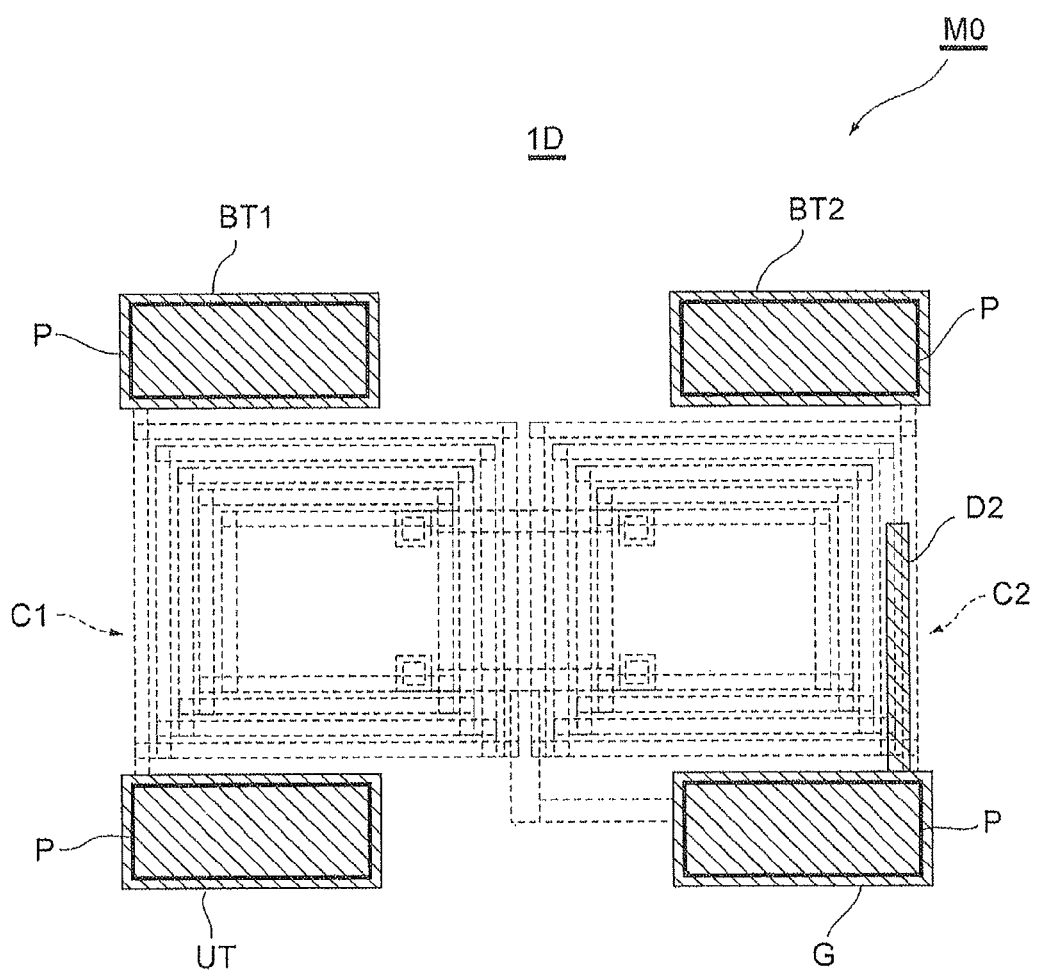
FIG. 10 is a horizontal sectional view showing the wiring layer M0 of a thin film balun 1D.

FIG. 10 is a horizontal sectional view schematically showing the wiring layer M0 of a thin film balun 1D of an example 1D. Structures other than the wiring layer M0 are the same as those in the example 1. In the thin film balun 1D shown in FIG. 10, the electrode D2 of the capacitor D in the thin film balun 1B of the example 1B is shortened in length so that the electrode D2 of the capacitor D is shorter than one side of the coil portion C2 which is shaped in a rectangle.

(Characteristic Evaluation)

Figure 11:
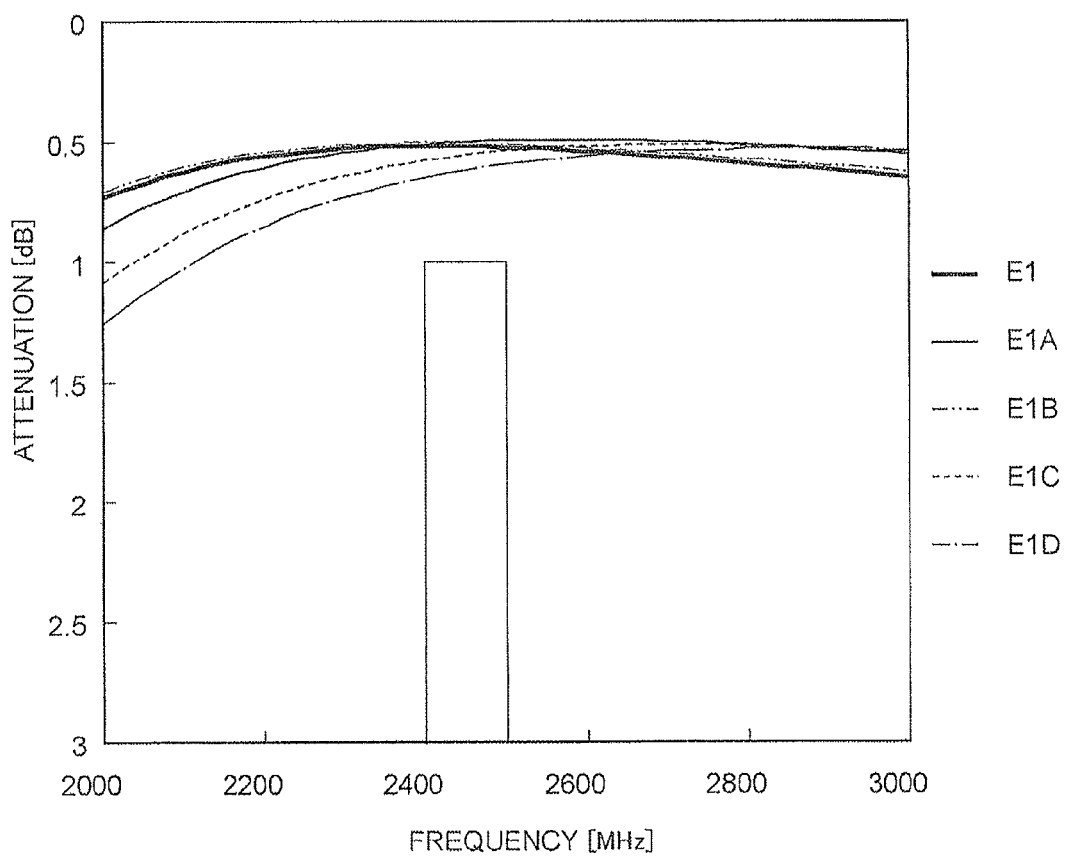
FIG. 11 is a graph showing passage characteristic evaluation results.
Figure 12:
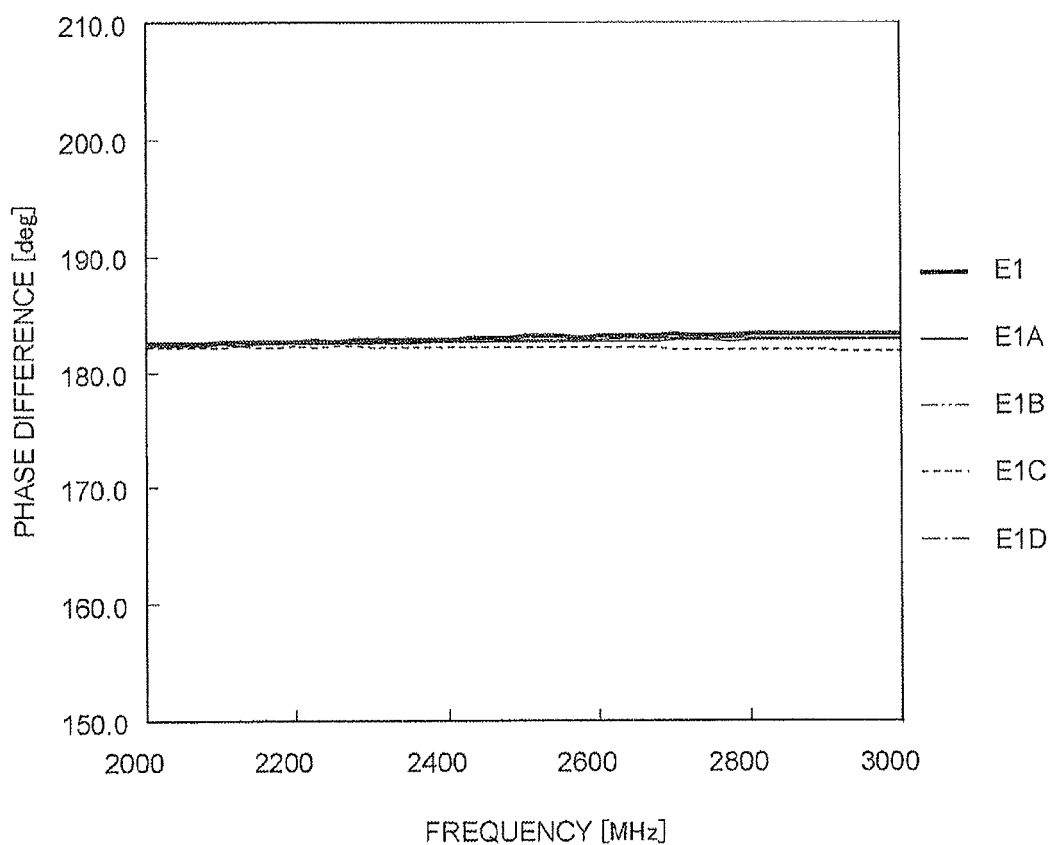
FIG. 12 is a graph showing phase difference evaluation results.
Figure 13:
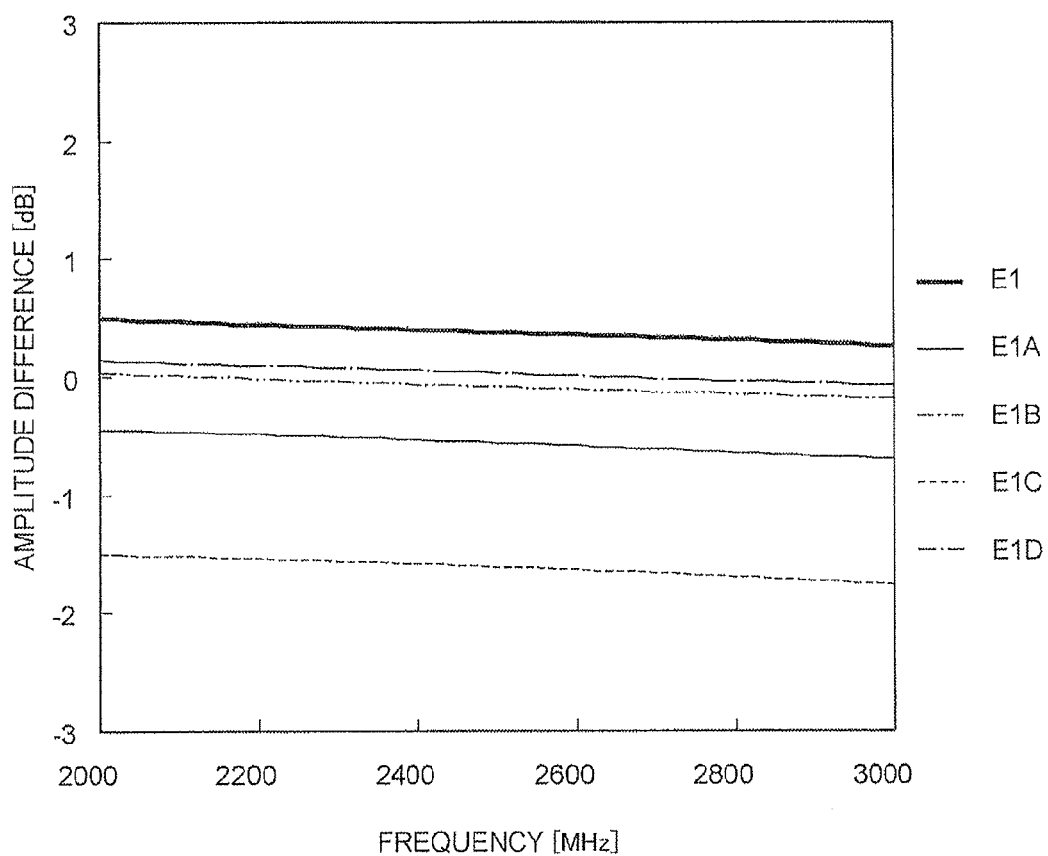
FIG. 13 is a graph showing amplitude difference evaluation results.

Passage characteristics (insertion loss) and balance characteristics (phase difference and amplitude difference of balanced signals) of each of the thin film baluns 1 and 1A to 1D of the examples described above were measured by simulation. Evaluation target frequencies (resonant frequencies fr) of a transmission signal were set at 2400 MHz to 2500 MHz. FIG. 11 is a diagram showing passage characteristic evaluation results, FIG. 12 is a diagram showing phase difference evaluation results, and FIG. 13 is a diagram showing amplitude difference evaluation results. In each of FIGS. 11 to 13, curves E1 and E1A to E1D respectively indicate evaluation results of the thin film baluns 1 and 1A to 1D.

The passage characteristics represent with how little loss a signal passes through in an evaluation target frequency domain. 0 dB is ideal passage characteristics in the evaluation target frequency domain. The phase difference is a difference in phase between two balanced signals output from the balanced terminals BT1 and BT2, so that 180 deg is a more ideal phase balance. The amplitude difference is a difference in amplitude between two balanced signals output from the balanced terminals BT1 and BT2, so that 0 dB is a more ideal output balance.

These results demonstrate that the thin film balun of each of the examples maintains excellent characteristics in the passage characteristics and the phase balance. The results also demonstrate that the amplitude balance can be adjusted by the position of the electrode D2 of the capacitor D. In detail, it is demonstrated that the thin film baluns 1, 1A, 1B, and 1D in which the electrode D2 faces a part of a coil conductor closer to the outer peripheral coil conductor than the inner peripheral coil conductor in the coil portion C2 exhibit an excellent amplitude balance as compared with the thin film balun 1C. It is further demonstrated that the thin film baluns 1, 1B, and 1D in which the electrode D2 faces a part of the outer peripheral coil conductor in the coil portion C2 exhibit an excellent amplitude balance as compared with the thin film balun 1A. In particular, the evaluation results of the thin film balun 1B demonstrate that the thin film balun in which the electrode D2 of the capacitor D is positioned parallel to the extending direction of the space between the adjacent coil conductors in the coil portion C2 in plan view exhibits most excellent passage characteristics and balance characteristics.

Example 2

Figure 14:
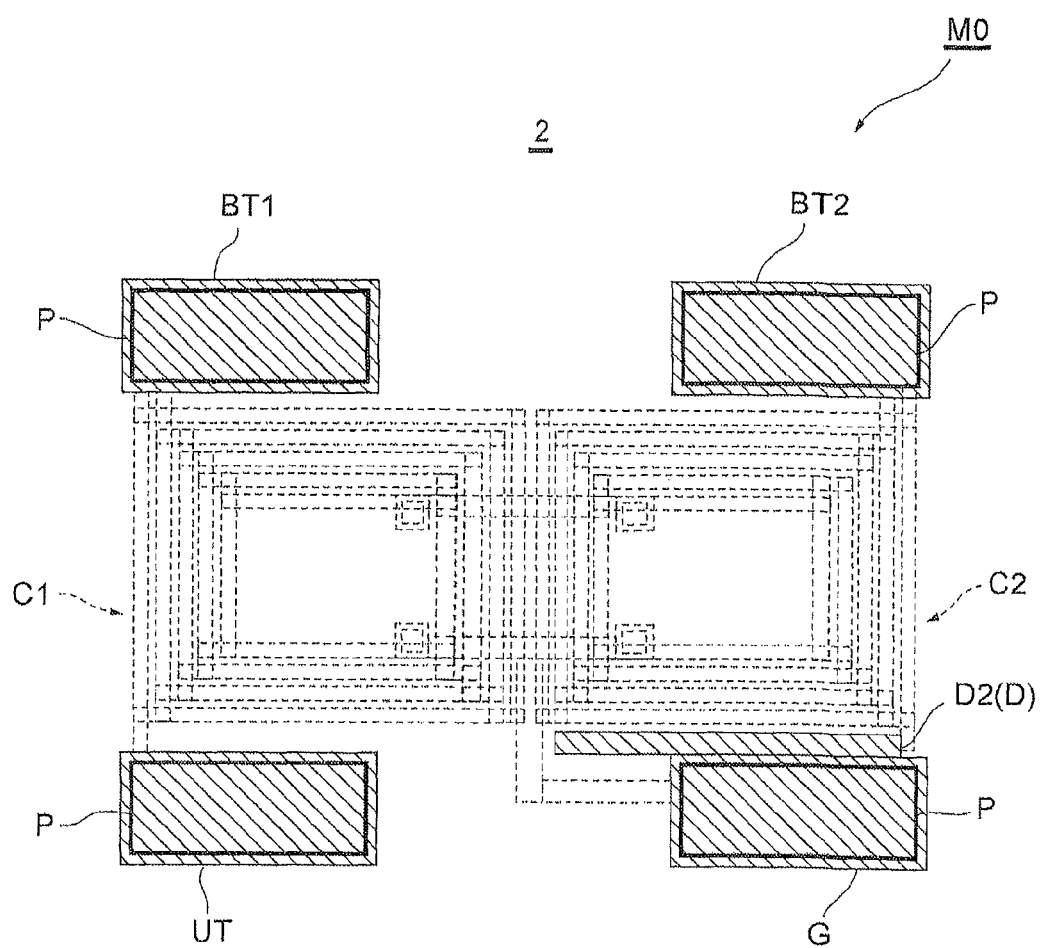
FIG. 14 is a horizontal sectional view showing the wiring layer M0 of a thin film balun 2 in the first embodiment of the present invention.
Figure 15:
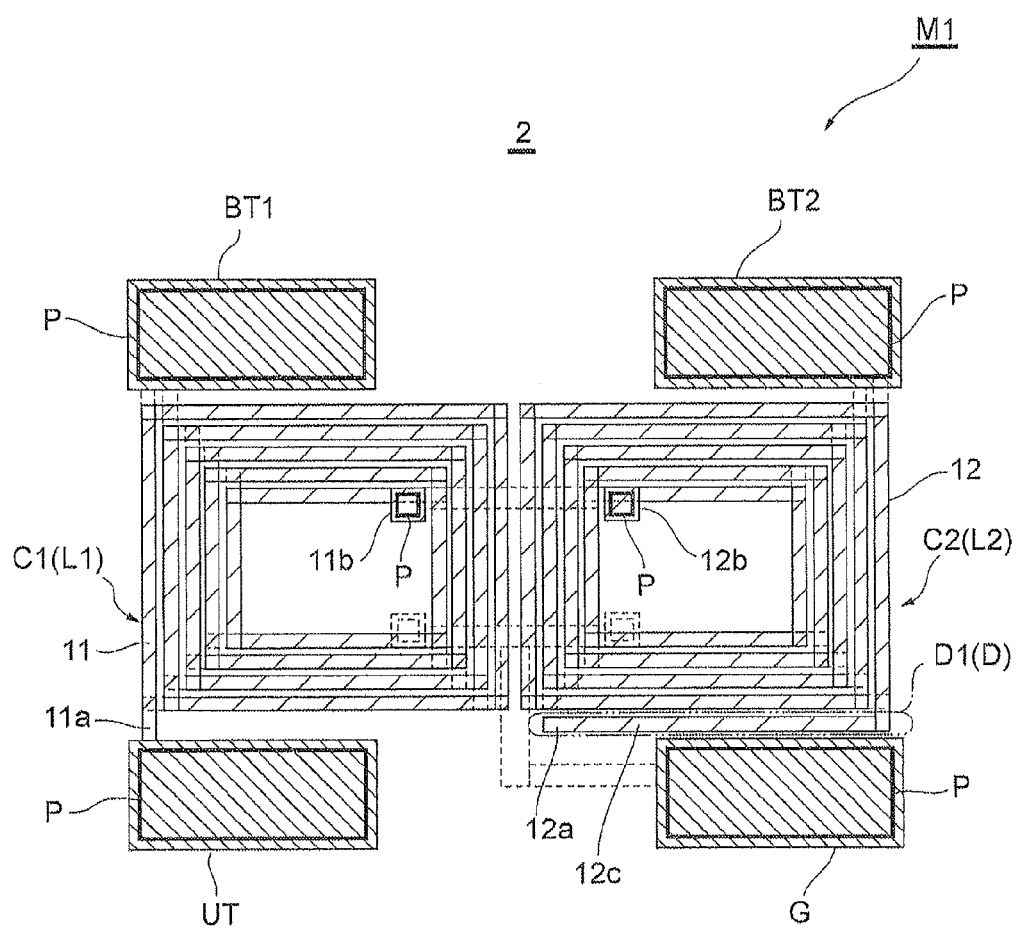
FIG. 15 is a horizontal sectional view showing the wiring layer M1 of the thin film balun 2.

In a thin film balun 2 of an example 2 in the first embodiment of the present invention, the coil portion C2 is made longer than the coil portion C1, and the electrode D2 of the capacitor D is positioned so as to face this extension of the coil portion C2. FIGS. 14 and 15 are horizontal sectional views schematically showing the wiring layers M0 and M1 of the thin film balun 2 of the example 2, respectively.

As shown in FIG. 14, the electrode D2 of the capacitor D is connected to the ground terminal G and also extends from the ground terminal G toward the unbalanced terminal UT, in the wiring layer M0.

As shown in FIG. 15, the coil portion C2 is formed longer than the coil portion C1 in the wiring layer M1, where an extension 12c of the coil portion C2 extends in the same direction as a winding direction of the coil portion C2 in the same layer as the coil portion C2, so as to be situated outside a region facing the balanced transmission line. This extension 12c serves as the electrode D1 of the capacitor D. The electrode D1 which is a part of the coil portion C2 faces the electrode D2 in the wiring layer M0. Other arrangements are the same as in the example 1.

Example 2A

Figure 16:
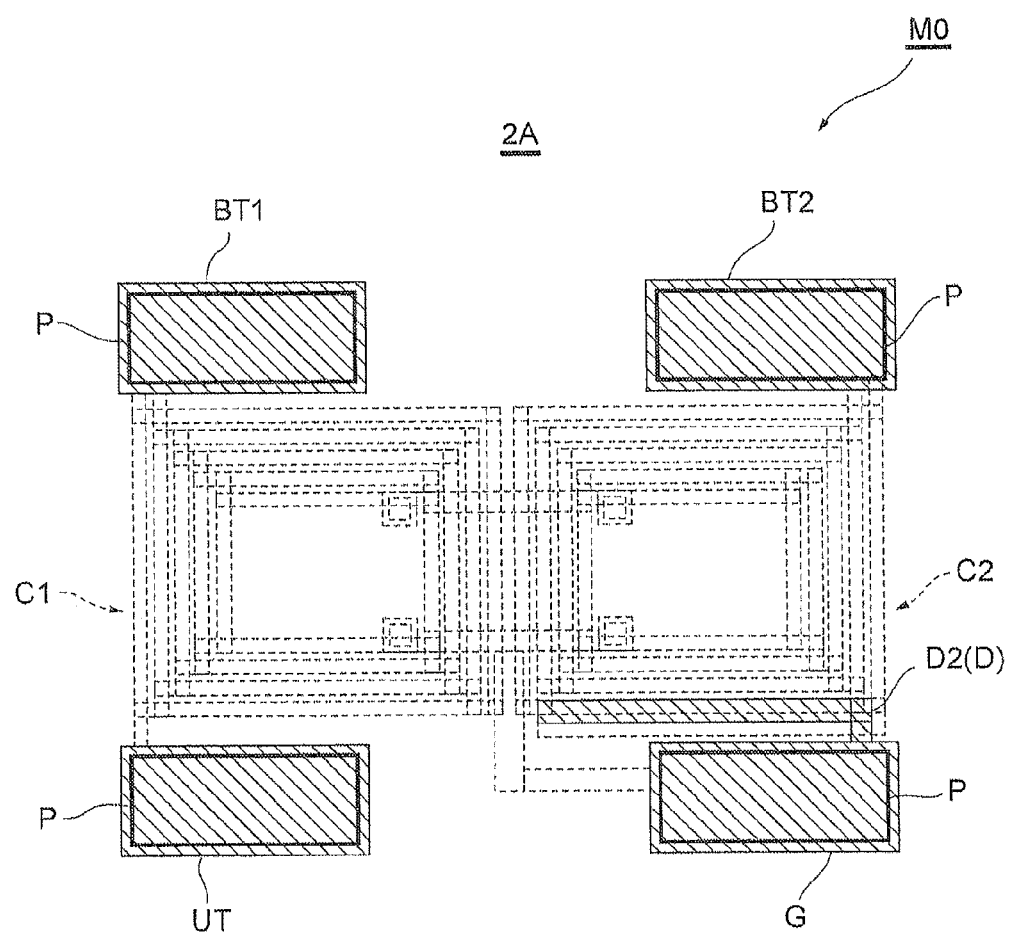
FIG. 16 is a horizontal sectional view showing the wiring layer M0 of a thin film balun 2A.

FIG. 16 is a horizontal sectional view schematically showing the wiring layer M0 of a thin film balun 2A of an example 2A. Structures other than the wiring layer M0 are the same as those in the example 2. In the thin film balun 2A shown in FIG. 16, the electrode D2 of the capacitor D is positioned so as to be parallel to an extending direction of the coil conductor of the second line from the bottom of the coil portion C2 and face a part of the coil conductor in plan view.

Example 2B

Figure 17:
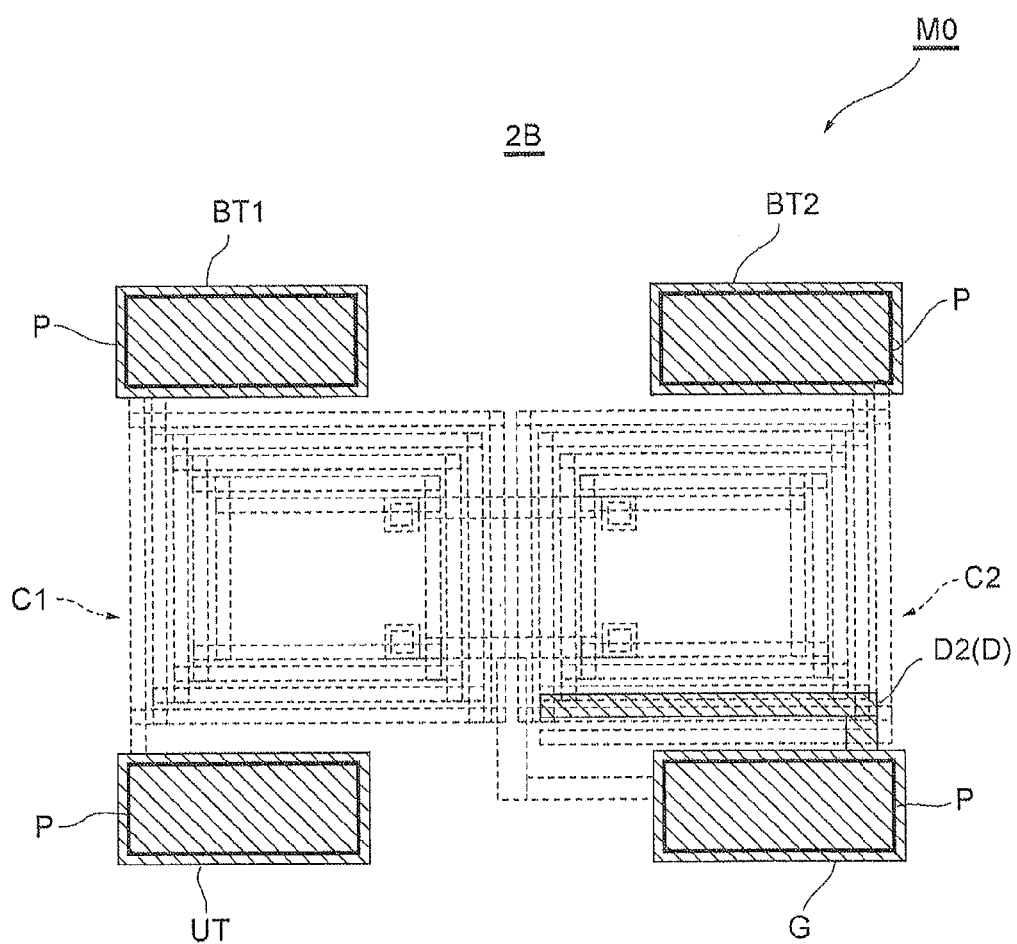
FIG. 17 is a horizontal sectional view showing the wiring layer M0 of a thin film balun 2B.

FIG. 17 is a horizontal sectional view schematically showing the wiring layer M0 of a thin film balun 2B of an example 2B. Structures other than the wiring layer M0 are the same as those in the example 2. In the thin film balun 2B shown in FIG. 17, the electrode D2 of the capacitor D is positioned so as to be parallel to an extending direction of a space between the coil conductors of the second and third lines from the bottom of the coil portion C2 and face a part of the coil conductors on both sides of the space in plan view.

Example 2C

Figure 18:
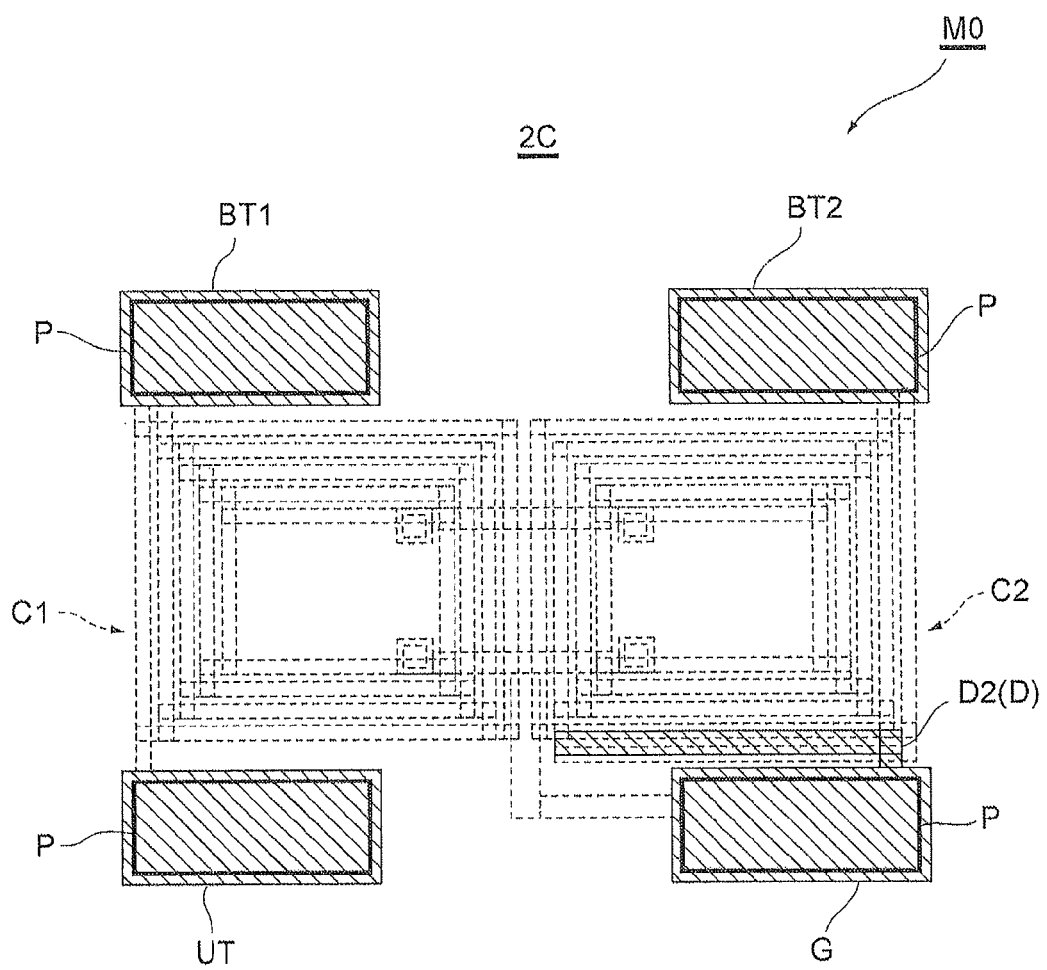
FIG. 18 is a horizontal sectional view showing the wiring layer M0 of a thin film balun 2C.

FIG. 18 is a horizontal sectional view schematically showing the wiring layer M0 of a thin film balun 2C of an example 2C. Structures other than the wiring layer M0 are the same as those in the example 2. In the thin film balun 2C shown in FIG. 18, the electrode D2 of the capacitor D is positioned so as to be parallel to an extending direction of a space between the coil conductor of the first line (the extension 12c) and the coil conductor of the second line from the bottom of the coil portion C2 and face a part of the coil conductors on both sides of the space in plan view.

Example 2D

Figure 19:
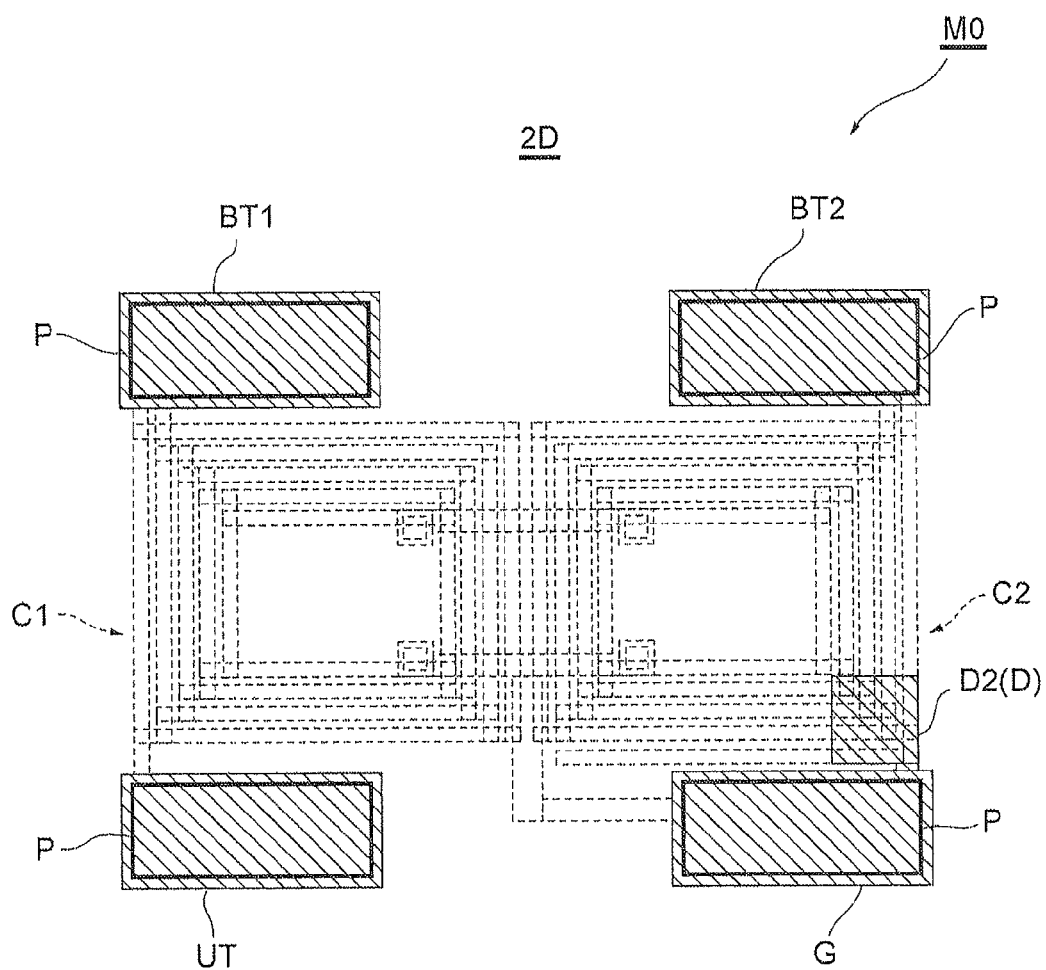
FIG. 19 is a horizontal sectional view showing the wiring layer M0 of a thin film balun 2D.

FIG. 19 is a horizontal sectional view schematically showing the wiring layer M0 of a thin film balun 2D of an example 2D. Structures other than the wiring layer M0 are the same as those in the example 2. In the thin film balun 2D shown in FIG. 19, the electrode D2 of the capacitor D is positioned so as to face a plurality of coil conductors 12 in a lower right region of the coil portion C2. Here, the electrode D2 has the same area as in the examples 2 and 2A to 2C.

(Characteristic Evaluation)

Figure 20:
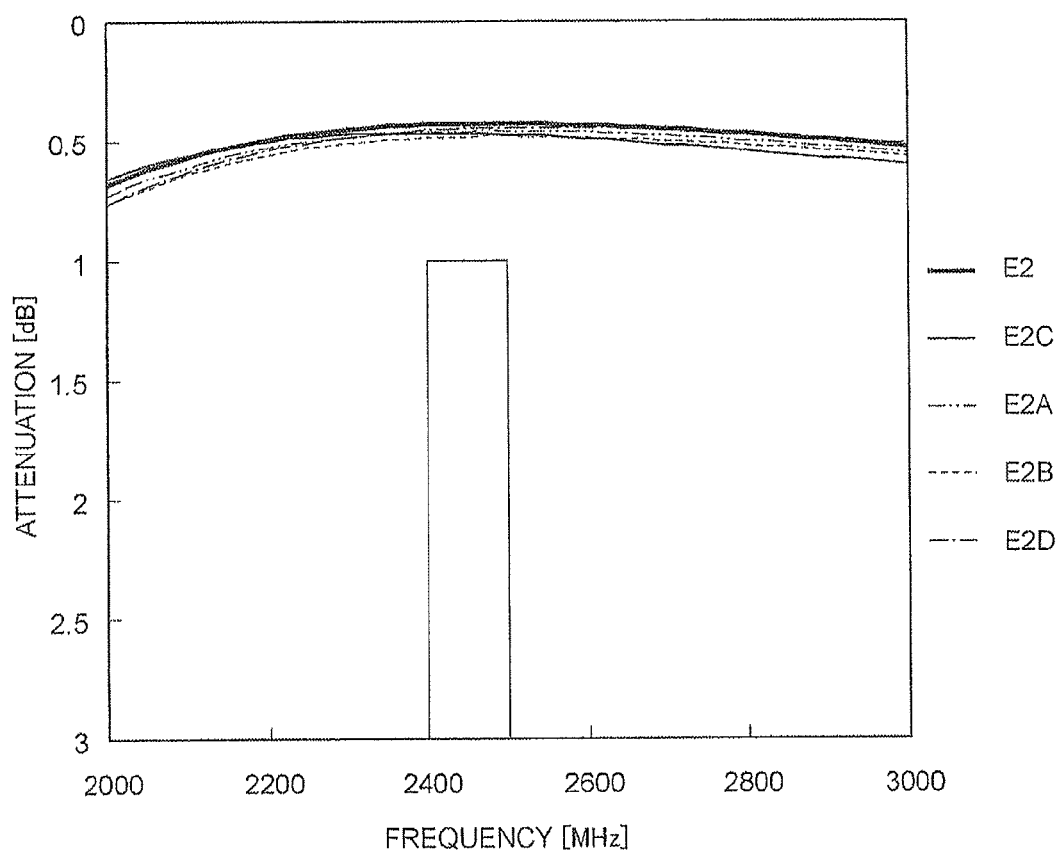
FIG. 20 is a graph showing passage characteristic evaluation results.
Figure 21:
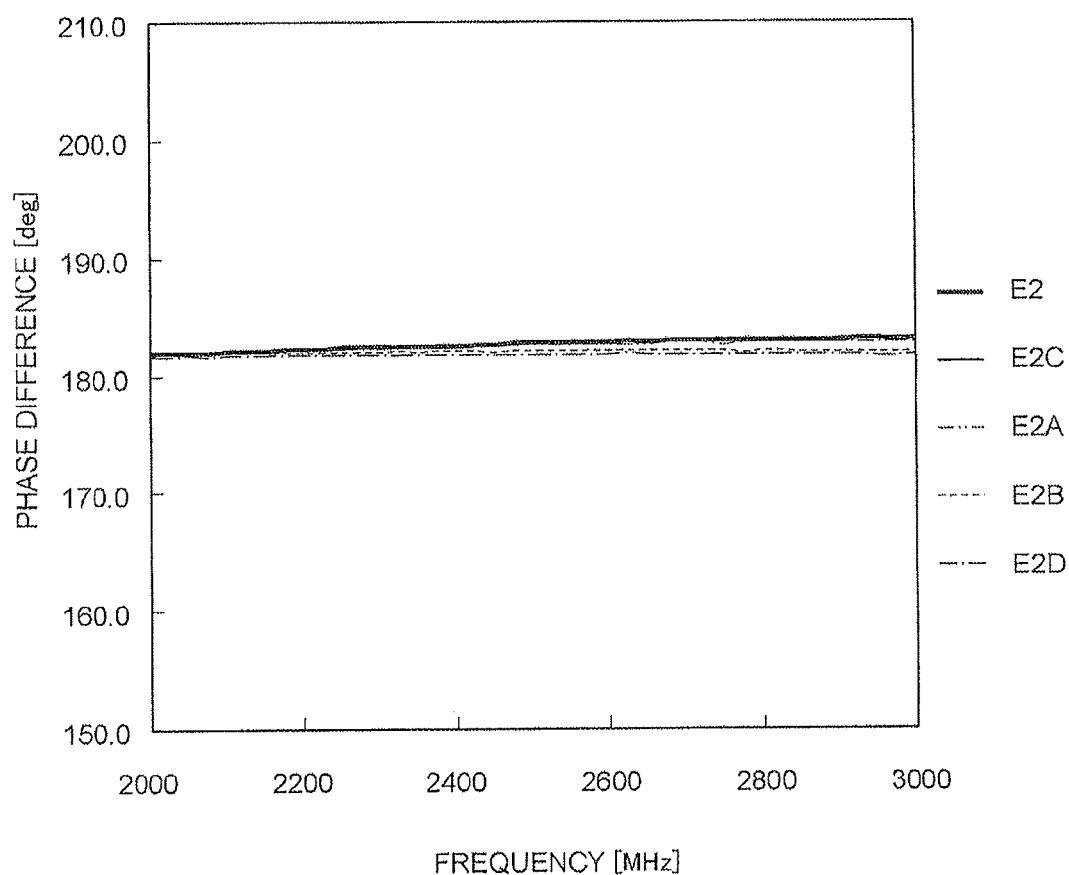
FIG. 21 is a graph showing phase difference evaluation results.
Figure 22:
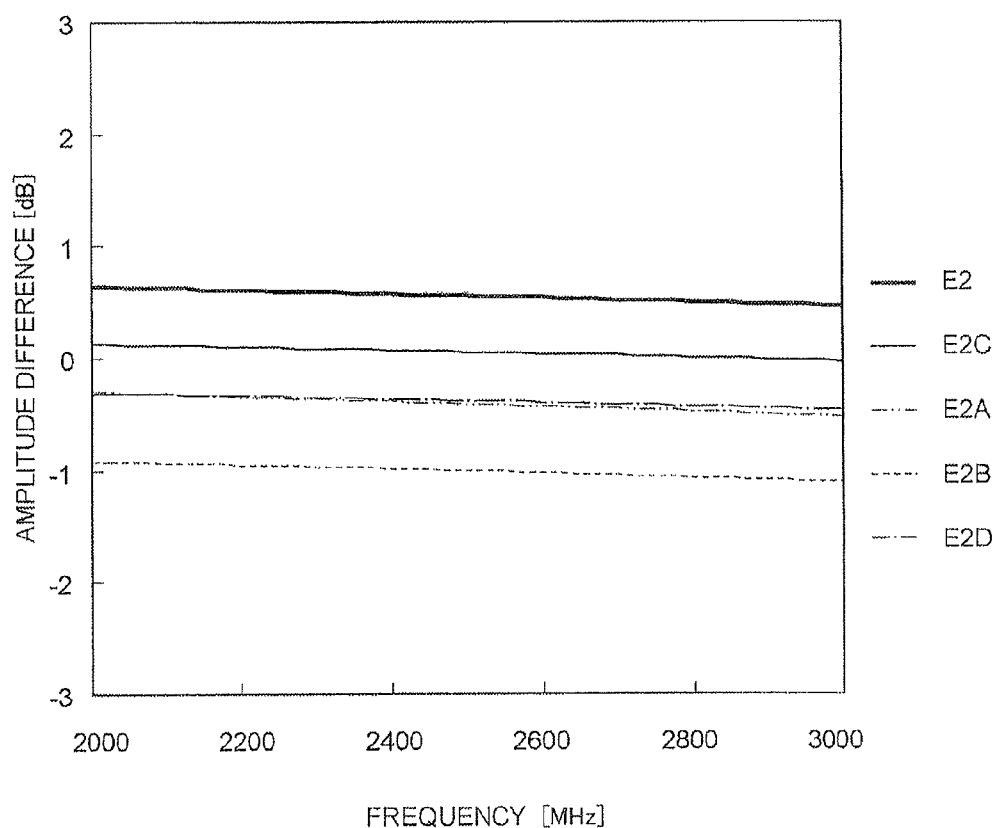
FIG. 22 is a graph showing amplitude difference evaluation results.

Passage characteristics (insertion loss) and balance characteristics (phase difference and amplitude difference of balanced signals) of each of the thin film baluns 2 and 2A to 2D of the examples described above were measured by simulation. Evaluation target frequencies (resonant frequencies fr) of a transmission signal were set at 2400 MHz to 2500 MHz. FIG. 20 is a diagram showing passage characteristic evaluation results, FIG. 21 is a diagram showing phase difference evaluation results, and FIG. 22 is a diagram showing amplitude difference evaluation results. In each of FIGS. 20 to 22, curves E2 and E2A to E2D respectively indicate evaluation results of the thin film baluns 2 and 2A to 2D.

These results demonstrate that the thin film balun of each of the examples maintains excellent characteristics in the passage characteristics and the phase balance. The results also demonstrate that the amplitude balance can be adjusted by the position of the electrode D2 of the capacitor D. In detail, the evaluation results of the thin film baluns 2 and 2A to 2D demonstrate that, by providing the electrode D2 of the capacitor D to face the extension 12c of the coil portion C2, the peak value of the resonant frequency fr shifts little even when the position of the electrode D2 is adjusted. In particular, the evaluation results of the thin film balun 2D demonstrate that the thin film balun in which the electrode D2 of the capacitor D is positioned facing the plurality of coil conductors 12 in the lower right region of the coil portion C2 in plan view exhibits a most excellent amplitude balance.

Differences in passage characteristics and balance characteristics depending on whether or not the coil portion C2 has the extension were also evaluated. Thin film baluns of the following examples 1E and 1F and the thin film baluns of the examples 2, 2A, and 2B were used for this evaluation.

Examples 1E and 1F

Figure 23:
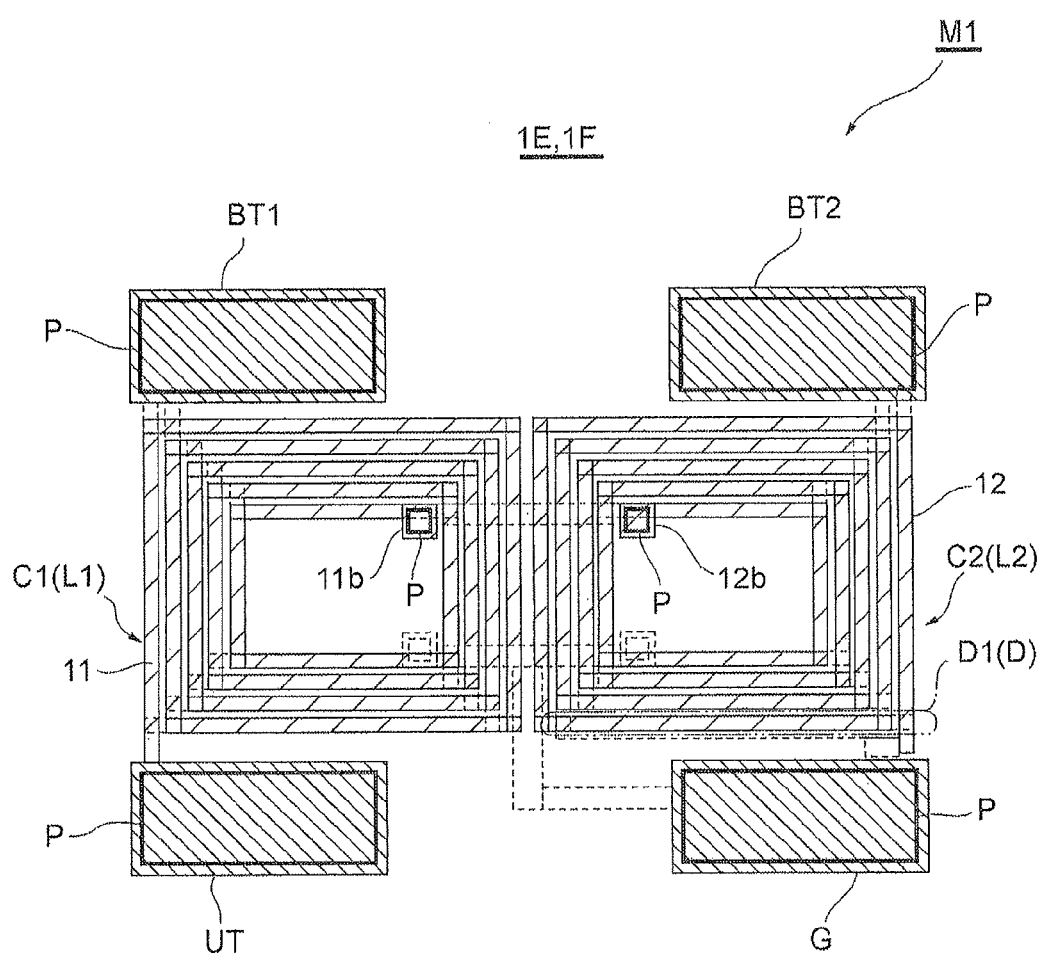
FIG. 23 is a horizontal sectional view showing the wiring layer M0 of thin film baluns 1E and 1F.

FIG. 23 is a horizontal sectional view schematically showing the wiring layer M1 of thin film baluns 1E and 1F of the examples 1E and 1F in the first embodiment of the present invention. As shown in FIG. 23, in the thin film baluns 1E and 1F, the coil portion C2 has no extension. Though not shown, the thin film balun 1E has the same wiring layer M0 as the thin film balun 2A shown in FIG. 16, and the thin film balun 1F has the same wiring layer M0 as the thin film balun 2B shown in FIG. 17. Structures other than the wiring layers M0 and M1 are the same as those in the example 1.

Examples 2, 2A, and 2B

Figure 24:
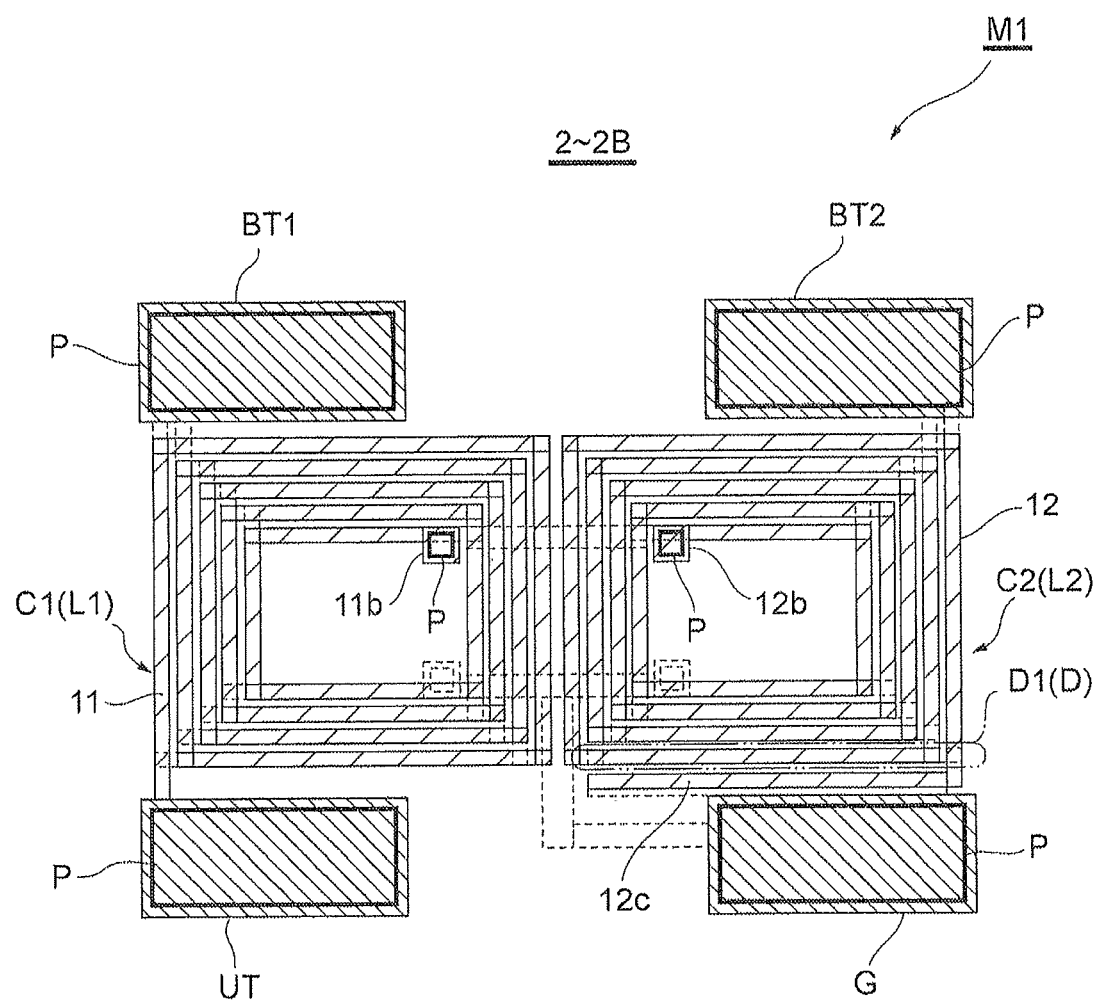
FIG. 24 is a horizontal sectional view showing the wiring layer M1 of the thin film baluns 2, 2A, and 2B.

FIG. 24 is a horizontal sectional view confirmatorily showing the wiring layer M1 of the thin film baluns 2, 2A, and 2B of the examples 2, 2A, and 2B in the first embodiment of the present invention described above. As shown in FIG. 24, the thin film baluns 2, 2A, and 2B have the extension 12c serving as the electrode D1 of the capacitor D. As mentioned earlier, the thin film balun 2 has the wiring layer M0 shown in FIG. 14, the thin film balun 2A has the wiring layer M0 shown in FIG. 16, and the thin film balun 2B has the wiring layer M0 shown in FIG. 17. Structures other than the wiring layers M0 and M1 are the same as those in the example 1.

(Characteristic Evaluation)

Figure 25:
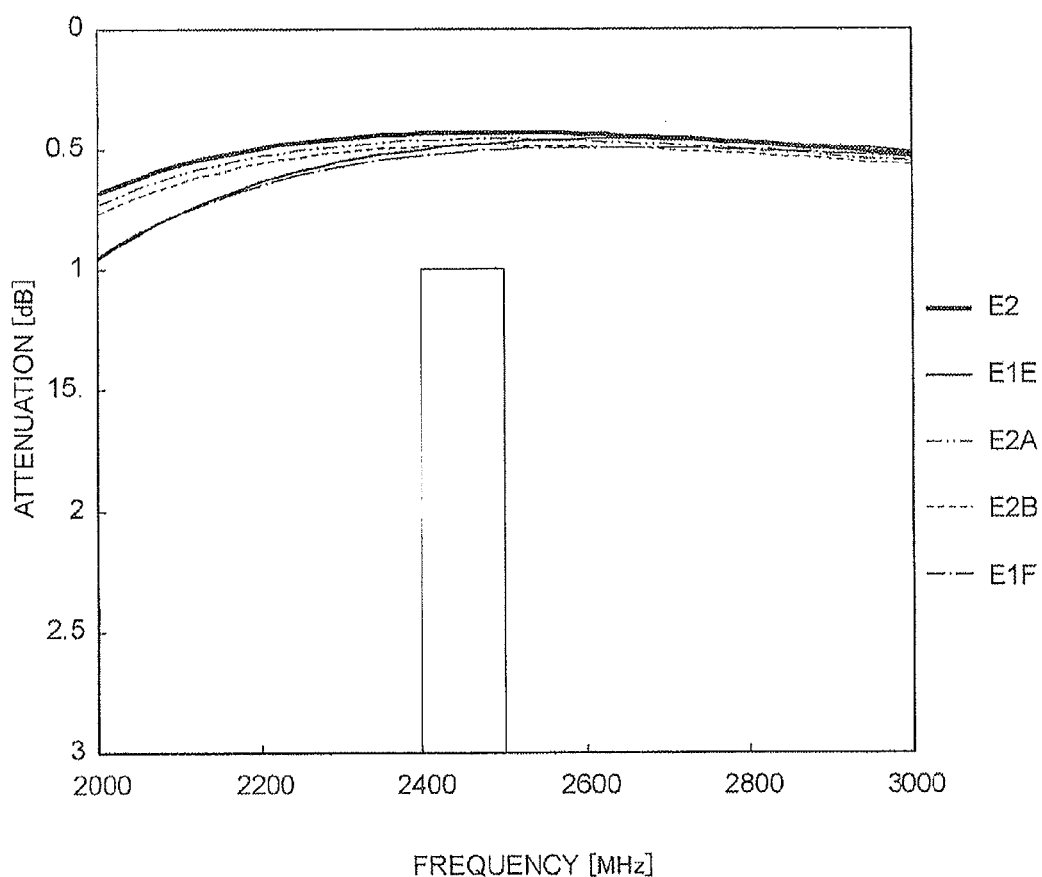
FIG. 25 is a graph showing passage characteristic evaluation results.
Figure 26:
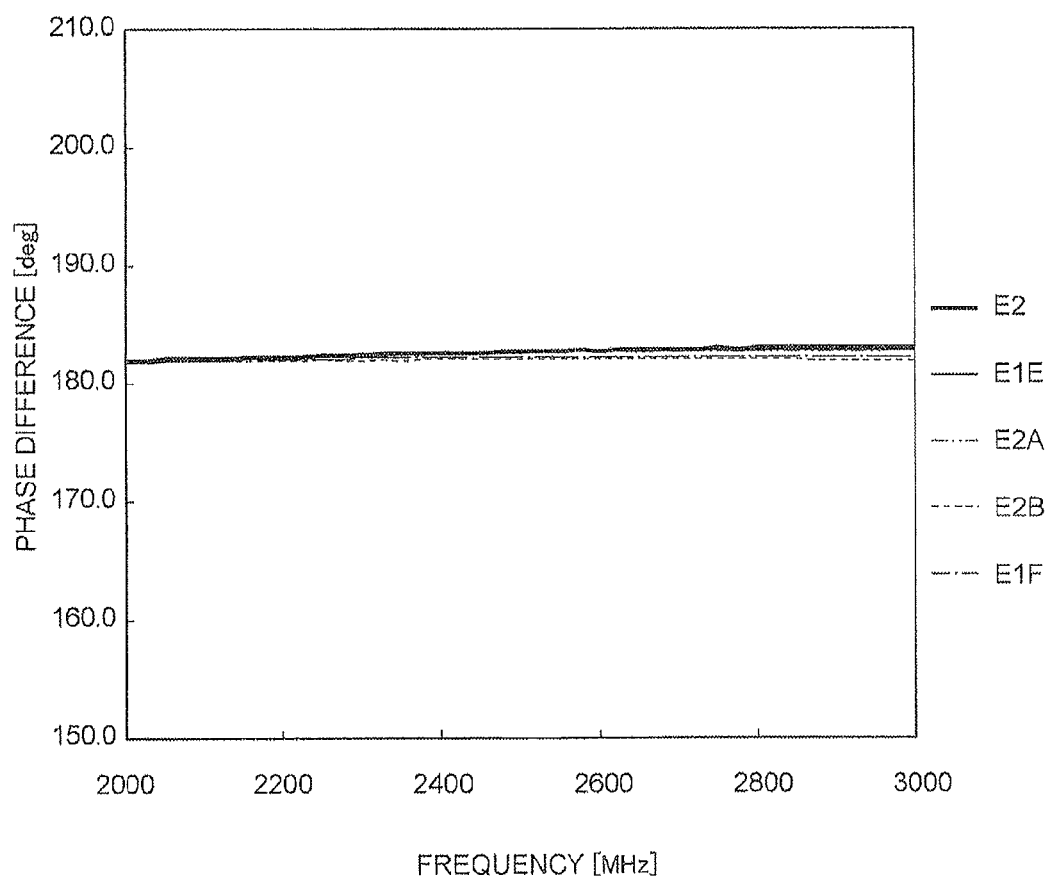
FIG. 26 is a graph showing phase difference evaluation results.
Figure 27:
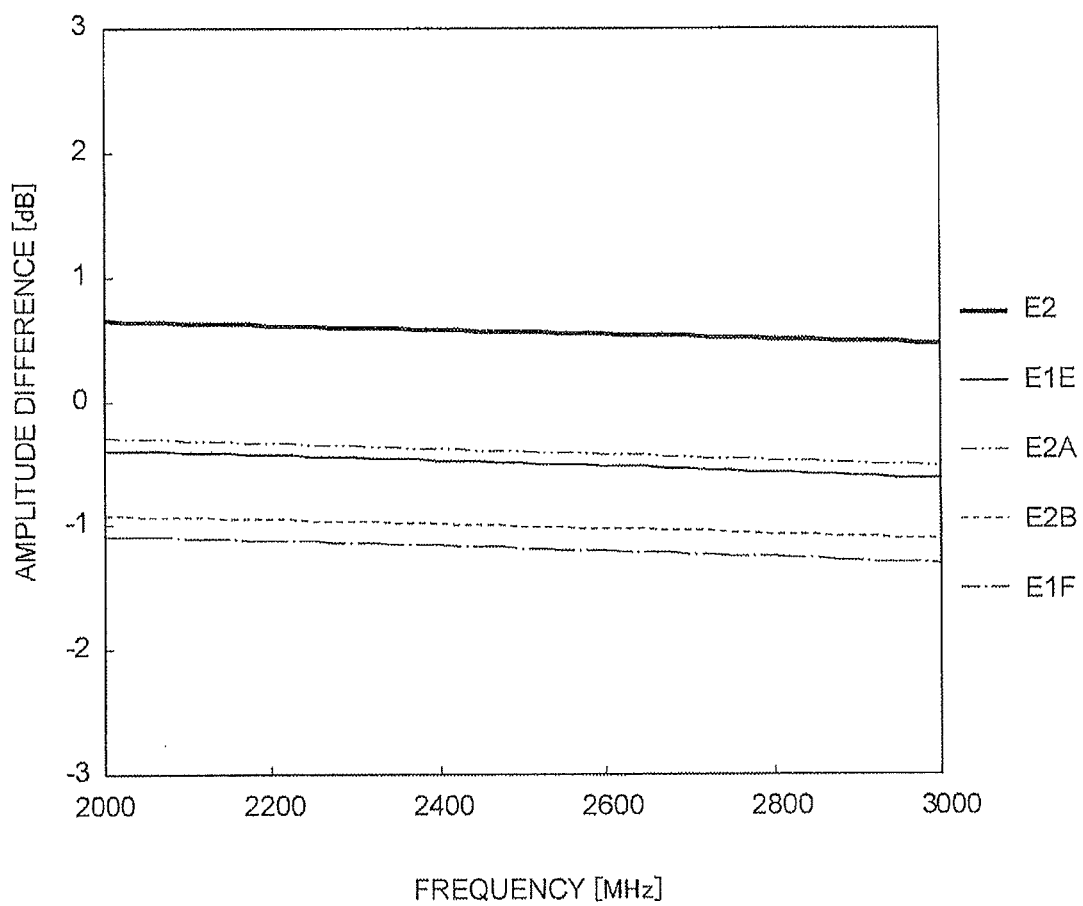
FIG. 27 is a graph showing amplitude difference evaluation results.

Passage characteristics (insertion loss) and balance characteristics (phase difference and amplitude difference of balanced signals) of each of the thin film baluns 1E and 1F of the examples described above were measured by simulation. Evaluation target frequencies (resonant frequencies fr) of a transmission signal were set at 2400 MHz to 2500 MHz. FIG. 25 is a diagram showing passage characteristic evaluation results, FIG. 26 is a diagram showing phase difference evaluation results, and FIG. 27 is a diagram showing amplitude difference evaluation results. The results of the thin film baluns 2, 2A, and 2B mentioned earlier are also shown in each of FIGS. 25 to 27. In each of FIGS. 25 to 27, curves E1E, E1F, E2, E2A, and E2B respectively indicate evaluation results of the thin film baluns 1E, 1F, 2, 2A, and 2B.

The evaluation results of the thin film baluns 1E and 1F demonstrate that, by providing the electrode D2 of the capacitor D to face the extension 12c of the coil portion C2, the peak value of the resonant frequency fr shifts little even when the position of the electrode D2 is adjusted.

Comparative Example

Figure 28:
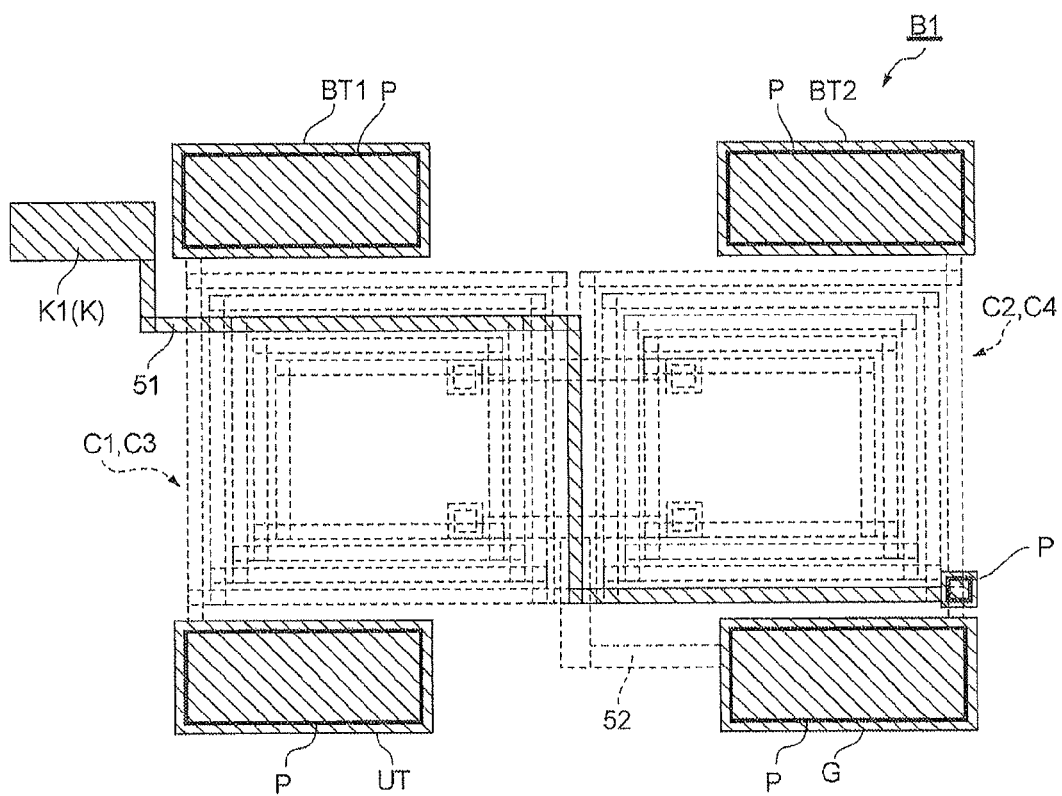
FIG. 28 is a horizontal sectional view showing a wiring layer B1 of a thin film balun of a comparative example.

FIG. 28 is a horizontal sectional view schematically showing a wiring layer B1 of a thin film balun of a comparative example. This wiring layer B1 is provided between the insulating substrate 100 and the wiring layer M0. As shown in FIG. 28, in the thin film balun of the comparative example, a capacitor K is positioned outside a range of a region of the coil portion C2 in plan view. Though only an electrode K1 of the capacitor K is shown in the drawing, an opposite electrode (corresponding to the electrode D2 of the examples in the first embodiment) of the same shape as the electrode K1 is formed in the wiring layer M0 at a position facing the electrode K1. The electrode K1 is connected to a through hole P near the ground terminal G by a wire 51, and connected to the end 12a of the coil portion C2 in the wiring layer M1 via the through hole P. Meanwhile, the opposite electrode formed in the wiring layer M0 is connected to the ground terminal G by a wire 52.

(Characteristic Evaluation)

Figure 29:
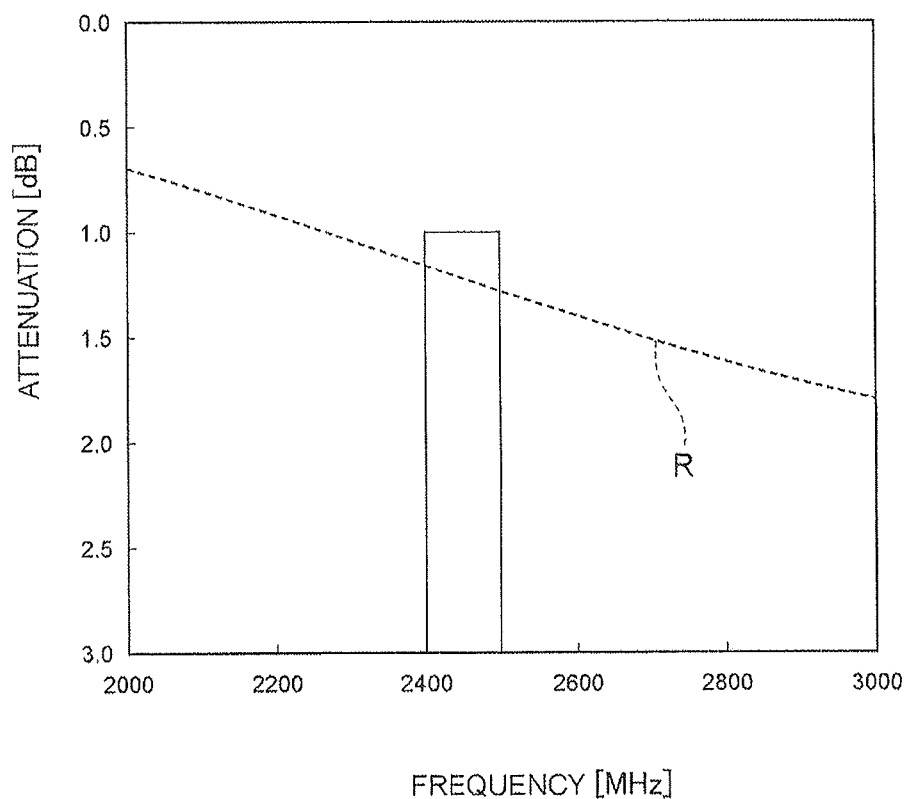
FIG. 29 is a graph showing passage characteristic evaluation results of the thin film balun of the comparative example.

FIG. 29 shows results of evaluating passage characteristics (attenuation characteristics) of a transmission signal by simulation, for the thin film balun of the comparative example described above. In the simulation, evaluation target frequencies (resonant frequencies fr) of the transmission signal were set at 2400 MHz to 2500 MHz. The passage characteristics of the thin film balun were evaluated with desired specifications being less than 1 dB in attenuation in this frequency range.

In FIG. 29, a curve R indicates the evaluation results of the thin film balun of the comparative example. The results shown in FIG. 29 demonstrate that the thin film balun of the comparative example has a larger attenuation in the frequency domain of the desired specifications in passage characteristics than the thin film balun according to the present invention, and fails to satisfy the desired specifications.

As noted earlier, the present invention is not limited to the above examples, and various changes can be made without departing from the scope of the present invention. For example, the arrangement of the unbalanced terminal UT, the balanced terminals BT1 and BT2, and the ground terminal G is not limited to the positions shown in the drawings. Moreover, the number of layers of the multilayer wiring structure forming the thin film balun may be smaller or larger than the number shown in the drawings. Besides, the wiring layers on the insulating substrate 100 may be reversed in order. Furthermore, various coil arrangements may be employed without departing from the scope of the present invention.

According to the thin film balun in the first embodiment of the present invention, a part of the line portion constituting the unbalanced circuit serves as one electrode of the capacitor connected to the unbalanced circuit, so that the thin film balun can be made smaller and thinner while maintaining required balun characteristics. Such a thin film balun is widely applicable, in particular to wireless communication devices, apparatuses, modules, and systems which are required to be smaller and thinner, facilities including them, and manufacturing thereof.

Second Embodiment

Figure 30:
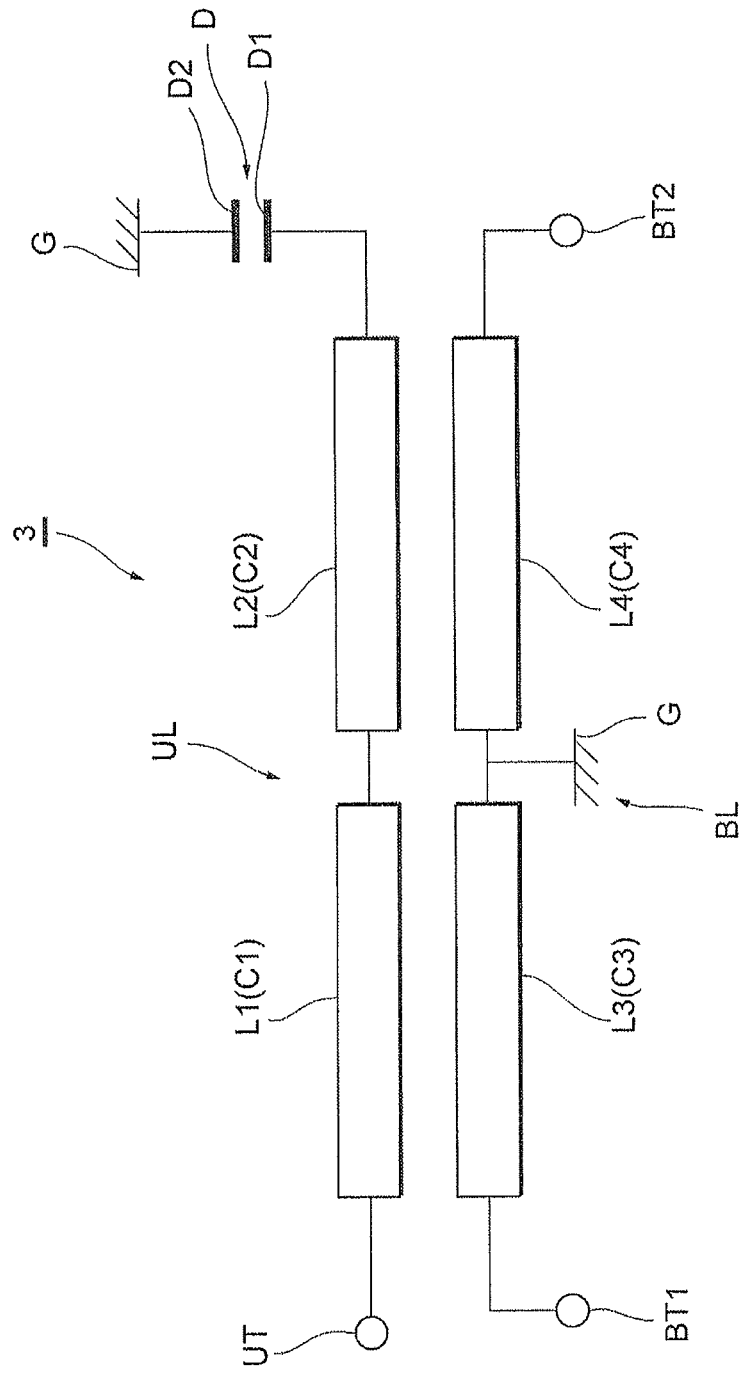
FIG. 30 is an equivalent circuit diagram showing a structure of a thin film balun 3 in a second embodiment of the present invention.

A thin film balun in a second embodiment corresponding to the second aspect of the present invention is described below. FIG. 30 is an equivalent circuit diagram showing a structure of the thin film balun in the second embodiment of the present invention. A thin film balun 3 includes the unbalanced transmission line (unbalanced circuit) UL in which the line portion L1 (first line portion) and the line portion L2 (second line portion) are connected in series, and the balanced transmission line (balanced circuit) BL in which the line portion L3 (third line portion) and the line portion L4 (fourth line portion) are connected in series. The line portions L1 and L3 form magnetic coupling, and the line portions L2 and L4 form magnetic coupling.

In the thin film balun 3, the end of the line portion L1 other than the end connected to the line portion L2 is connected to the unbalanced terminal UT, and the end of the line portion L2 other than the end connected to the line portion L1 is connected to the ground terminal G (ground potential) via the capacitor D which is a C component (capacitance component). The capacitor D is formed by the electrode D1 connected to the other end of the line portion L2 and the electrode D2 connected to the ground terminal G where the electrodes D1 and D2 face each other via an appropriate dielectric. On the other hand, the end of the line portion L3 other than the end connected to the line portion L4 is connected to the balanced terminal BT1, and the end of the line portion L4 other than the end connected to the line portion L3 is connected to the balanced terminal BT2. Moreover, the connected ends of the line portions L3 and L4 are connected to the ground terminal G.

Lengths of the above-mentioned line portions L1 to L4 vary depending on specifications of the thin film balun 3. For example, the lengths may be set so as to form a quarter-wavelength ($\lambda/4$) resonator circuit of a transmission signal which is subject to conversion. Moreover, the line portions L1 to L4 may be arbitrarily shaped so long as the above-mentioned magnetic coupling is formed. Example shapes include a spiral (coil form), a zigzag, a straight line, and a curved line.

A basic operation of the thin film balun 3 is described below, with reference to FIG. 30. In the thin film balun 3, when an unbalanced signal is input to the unbalanced terminal UT, the unbalanced signal propagates through the line portions L1 and L2. By the magnetic coupling (first magnetic coupling) of the line portions L1 and L3 and the magnetic coupling (second magnetic coupling) of the line portions L2 and L4, the input unbalanced signal is converted to two balanced signals that differ in phase by 180° (π), and the two balanced signals are output from the balanced terminals BT1 and BT2. A converting operation from balanced signals to an unbalanced signal is the reverse of the above-mentioned converting operation from an unbalanced signal to balanced signals.

Figure 31:
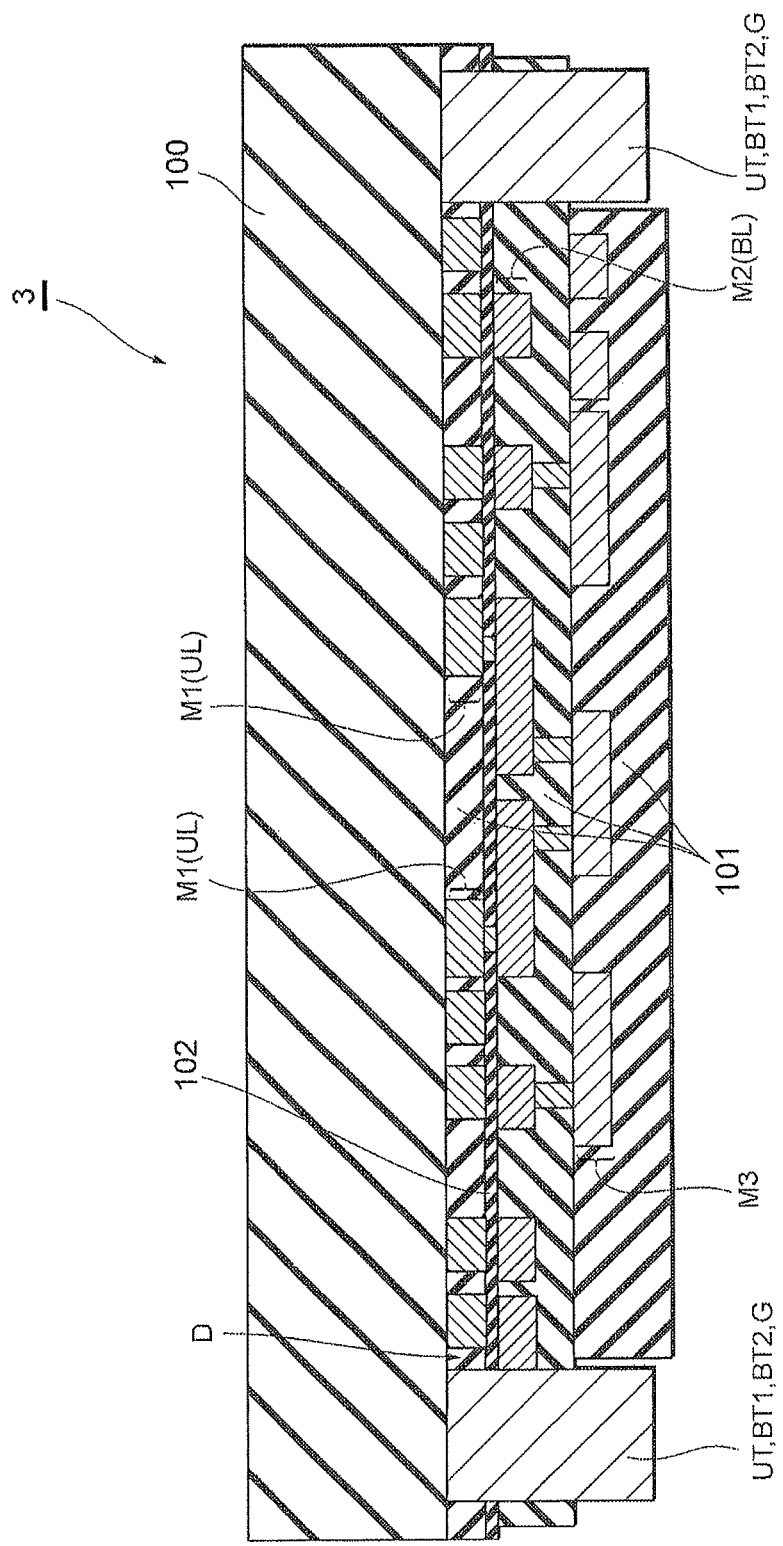
FIG. 31 is a vertical sectional view showing the structure of the thin film balun 3.

A wiring structure of the thin film balun in the second embodiment is described below. FIG. 31 is a vertical sectional view schematically showing the wiring structure of the thin film balun 3. As shown in FIG. 31, the wiring layers M1, M2, and M3 are formed in this order on the insulating substrate 100 of alumina or the like. For instance, the unbalanced transmission line UL mentioned above is formed by the wiring layer M1, and the balanced transmission line BL is formed by the wiring layer M2. Dielectric layers are formed between wires in the same wiring layer and between different wiring layers. For example, the dielectric layer 102 made of silicon nitride is formed between the wiring layers M1 and M2. Polyimide or the like is used as the dielectric layer 101 in other parts. Note that the materials are not limited to the above, and not only inorganic insulators such as silicon nitride, alumina, and silica but also organic insulators such as polyimide and epoxy resin may be selected according to need. The unbalanced terminal UT, the balanced terminals BT1 and BT2, and the ground terminal G are formed through all dielectric layers. Thus, the thin film balun 3 is composed of a thin film multilayer structure formed on the insulating substrate 100.

As shown in FIG. 31, in the second embodiment, the above-mentioned capacitor (C component) D is provided between the wiring layer M1 (first layer) that includes the unbalanced transmission line UL and the wiring layer M2 (second layer) that faces the wiring layer M1 via the dielectric layer 102 and includes the balanced transmission line BL.

A pattern of each of the wiring layers M1, M2, and M3 of the thin film balun in the second embodiment is described in detail below. Coil portions are used as the line portions L1 to L4 in each of the following examples.

Example 1

Figure 32:
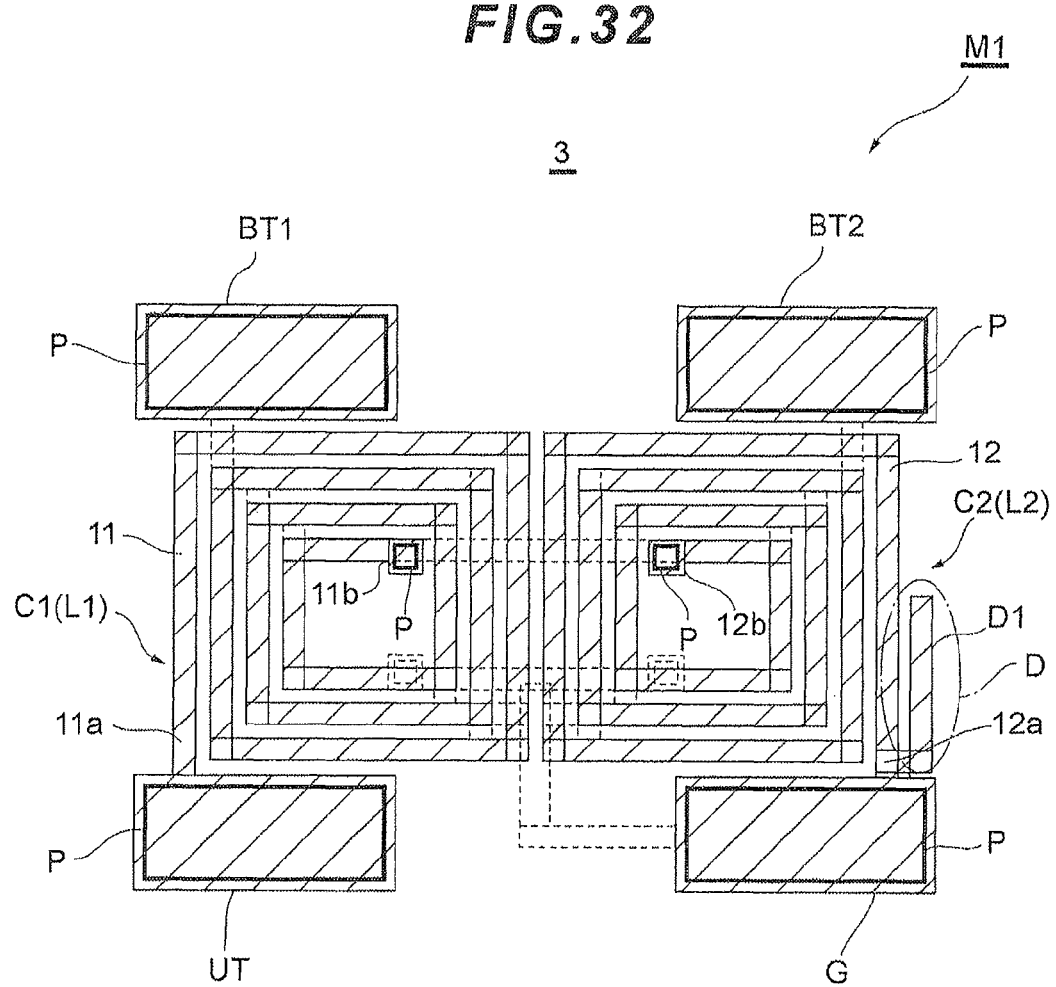
FIG. 32 is a horizontal sectional view showing the wiring layer M1 of the thin film balun 3.
Figure 33:
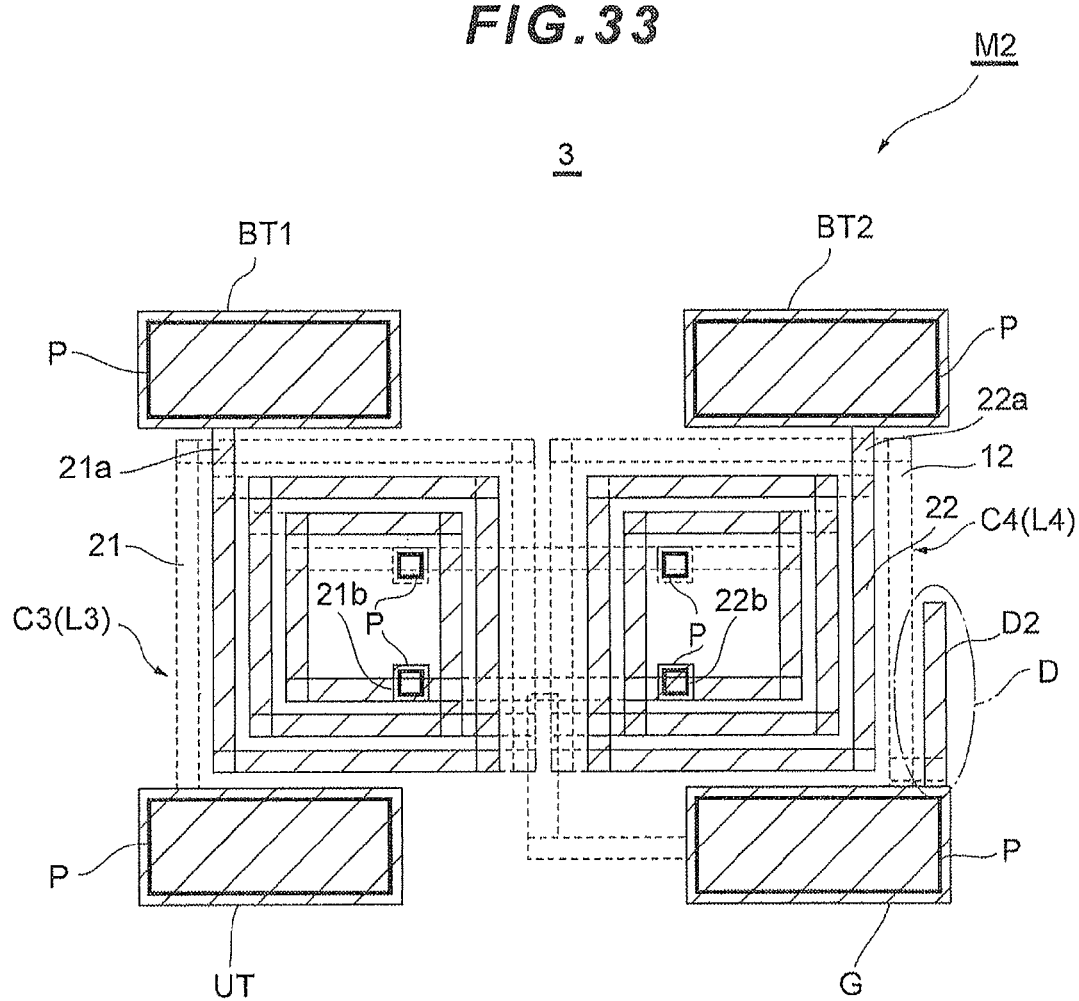
FIG. 33 is a horizontal sectional view showing the wiring layer M2 of the thin film balun 3.
Figure 34:
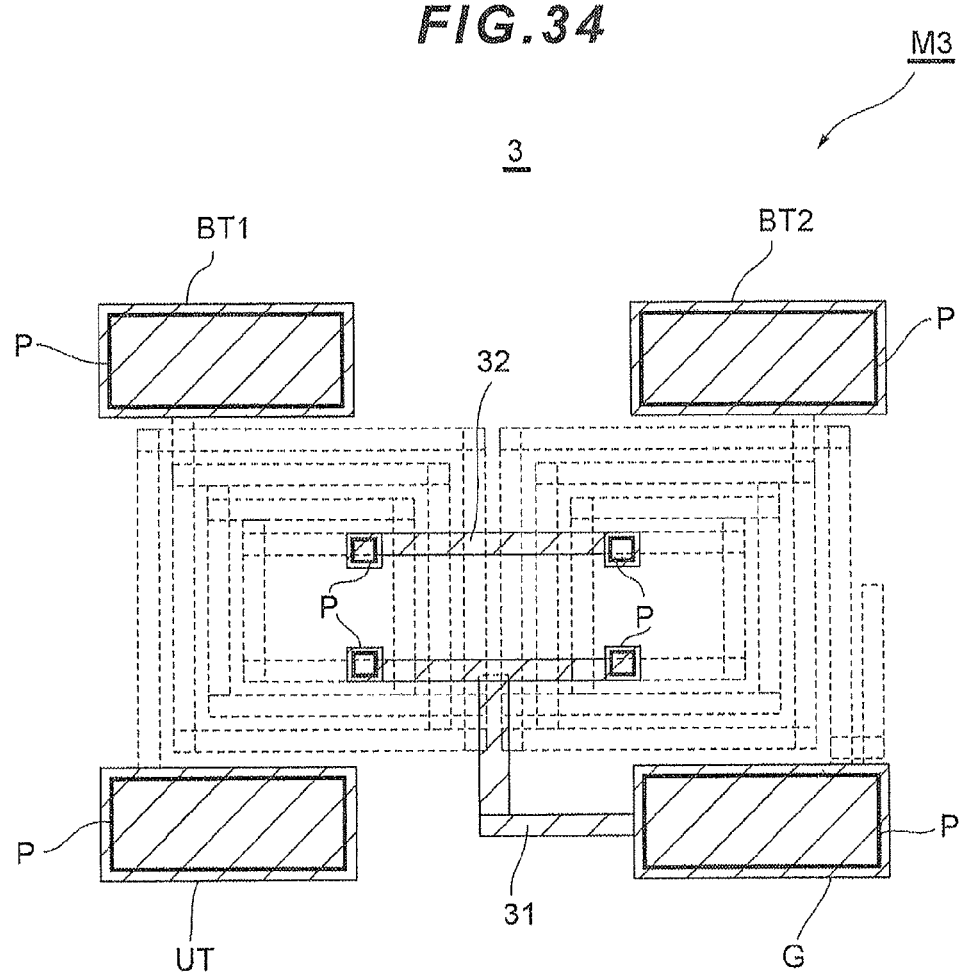
FIG. 34 is a horizontal sectional view showing the wiring layer M3 of the thin film balun 3.

FIGS. 32 to 34 are each a horizontal sectional view schematically showing a different one of the wiring layers of the thin film balun 3 of an example 1 in the second embodiment of the present invention. As shown in FIGS. 32 to 34, the unbalanced terminal UT, the balanced terminals BT1 and BT2, and the ground terminal G are formed in all of the wiring layers M1 to M3. Each of the terminals UT, BT1, BT2, and G is electrically connected between different layers via a through hole P. Note that all through holes P shown in FIGS. 32 to 34 are plated with a metal conductor for electrical conduction of upper and lower layers. A structure of each wiring layer is described in detail below.

As shown in FIG. 32, the coil portion C1 (first coil portion, first line portion) and the coil portion C2 (second coil portion, second line portion) that constitute the unbalanced transmission line UL are formed adjacent to each other in the wiring layer M1 on the insulating substrate 100. Each of the coil portions C1 and C2 forms an equivalent of a quarter-wavelength (λ/4) resonator. The outer end 11a of the coil conductor 11 constituting the coil portion C1 is connected to the unbalanced terminal UT, and the inner end 11b of the coil conductor 11 is connected to a through hole P. The inner end 12b of the coil conductor 12 constituting the coil portion C2 is connected to a through hole P. The electrode D1 of the capacitor D extends from the outer end (outer peripheral end) 12a of the coil conductor 12 (the end referred to here does not denote an end of a physical shape, but denotes an end of a coil equivalent to the coil portion C1), in a state of being wound in a direction opposite to a winding direction of the coil conductor 12. Since the electrode D1 of the capacitor D is placed in the same layer as the coil portion C2, the electrode D1 is inevitably situated outside the range of the region of the coil portion C2.

As shown in FIG. 33, the coil portion C3 (third coil portion, third line portion) and the coil portion C4 (fourth coil portion, fourth line portion) that constitute the balanced transmission line BL are formed adjacent to each other in the wiring layer M2. Each of the coil portions C3 and C4 forms an equivalent of a quarter-wavelength (λ/4) resonator, as with the coil portions C1 and C2. The coil portions C3 and C4 of the balanced transmission line BL are positioned facing the coil portions C1 and C2 of the unbalanced transmission line UL respectively, and the facing portions are magnetically coupled to form couplers. The outer end 21a of the coil conductor 21 constituting the coil portion C3 is connected to the balanced terminal BT1, and the inner end 21b of the coil conductor 21 is connected to a through hole P. The outer end 22a of the coil conductor 22 constituting the coil portion C4 is connected to the balanced terminal BT2, and the inner end 22b of the coil conductor 22 is connected to a through hole P. In addition, the electrode D2 facing the electrode D1 is formed in the wiring layer M2, and an end of the electrode D2 is connected to the ground terminal G.

As shown in FIG. 34, the wire 31 for connecting the coil portions C3 and C4 to the ground terminal G and the wire 32 for connecting the coil portions C1 and C2 are formed in the wiring layer M3. The wire 31 is a branch wire formed so as to connect two through holes P to the ground terminal G. The wire 31 is connected to the end 21b of the coil conductor 21 and the end 22b of the coil conductor 22 formed in the wiring layer M2, via the two through holes P. The wire 32 is connected to the end 11b of the coil conductor 11 and the end 12b of the coil conductor 12 formed in the wiring layer M1, via through holes P.

Thus, in the example 1, the thin film balun 3 forming the equivalent circuit shown in FIG. 30 is obtained by a multilayer wiring structure in which the two coil portions C1 and C2 constituting the unbalanced transmission line UL and the electrode D1 of the capacitor D are formed in the wiring layer M1 which is one layer, the two coil portions C3 and C4 constituting the balanced transmission line BL and the electrode D2 of the capacitor D are formed in the wiring layer M2 which is another layer adjacent to the wiring layer M1, and the wire 32 connecting the coil portions C1 and C2 and the wire 31 connecting the coil portions C3 and C4 are formed in the wiring layer M3 which is another layer adjacent to the wiring layer M2 on an opposite side to the wiring layer M1.

Comparative Example 1

In a thin film balun 3A of a comparative example 1, the capacitor D is provided between wiring layers other than the wiring layer M1 in which the unbalanced transmission line UL is formed and the wiring layer M2 in which the balanced transmission line BL is formed. FIGS. 35 to 38 are horizontal sectional views schematically showing the wiring layers B1, M0, M1, and M2 of the thin film balun 3A of the comparative example 1. Here, the wiring layers B1, M0, M1, and M2 are formed in this order on the insulating substrate 100.

Figure 35:
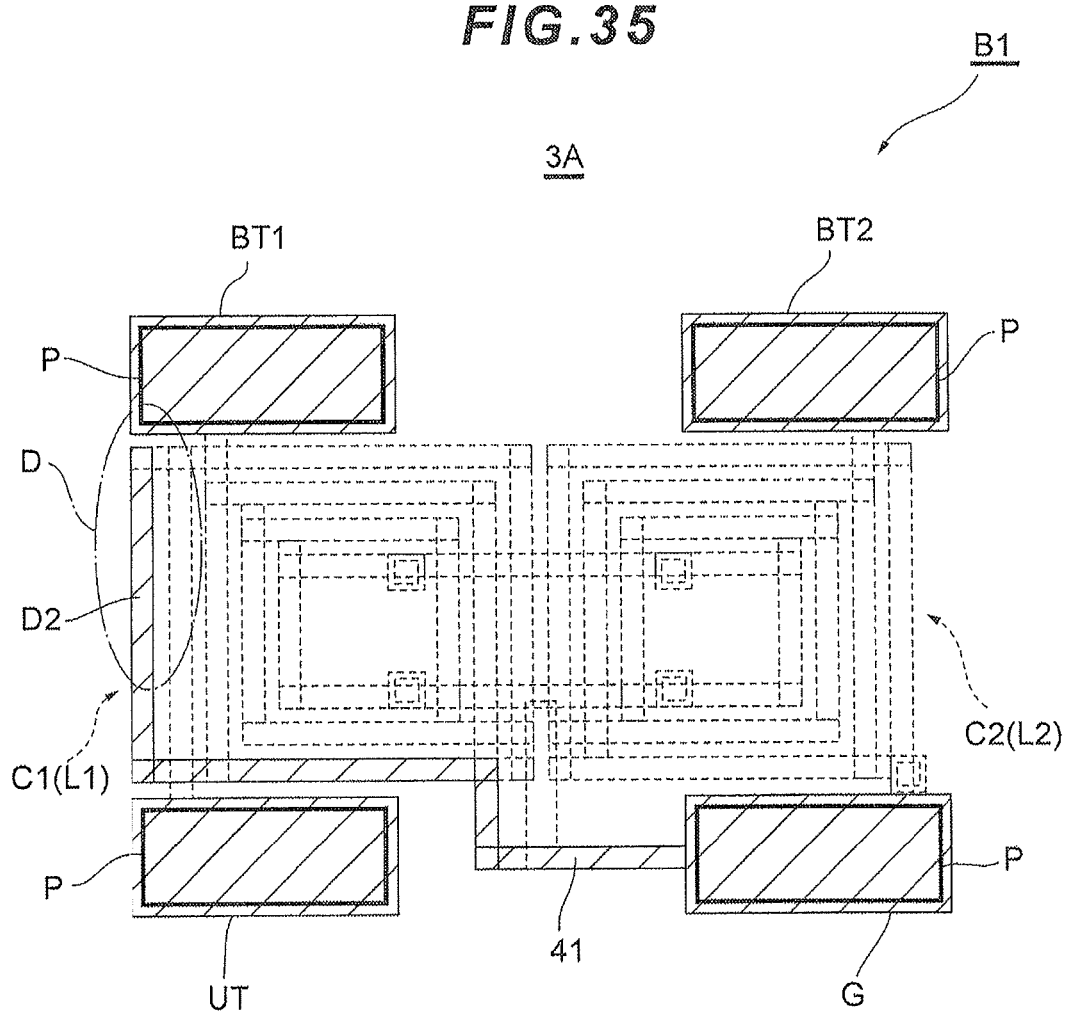
FIG. 35 is a horizontal sectional view showing the wiring layer B1 of a thin film balun 3A of a comparative example.

As shown in FIG. 35, the electrode D2 of the capacitor D is formed in the wiring layer B1 on the insulating substrate 100, in a region outside the coil portion C1 and near the balanced terminal BT1 in plan view. The electrode D2 is connected to the ground terminal G via a wire 41.

Figure 36:
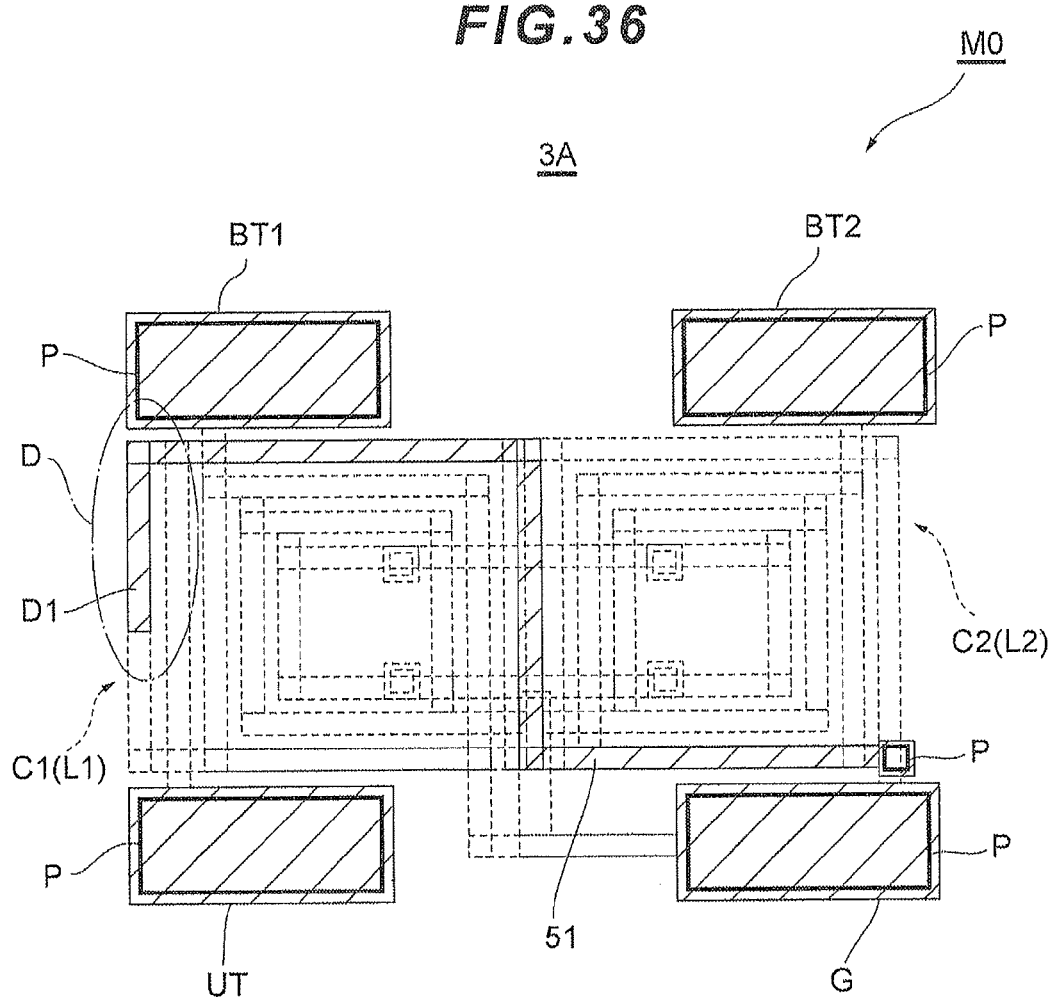
FIG. 36 is a horizontal sectional view showing the wiring layer M0 of the thin film balun 3A.

As shown in FIG. 36, the electrode D1 facing the electrode D2 is formed in the wiring layer M0. The electrode D1 is connected to the end 12a of the coil portion C2 in the wiring layer M1, via the wire 51 and a through hole P.

Figure 37:
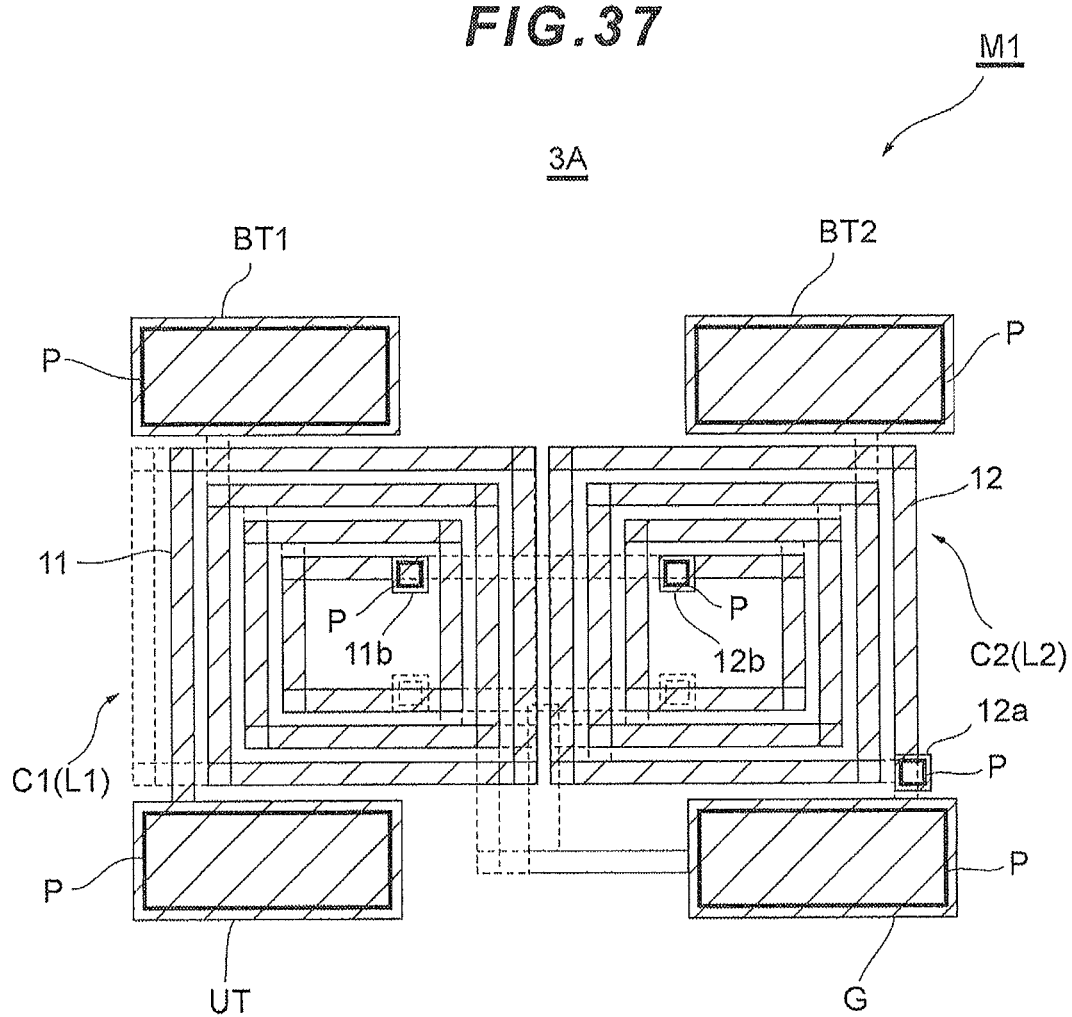
FIG. 37 is a horizontal sectional view showing the wiring layer M1 of the thin film balun 3A.

As shown in FIG. 37, the coil portions C1 and C2 that constitute the unbalanced transmission line UL are formed adjacent to each other in the wiring layer M1. The wiring layer M1 in the comparative example 1 is the same as that in the second embodiment, except that the electrode D1 of the capacitor D is not formed. The outer end 12a of the coil conductor 12 constituting the coil portion C2 is connected to the electrode D1 of the capacitor D provided in the wiring layer M0, via a through hole P.

Figure 38:
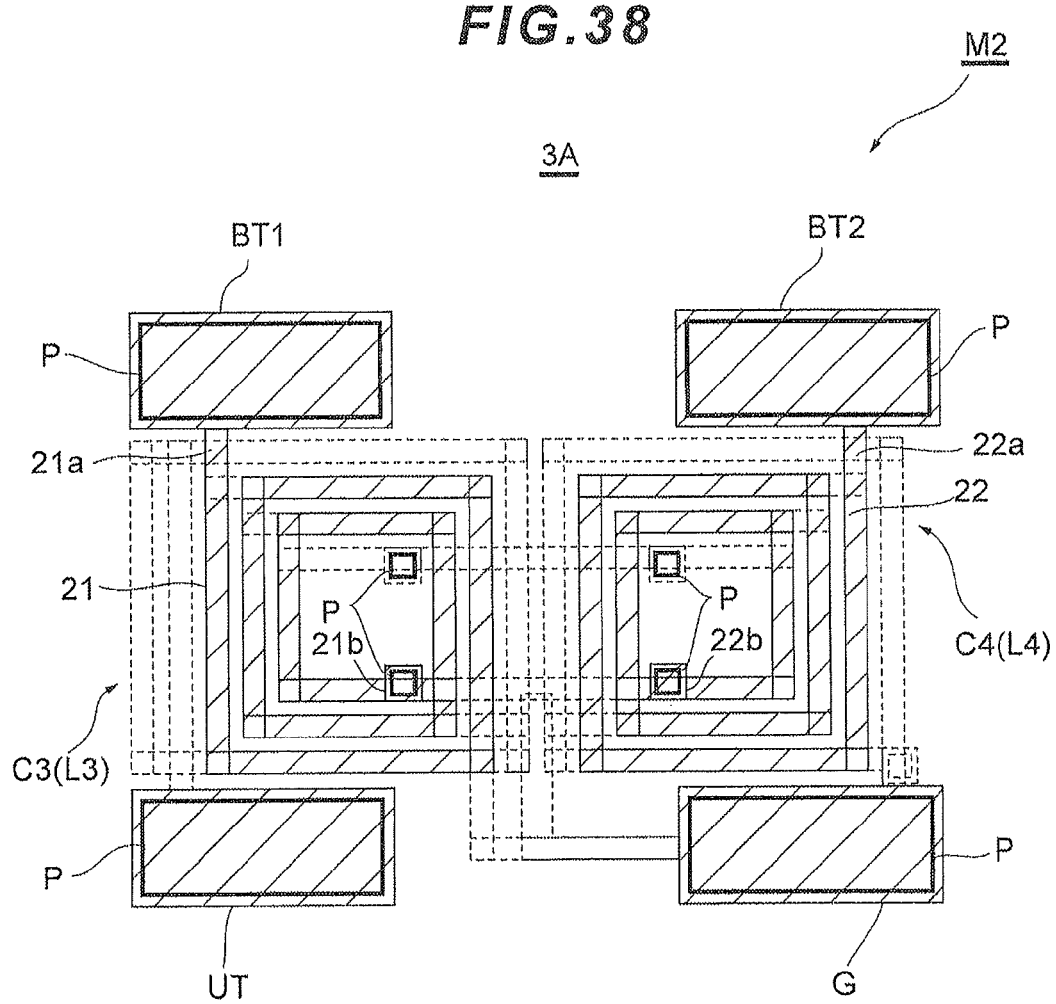
FIG. 38 is a horizontal sectional view showing the wiring layer M2 of the thin film balun 3A.

As shown in FIG. 38, the coil portions C3 and C4 that constitute the balanced transmission line BL are formed adjacent to each other in the wiring layer M2. The wiring layer M2 in the comparative example 1 is the same as that in the second embodiment, except that the electrode D2 of the capacitor D is not formed.

Though not shown, the wiring layer M3 is provided on the wiring layer M2 and the wires 31 and 32 are formed in the wiring layer M3, as in the second embodiment.

Thus, in the comparative example 1, the thin film balun 3A forming the equivalent circuit shown in FIG. 30 is obtained by a multilayer wiring structure in which the two coil portions C1 and C2 constituting the unbalanced transmission line UL are formed in the wiring layer M1 which is one layer, the two coil portions C3 and C4 constituting the balanced transmission line BL are formed in the wiring layer M2 which is another layer adjacent to the wiring layer M1, the wire 32 connecting the coil portions C1 and C2 and the wire 31 connecting the coil portions C3 and C4 are formed in the wiring layer M3 which is another layer adjacent to the wiring layer M2 on an opposite side to the wiring layer M1, the electrode D1 of the capacitor D is formed in the wiring layer M0 which is another layer adjacent to the wiring layer M1 on an opposite side to the wiring layer M2, and the electrode D2 of the capacitor D is formed in the wiring layer B1 which is another layer adjacent to the wiring layer M0 on an opposite side to the wiring layer M1.

Comparative Example 2

Figure 39:
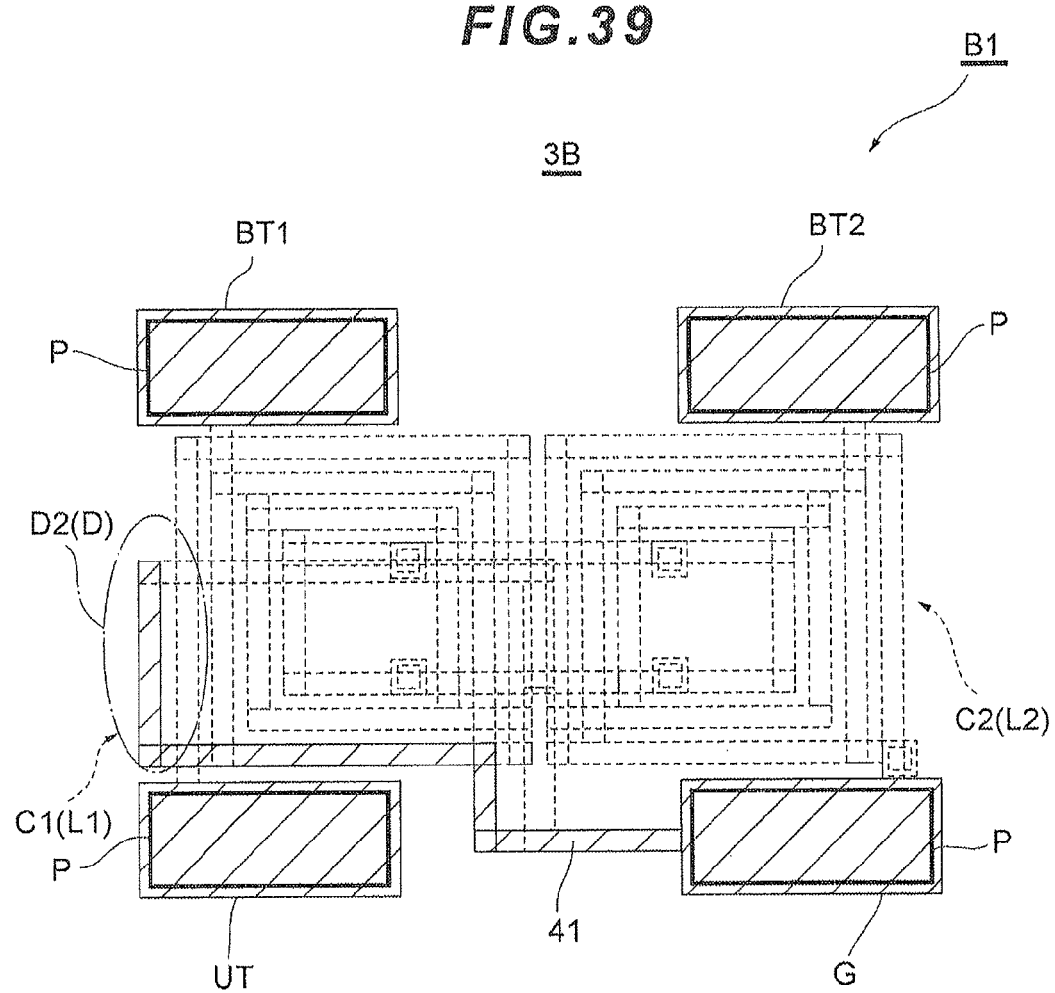
FIG. 39 is a horizontal sectional view showing the wiring layer B1 of a thin film balun 3B of a comparative example.
Figure 40:
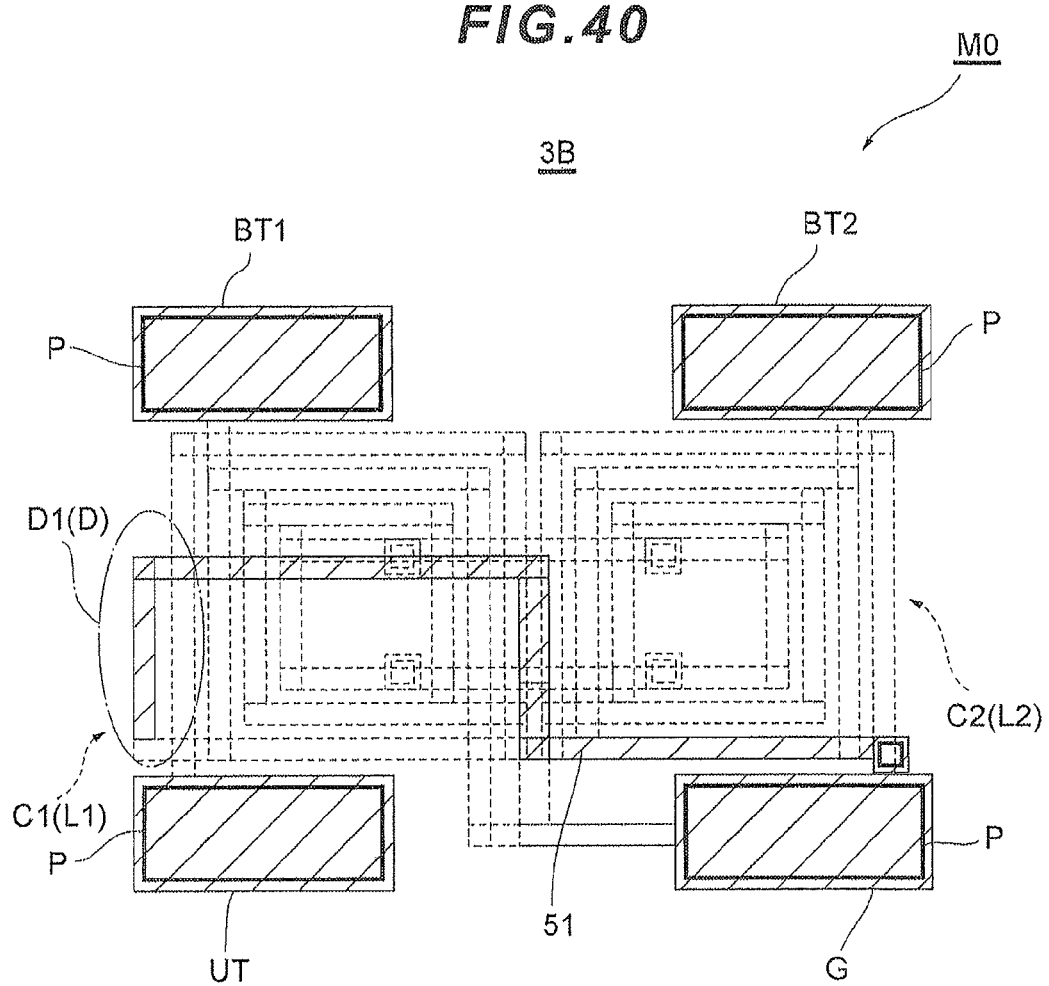
FIG. 40 is a horizontal sectional view showing the wiring layer M0 of the thin film balun 3B.

FIGS. 39 and 40 are horizontal sectional views schematically showing the wiring layers B1 and M0 of a thin film balun 3B of a comparative example 2, respectively. The wiring layers M1 to M3 other than the wiring layers B1 and M0 have the same structures as in the comparative example 1.

As shown in FIG. 39, the electrode D2 of the capacitor D is formed in the wiring layer B1 of the thin film balun 3B, in a region outside the coil portion C1 and near the unbalanced terminal UT in plan view. The electrode D2 is connected to the ground terminal G via the wire 41.

As shown in FIG. 40, the electrode D1 facing the electrode D2 is formed in the wiring layer M0. The electrode D1 is connected to the end 12a of the coil portion C2 in the wiring layer M1, via the wire 51 and a through hole P.

(Characteristic Evaluation)

Figure 41:
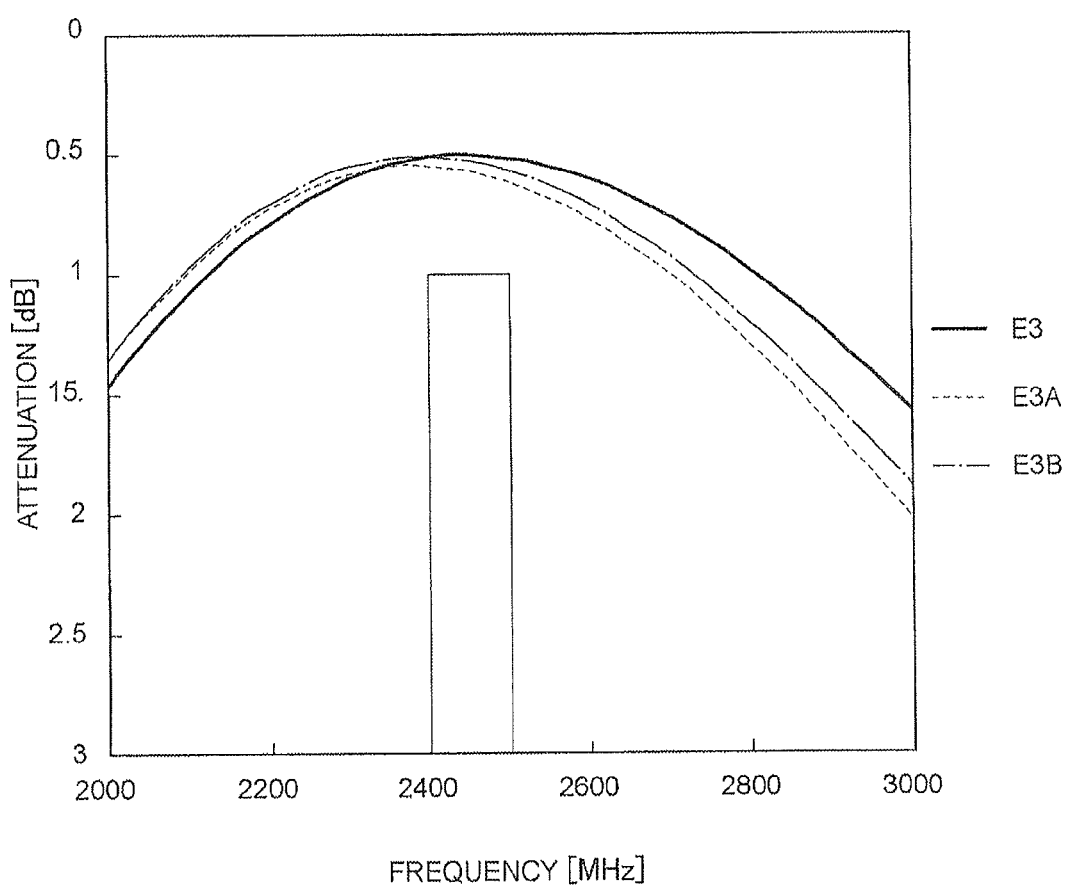
FIG. 41 is a graph showing passage characteristic evaluation results.
Figure 42:
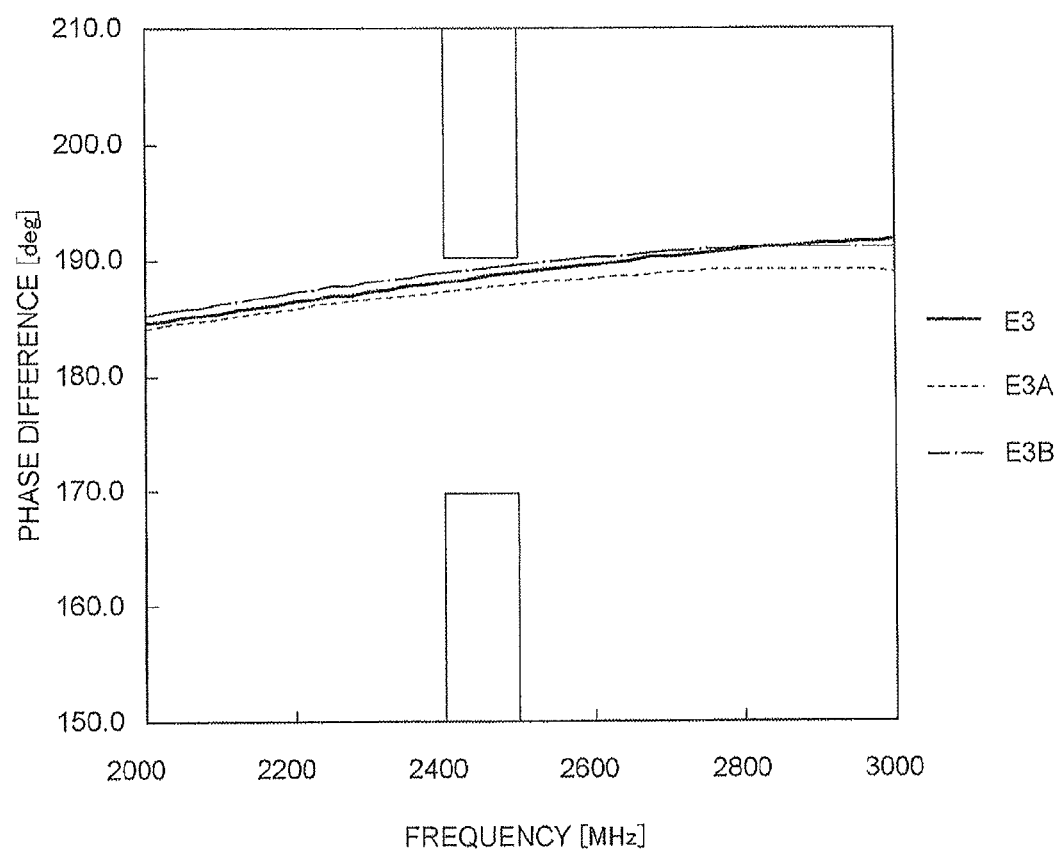
FIG. 42 is a graph showing phase difference evaluation results.
Figure 43:
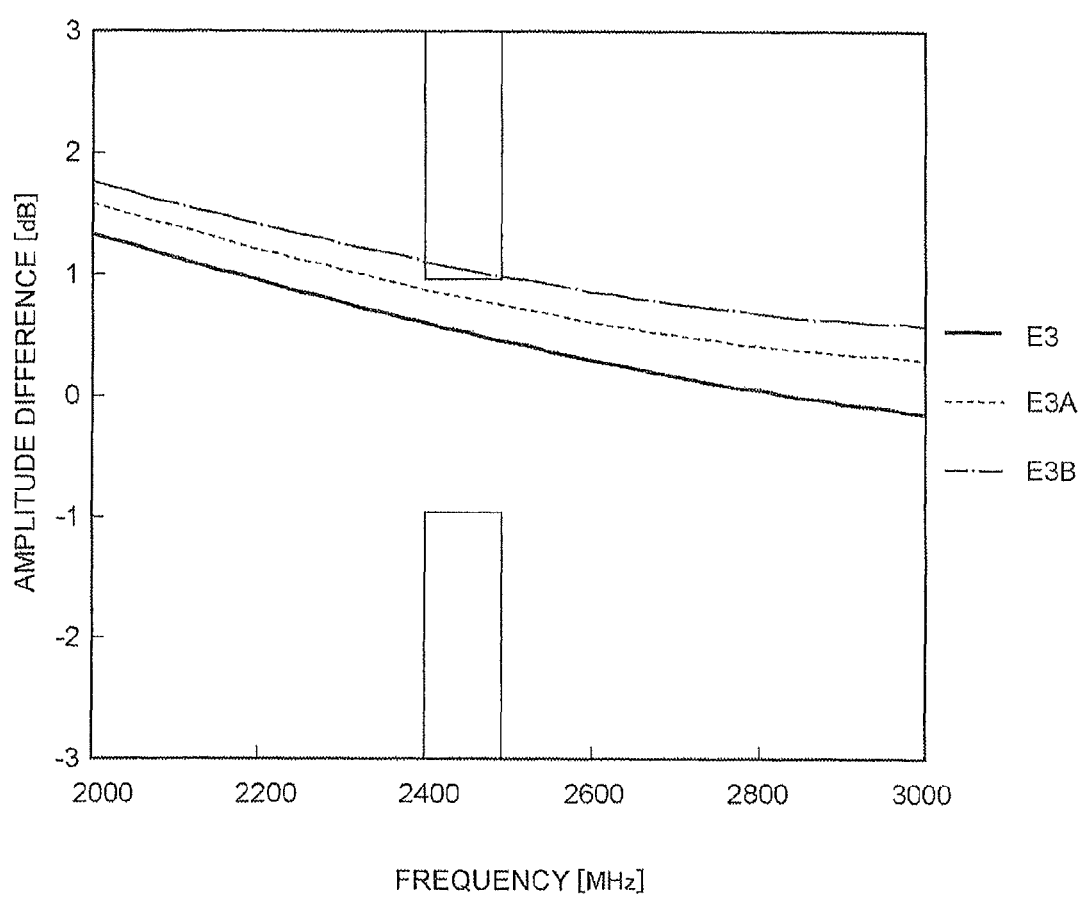
FIG. 43 is a graph showing amplitude difference evaluation results.

Passage characteristics (insertion loss) and balance characteristics (phase difference and amplitude difference of balanced signals) of each of the thin film baluns 3, 3A, and 3B described above were measured by simulation. Evaluation target frequencies (resonant frequencies fr) of a transmission signal were set at 2400 MHz to 2500 MHz. FIG. 41 is a diagram showing passage characteristic evaluation results, FIG. 42 is a diagram showing phase difference evaluation results, and FIG. 43 is a diagram showing amplitude difference evaluation results. In each of FIGS. 41 to 43, curves E3, E3A, and E3B respectively indicate evaluation results of the thin film baluns 3, 3A, and 3B.

The passage characteristics represent with how little loss a signal passes through in an evaluation target frequency domain. 0 dB is ideal passage characteristics in the evaluation target frequency domain. The phase difference is a difference in phase between two balanced signals output from the balanced terminals BT1 and BT2, so that 180 deg is a more ideal phase balance. The amplitude difference is a difference in amplitude between two balanced signals output from the balanced terminals BT1 and BT2, so that 0 dB is a more ideal output balance.

These results demonstrate that the thin film balun in the second embodiment maintains excellent characteristics in both the passage characteristics and the balance characteristics. In particular, the results demonstrate that the thin film balun in the second embodiment exhibits an excellent amplitude balance as compared with the thin film baluns 3A and 3B of the comparative examples.

Comparative Example 3

Figure 44:
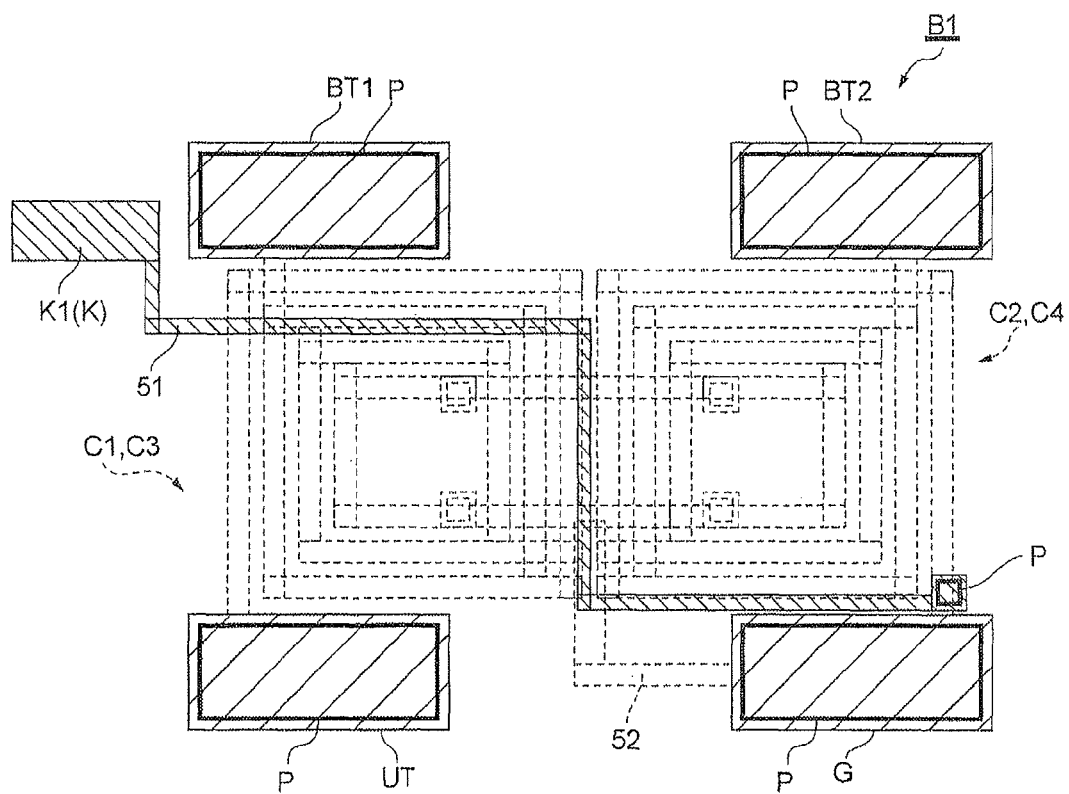
FIG. 44 is a horizontal sectional view showing the wiring layer B1 of a thin film balun of a comparative example.

FIG. 44 is a horizontal sectional view schematically showing the wiring layer B1 of a thin film balun of a comparative example 1 This wiring layer B1 is provided between the insulating substrate 100 and the wiring layer M1. As shown in FIG. 44, in the thin film balun of the comparative example, the electrode K1 of the capacitor K is formed in the wiring layer B1 other than the wiring layer M1 in which the unbalanced transmission line UL is formed. The electrode K1 is positioned outside the range of the region of the coil portion C1. Besides, unlike the second embodiment, the wiring layer M0 (not shown) is provided between the wiring layer B1 and the wiring layer M1, and an opposite electrode K2 (corresponding to the electrode D2 in the second embodiment) of the same shape as the electrode K1 is formed in the wiring layer M0 at a position facing the electrode K1. The electrode K1 is connected to a through hole P near the ground terminal G by the wire 51, and connected to the end 12a of the coil portion C2 in the wiring layer M1 via the through hole P. The opposite electrode formed in the wiring layer M0 is connected to the ground terminal G by the wire 52.

(Characteristic Evaluation)

Figure 45:
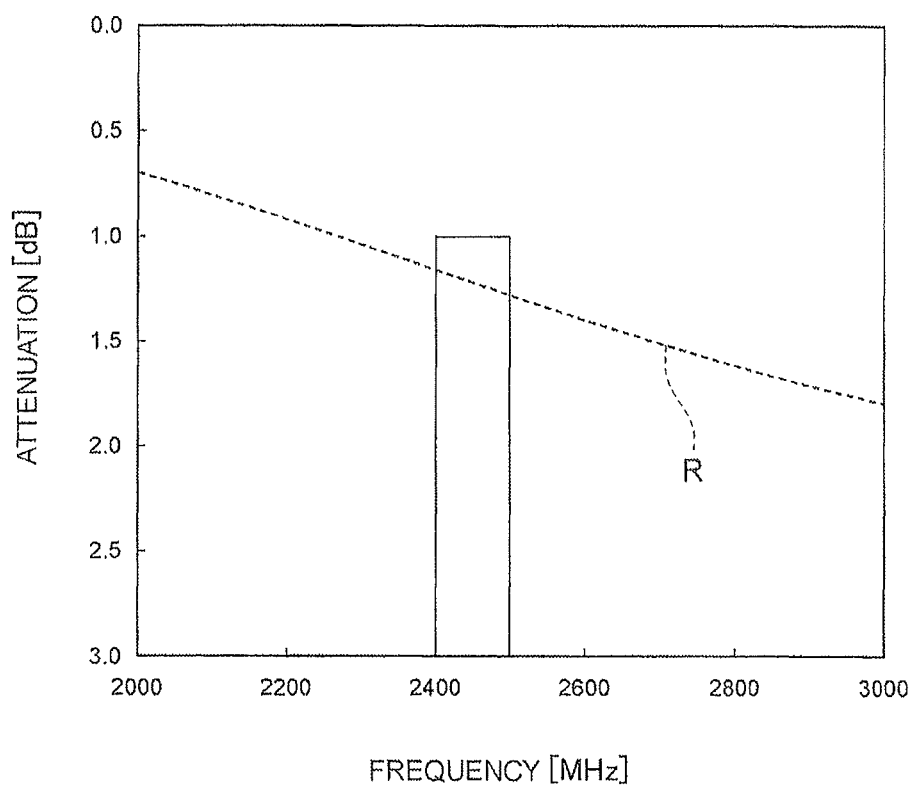
FIG. 45 is a graph showing passage characteristic evaluation results of the thin film balun of the comparative example.

FIG. 45 shows results of evaluating passage characteristics (attenuation characteristics) of a transmission signal by simulation, for the thin film balun of the comparative example 3. In the simulation, evaluation target frequencies (resonant frequencies fr) of the transmission signal were set at 2400 MHz to 2500 MHz. The passage characteristics of the thin film balun were evaluated with desired specifications being less than 1 dB in attenuation in this frequency range.

In FIG. 45, a curve R indicates the evaluation results of the thin film balun of the comparative example 3. The results shown in FIG. 45 demonstrate that the thin film balun of the comparative example 3 has a larger attenuation in the frequency domain of the desired specifications in passage characteristics than the thin film balun in the second embodiment, and fails to satisfy the desired specifications.

Example 3C

Figure 46:
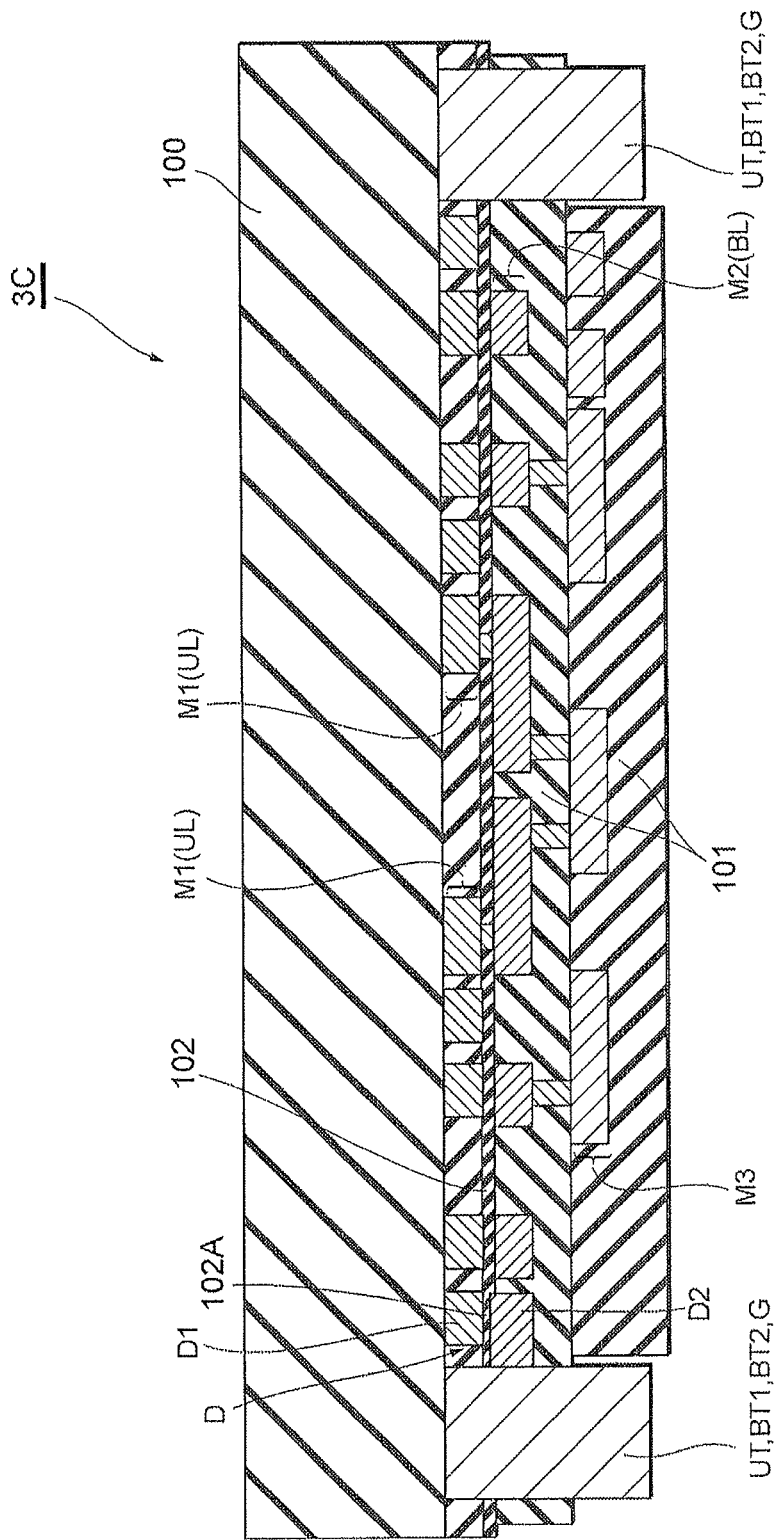
FIG. 46 is a vertical sectional view showing a structure of a thin film balun 3C in the second embodiment of the present invention.

FIG. 46 is a vertical sectional view schematically showing a wiring structure of a thin film balun 3C of an example 3C. As shown in FIG. 46, the wiring layers M1, M2, and M3 are formed in this order on the insulating substrate 100 of alumina or the like. The wiring layers M1, M2, and M3 have the same structures as in the second embodiment. Dielectric layers 102 and 102A made of, for example, silicon nitride are formed between the wiring layers M1 and M2. As shown in FIG. 46, in the thin film balun 3C of the example 3C, the dielectric layer 102A in a part where the capacitance coupling of the capacitor D is formed has a smaller film thickness than the dielectric layer 102 in a part where the magnetic coupling between the unbalanced transmission line UL and the balanced transmission line BL is formed.

According to this structure, it is possible to form the capacitor D having the dielectric layer 102A of a film thickness different from a film thickness required for the magnetic coupling between the unbalanced transmission line UL and the balanced transmission line BL. This allows a desired capacitance C to be introduced in the resonant circuit of the thin film balun, thereby suppressing an increase in resonant frequency.

As noted earlier, the present invention is not limited to the above examples, and various changes can be made without departing from the scope of the present invention. For example, instead of extending the outer peripheral end of the coil portion C2, a part of the outer periphery of the coil portion C2 may be used as the electrode D1 of the capacitor. Moreover, the arrangement of the unbalanced terminal UT, the balanced terminals BT1 and BT2, and the ground terminal G is not limited to the positions shown in the drawings. Besides, the wiring layers on the insulating substrate 100 may be reversed in order. Furthermore, various coil arrangements may be employed without departing from the scope of the present invention.

According to the thin film balun in the second embodiment of the present invention, the C component connected to the second line portion is provided between the first layer including the unbalanced transmission line and the second layer including the balanced transmission line, so that the thin film balun can be made smaller and thinner while maintaining required balun characteristics. Such a thin film balun is widely applicable, in particular to wireless communication devices, apparatuses, modules, and systems which are required to be smaller and thinner, facilities including them, and manufacturing thereof.

Third Embodiment

Figure 47:
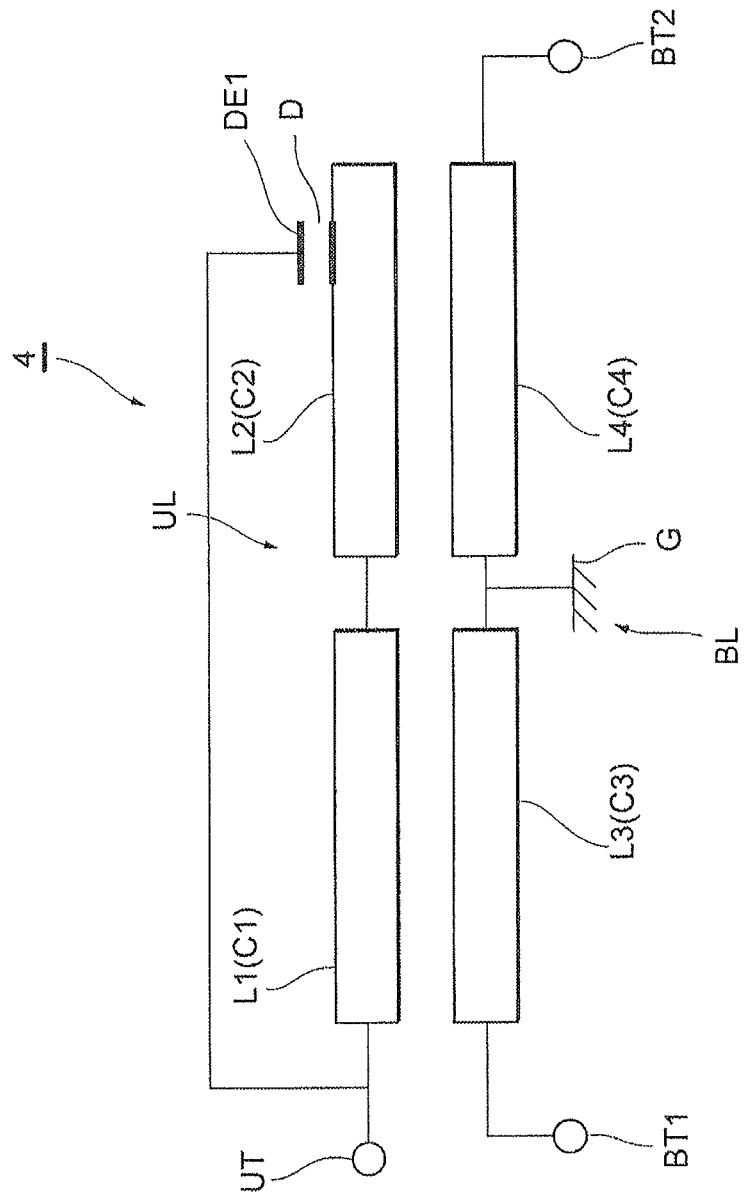
FIG. 47 is an equivalent circuit diagram showing a structure of a thin film balun 4 in a third embodiment of the present invention.

A thin film balun in a third embodiment corresponding to the third aspect of the present invention is described below. FIG. 47 is an equivalent circuit diagram showing a structure of the thin film balun in the third embodiment of the present invention. A thin film balun 4 includes the unbalanced transmission line (unbalanced circuit) UL in which the line portion L1 (first line portion) and the line portion L2 (second line portion) are connected in series, and the balanced transmission line (balanced circuit) BL in which the line portion L3 (third line portion) and the line portion L4 (fourth line portion) are connected in series. The line portions L1 and L3 form electromagnetic coupling, and the line portions L2 and L4 form electromagnetic coupling.

In the thin film balun 4, the end of the line portion L1 other than the end connected to the line portion L2 is connected to the unbalanced terminal UT. The end of the line portion L2 other than the end connected to the line portion L1 is an open end, and a part of the line portion L2 except the open end is connected to the unbalanced terminal UT via a capacitor D1. On the other hand, the end of the line portion L3 other than the end connected to the line portion L4 is connected to the balanced terminal BT1, and the end of the line portion L4 other than the end connected to the line portion L3 is connected to the balanced terminal BT2. Moreover, the connected ends of the line portions L3 and L4 are connected to the ground terminal G.

Lengths of the above-mentioned line portions L1 to L4 vary depending on specifications of the thin film balun 4. For example, the lengths may be set so as to form a quarter-wavelength ($\lambda/4$) resonator circuit of a transmission signal which is subject to conversion. Moreover, the line portions L1 to L4 may be arbitrarily shaped so long as the above-mentioned electromagnetic coupling is formed. Example shapes include a spiral (coil form), a zigzag, a straight line, and a curved line.

A basic operation of the thin film balun 4 is described below, with reference to FIG. 47. When an unbalanced signal is input to the unbalanced terminal UT, the unbalanced signal propagates through the line portions L1 and L2. By the electromagnetic coupling (first electromagnetic coupling) of the line portions L1 and L3 and the electromagnetic coupling (second electromagnetic coupling) of the line portions L2 and L4, the input unbalanced signal is converted to two balanced signals that have the same frequency as the unbalanced signal and differ in phase by 180° ($\pi$), and the two balanced signals are output from the balanced terminals BT1 and BT2. On the other hand, when two balanced signals of the same magnitude that have a predetermined frequency and differ in phase by 180° are input to the balanced terminals BT1 and BT2, an unbalanced signal of the same frequency as the balanced signals is output from the unbalanced terminal UT.

Figure 48:
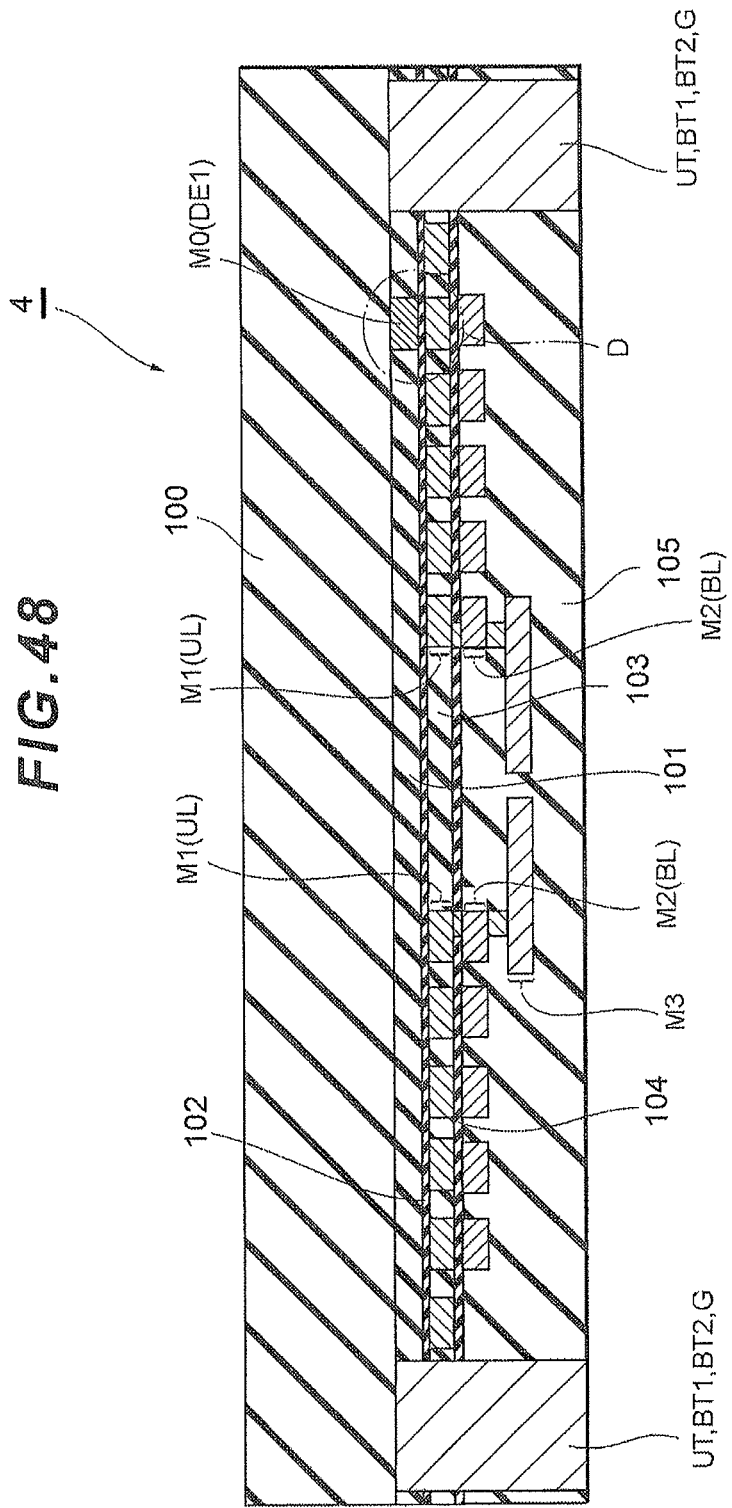
FIG. 48 is a vertical sectional view showing the structure of the thin film balun 4.

A wiring structure of the thin film balun in the third embodiment is described below. FIG. 48 is a vertical sectional view schematically showing the wiring structure of the thin film balun 4. As shown in FIG. 48, the wiring layers M0, M1, M2, and M3 are formed in this order on the insulating substrate 100 of alumina or the like. For instance, a capacitor electrode DE1 is formed by the wiring layer M0, the unbalanced transmission line UL is formed by the wiring layer M1, the balanced transmission line BL is formed by the wiring layer M2, and the connection wires for connecting the line portions in the balanced transmission line BL and the unbalanced transmission line UL are formed by the wiring layer M3. Dielectric layers 101 to 105 are formed between wires in the same wiring layer and between different wiring layers. For example, silicon nitride is used as the dielectric layer 102 between the wiring layers M0 and M1 where the capacitor D is formed, and the dielectric layer 104 between the wiring layers M1 and M2 where the electromagnetic coupling between the unbalanced transmission line UL and the balanced transmission line BL is formed. For example, alumina is used as the dielectric layers 101 and 103 covering the wiring layers M0 and M1. For example, polyimide is used as the dielectric layer 105 covering the wiring layers M2 and M3. Note that the materials of these layers are not limited to the above, and not only inorganic insulators such as silicon nitride, alumina, and silica but also organic insulators such as polyimide and epoxy resin may be selected according to need. The unbalanced terminal UT, the balanced terminals BT1 and BT2, and the ground terminal G are formed through all dielectric layers. Thus, the thin film balun 4 is composed of a thin film multilayer structure formed on the insulating substrate 100.

As shown in FIG. 48, in the third embodiment, the above-mentioned capacitor D is formed between the wiring layer M1 including the unbalanced transmission line UL and the wiring layer M0 facing the wiring layer M1 via the dielectric layer 102 and including the capacitor electrode DE1.

A pattern of each of the wiring layers M0, M1, M2, and M3 of the thin film balun in the third embodiment is described in detail below. Coil portions are used as the line portions L1 to L4 in each of the following examples.

Example 1A

FIGS. 49 to 52 are each a horizontal sectional view schematically showing a different one of the wiring layers of a thin film balun 4A of an example 1A. As shown in FIGS. 49 to 52, the unbalanced terminal UT, the balanced terminals BT1 and BT2, and the ground terminal G are formed in all of the wiring layers M0 to M3. Each of the terminals UT, BT1, BT2, and G is electrically connected between different layers via a through hole P. Note that all through holes P shown in FIGS. 49 to 52 are plated with a metal conductor for electrical conduction of upper and lower layers. A structure of each wiring layer is described in detail below.

Figure 49:
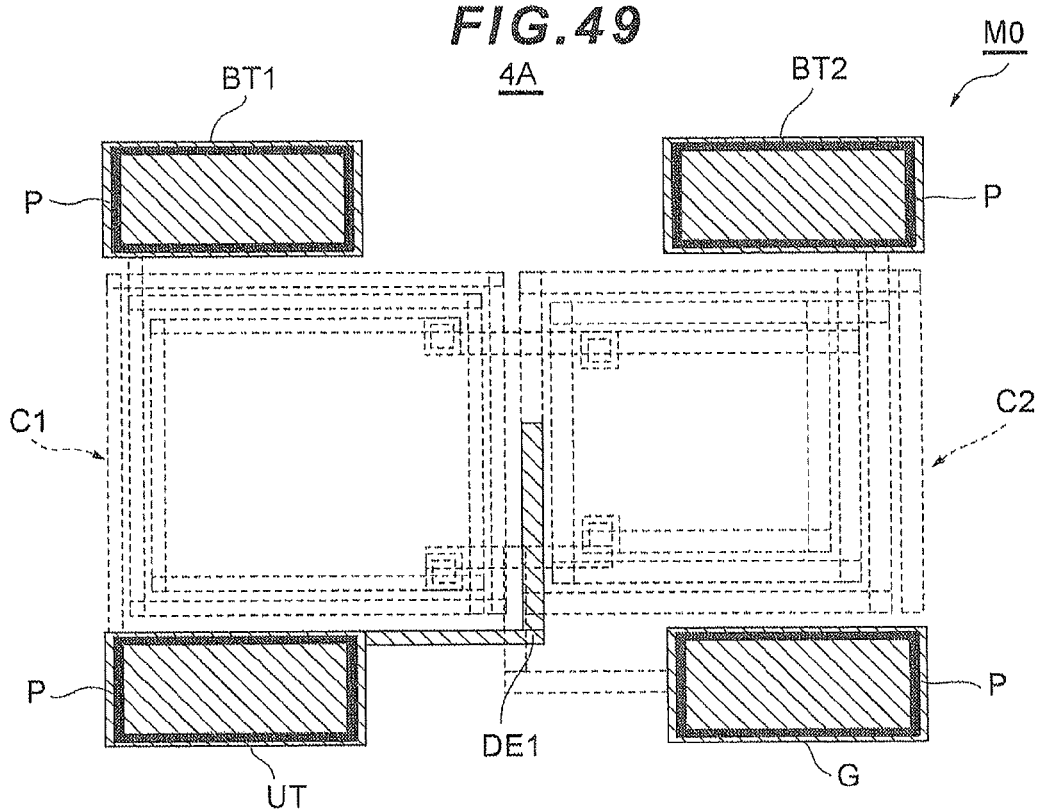
FIG. 49 is a horizontal sectional view showing the wiring layer M0 of a thin film balun 4A.

As shown in FIG. 49, the capacitor electrode DE1 of the capacitor D1 is formed in the wiring layer M0 on the insulating substrate 100, at a position facing a part of the coil portion C2 in the wiring layer M1. The capacitor electrode DE1 is connected to the unbalanced terminal UT. The capacitor electrode DE1 of the capacitor D1 is positioned so as to face the coil conductor 12 of the first line from the left of the coil portion C2 in plan view.

Figure 50:
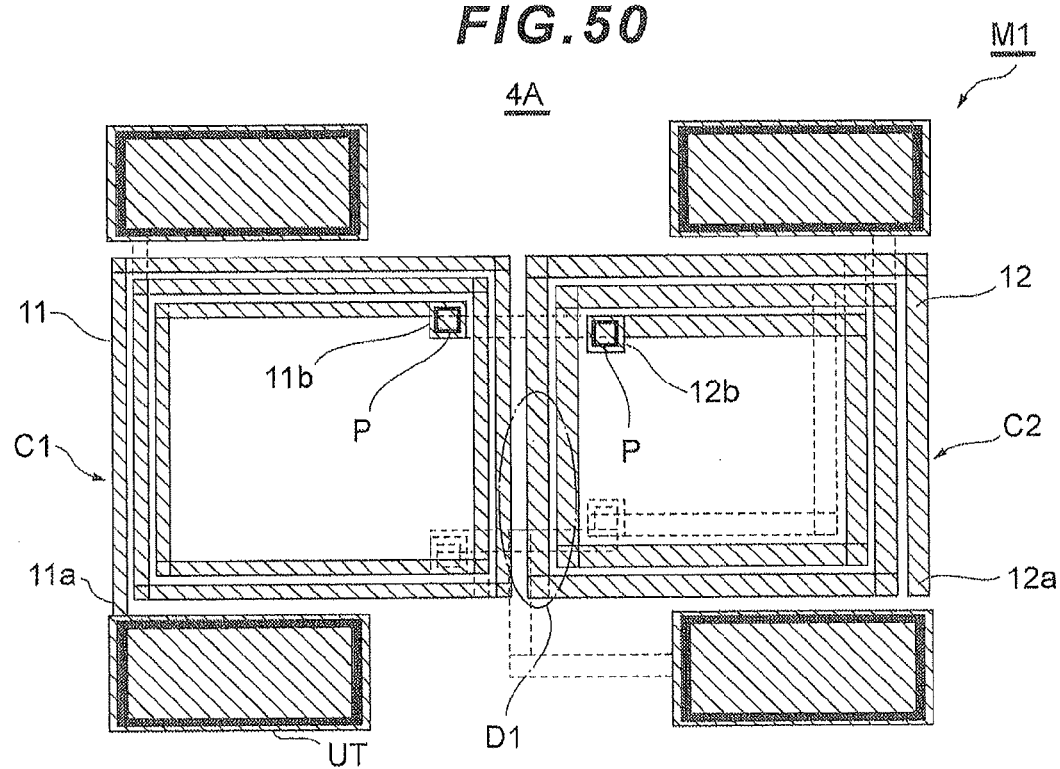
FIG. 50 is a horizontal sectional view showing the wiring layer M1 of the thin film balun 4A.

As shown in FIG. 50, the coil portion C1 (first line portion) and the coil portion C2 (second line portion) that constitute the unbalanced transmission line UL are formed adjacent to each other in the wiring layer M1. Each of the coil portions C1 and C2 forms an equivalent of a quarter-wavelength (λ/4) resonator. The outer end 11a of the coil conductor 11 constituting the coil portion C1 is connected to the unbalanced terminal UT, and the inner end 11b of the coil conductor 11 is connected to a through hole P. The inner end 12b of the coil conductor 12 constituting the coil portion C2 is connected to a through hole P, and the outer end 12a (open end) of the coil conductor 12 is open. A part of the coil conductor 12 except the outer end 12a serves as a capacitor electrode of the capacitor D1, and faces the capacitor electrode DE1 in the wiring layer M0. Moreover, the coil conductor 12 constituting the coil portion C2 has a larger width than the coil conductor 11 constituting the coil portion C1, as shown in FIG. 50. As a result of conducting intense study, the present inventor has found that, in the case of inserting the capacitor D1 so that a part of the coil portion C2 serves as an electrode of the capacitor, excellent passage characteristics and balance characteristics can be obtained by forming the coil conductor 12 wider than the coil conductor 11. Note, however, that there is no limitation on the widths and the numbers of turns of the coil conductors 12 and 11, and the widths and the numbers of turns of the coil conductors 12 and 11 may be equal or different.

Figure 51:
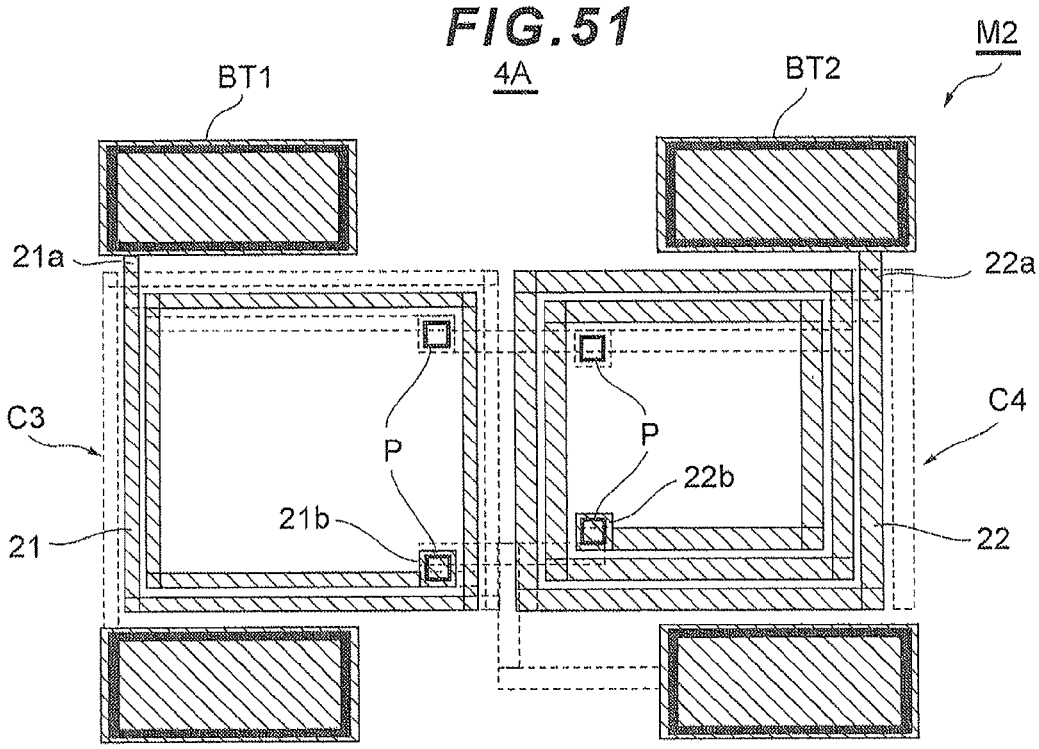
FIG. 51 is a horizontal sectional view showing the wiring layer M2 of the thin film balun 4A.

As shown in FIG. 51, the coil portion C3 (third line portion) and the coil portion C4 (fourth line portion) that constitute the balanced transmission line BL are formed adjacent to each other in the wiring layer M2. Each of the coil portions C3 and C4 forms an equivalent of a quarter-wavelength (λ/4) resonator, as with the coil portions C1 and C2. The coil portions C3 and C4 of the balanced transmission line BL are positioned facing the coil portions C1 and C2 of the unbalanced transmission line UL respectively, and the facing portions are electromagnetically coupled to form couplers. The outer end 21a of the coil conductor 21 constituting the coil portion C3 is connected to the balanced terminal BT1, and the inner end 21b of the coil conductor 21 is connected to a through hole P. The outer end 22a of the coil conductor 22 constituting the coil portion C4 is connected to the balanced terminal BT2, and the inner end 22b of the coil conductor 22 is connected to a through hole P. Moreover, the coil conductor 22 has a larger width than the coil conductor 21 and a larger number of turns than the coil conductor 21, as shown in FIG. 51. As mentioned above, as a result of conducting intense study, the present inventor has found that, in the case of inserting the capacitor D1 so that a part of the coil portion C2 serves as an electrode of the capacitor, excellent passage characteristics and balance characteristics can be obtained by setting the widths and the numbers of turns of the coil conductors 21 and 22 in the above way. Note, however, that there is no limitation on the widths and the numbers of turns of the coil conductors 22 and 21, and the widths and the numbers of turns of the coil conductors 22 and 21 may be equal or different.

Figure 52:
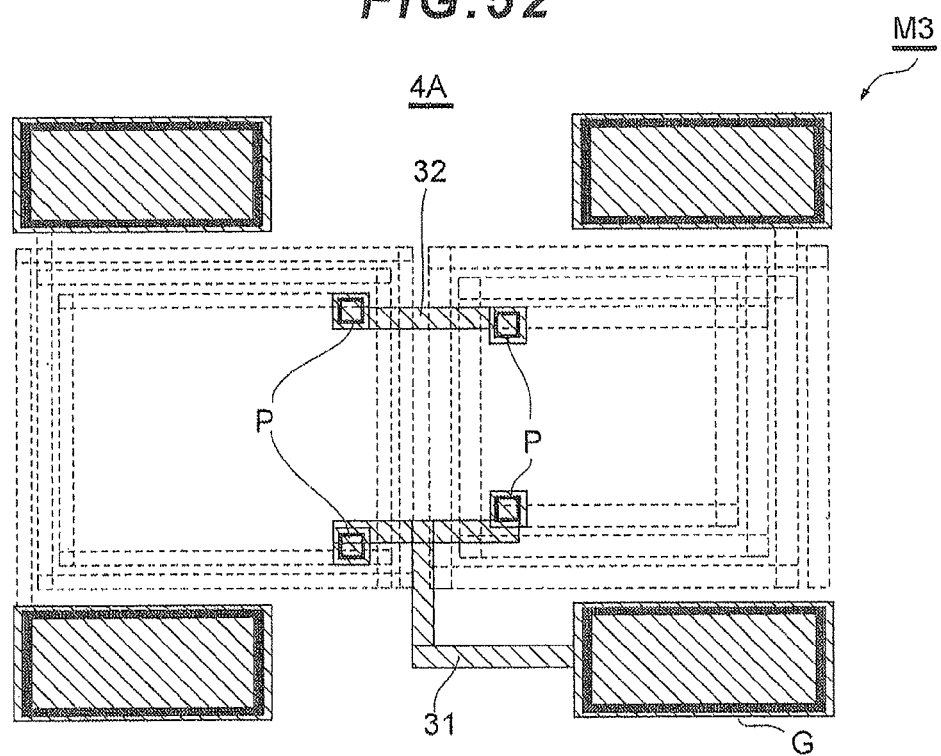
FIG. 52 is a horizontal sectional view showing the wiring layer M3 of the thin film balun 4A.

As shown in FIG. 52, the wire 31 for connecting the coil portions C3 and C4 to the ground terminal G and the wire 32 for connecting the coil portions C1 and C2 are formed in the wiring layer M3. The wire 31 is a branch wire formed so as to connect two through holes P to the ground terminal G. The wire 31 is connected to the end 21b of the coil conductor 21 and the end 22b of the coil conductor 22 formed in the wiring layer M2, via the two through holes P. The wire 32 is connected to the end 11b of the coil conductor 11 and the end 12b of the coil conductor 12 formed in the wiring layer M1, via through holes P.

Thus, in the example 1A, the thin film balun 4A forming the equivalent circuit shown in FIG. 47 is obtained by a multilayer wiring structure in which the two coil portions C1 and C2 constituting the unbalanced transmission line are formed in the wiring layer M1 which is one layer, the two coil portions C3 and C4 constituting the balanced transmission line are formed in the wiring layer M2 which is another layer adjacent to the wiring layer M1, the wire 32 connecting the coil portions C1 and C2 and the wire 31 connecting the coil portions C3 and C4 are formed in the wiring layer M3 which is another layer adjacent to the wiring layer M2 on an opposite side to the wiring layer M1, and the capacitor electrode DE1 facing the part of the coil conductor 12 in the coil portion C2 to form the capacitor D1 is formed in the wiring layer M0 which is another layer adjacent to the wiring layer M1 on an opposite side to the wiring layer M2.

Example 1B

Figure 53:
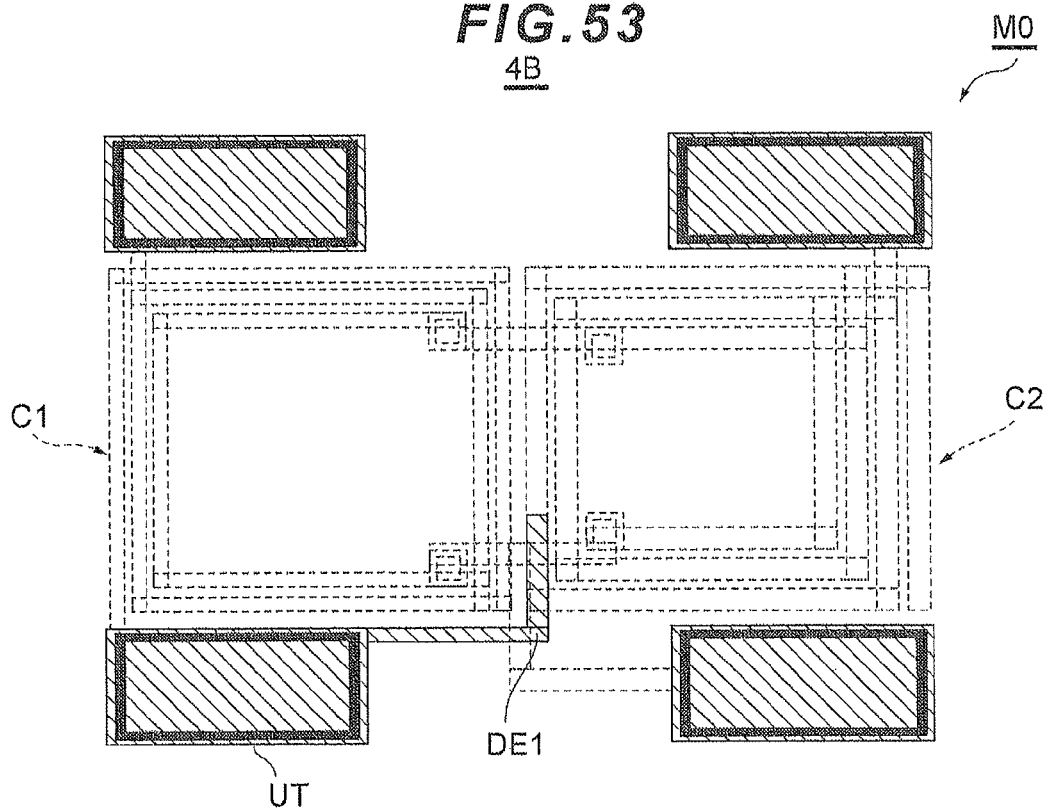
FIG. 53 is a horizontal sectional view showing the wiring layer M0 of a thin film balun 4B.

FIG. 53 is a horizontal sectional view schematically showing the wiring layer M0 of a thin film balun 4B of an example 1B. Structures other than the wiring layer M0 are the same as those in the example 1A. In the thin film balun 4B shown in FIG. 53, the length of the capacitor electrode DE1 (the length of the part that substantially serves as a capacitor electrode) is half the length in the example 1A. Thus, in the thin film balun of the example 1B, the capacitance introduced in the resonant circuit of the thin film balun is set to half the capacitance in the example 1A.

(Characteristic Evaluation)

Figure 54:
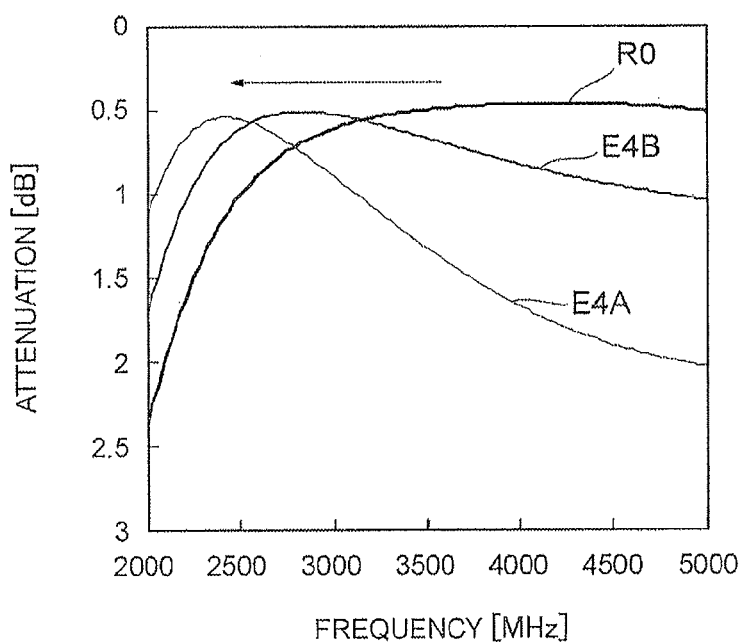
FIG. 54 is a graph showing passage characteristic evaluation results.

Passage characteristics (insertion loss) of each of the thin film baluns 4A and 4B described above were measured by simulation. Evaluation target frequencies (resonant frequencies fr) of a transmission signal were set at 2400 MHz to 2500 MHz. FIG. 54 is a diagram showing passage characteristic evaluation results. In FIG. 54, curves E4A and E4B respectively indicate evaluation results of the thin film baluns 4A and 4B. Meanwhile, a curve RO in FIG. 54 indicates evaluation results of a thin film balun of a comparative example that does not include the capacitor electrode DE1. The passage characteristics represent with how little loss a signal passes through in an evaluation target frequency domain. 0 dB is ideal passage characteristics in the evaluation target frequency domain.

The results shown in FIG. 54 demonstrate that the thin film baluns 4A and 4B of the examples that include the capacitor D1 have the resonant frequency shifted toward lower frequencies, as compared with the balun of the comparative example that does not include the capacitor. The results further demonstrate that the amount of shift is influenced by the capacitance of the introduced capacitor D1.

Example 1C

Figure 55:
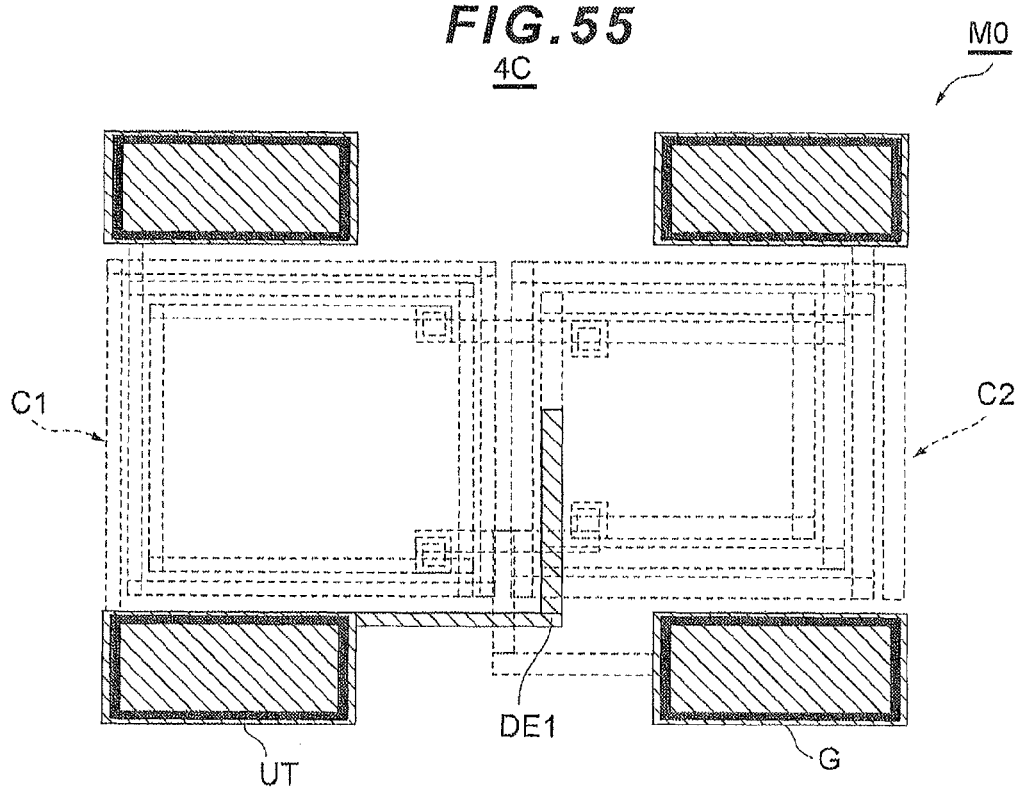
FIG. 55 is a horizontal sectional view showing the wiring layer M0 of a thin film balun 4C.

FIG. 55 is a horizontal sectional view schematically showing the wiring layer M0 of a thin film balun 4C of an example 1C. Structures other than the wiring layer M0 are the same as those in the example 1A. In the thin film balun 4C shown in FIG. 55, the capacitor electrode DE1 is positioned extending vertically so as to face the coil conductor 12 of the second line from the left of the coil portion C2 in plan view. The area of the capacitor electrode DE1 in the part facing the coil portion C2 (the area that substantially serves as a capacitor electrode) is set to be the same as in the example 1A.

Example 1D

Figure 56:
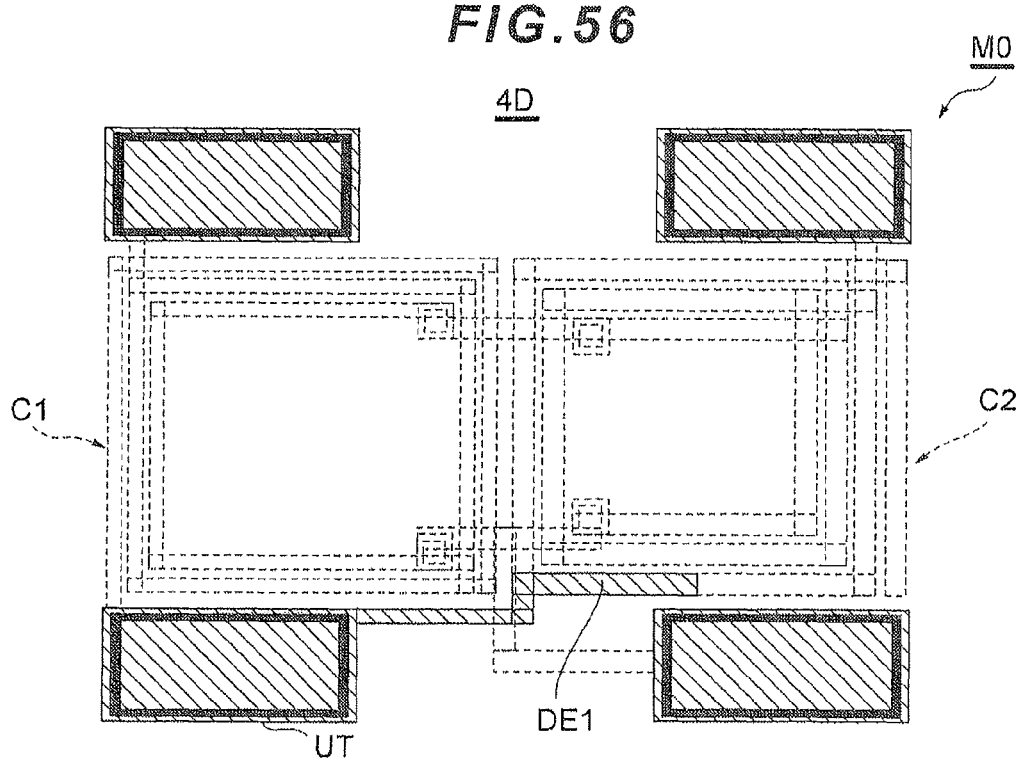
FIG. 56 is a horizontal sectional view showing the wiring layer M0 of a thin film balun 4D.

FIG. 56 is a horizontal sectional view schematically showing the wiring layer M0 of a thin film balun 4D of an example 1D. Structures other than the wiring layer M0 are the same as those in the example 1A. In the thin film balun 4D shown in FIG. 56, the capacitor electrode DE1 is positioned extending horizontally so as to face the coil conductor 12 of the first line from the bottom of the coil portion C2 in plan view. The area of the capacitor electrode DE1 in the part facing the coil portion C2 (the area that substantially serves as a capacitor electrode) is set to be the same as in the example 1A.

Example 1E

Figure 57:
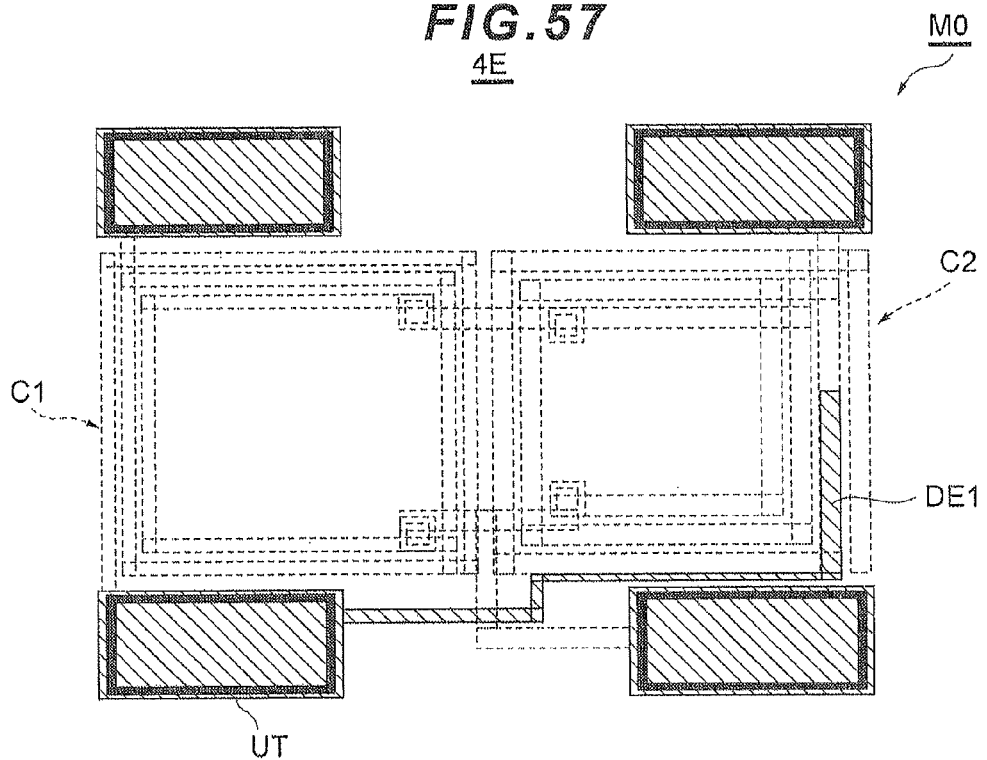
FIG. 57 is a horizontal sectional view showing the wiring layer M0 of a thin film balun 4E.

FIG. 57 is a horizontal sectional view schematically showing the wiring layer M0 of a thin film balun 4E of an example 1E. Structures other than the wiring layer M0 are the same as those in the example 1A. In the thin film balun 4E shown in FIG. 57, the capacitor electrode DE1 is positioned extending vertically so as to face the coil conductor 12 of the second line from the right of the coil portion C2 in plan view. The area of the capacitor electrode DE1 in the part facing the coil portion C2 (the area that substantially serves as a capacitor electrode) is set to be the same as in the example 1A.

Example 1F

Figure 58:
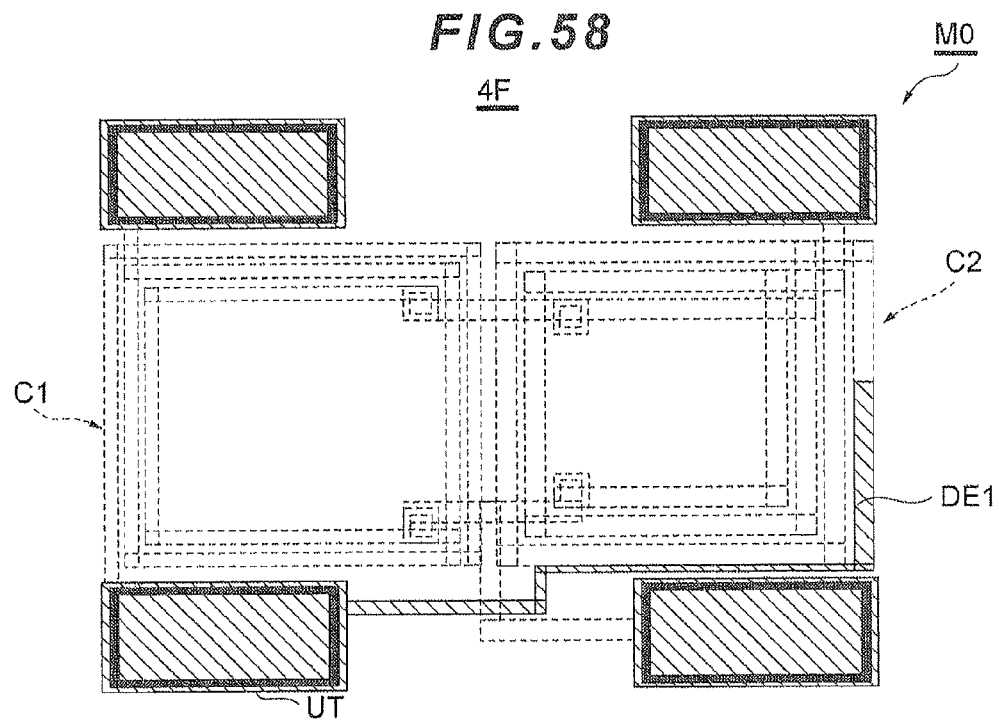
FIG. 58 is a horizontal sectional view showing the wiring layer M0 of a thin film balun 4F.

FIG. 58 is a horizontal sectional view schematically showing the wiring layer M0 of a thin film balun 4F of an example 1F. Structures other than the wiring layer M0 are the same as those in the example 1A. In the thin film balun 4F shown in FIG. 58, the capacitor electrode DE1 is positioned extending vertically so as to face the open end of the coil conductor 12 constituting the coil portion C2 in plan view. The area of the capacitor electrode DE1 in the part facing the coil portion C2 (the area that substantially serves as a capacitor electrode) is set to be the same as in the example 1A.

(Characteristic Evaluation)

Figure 59:
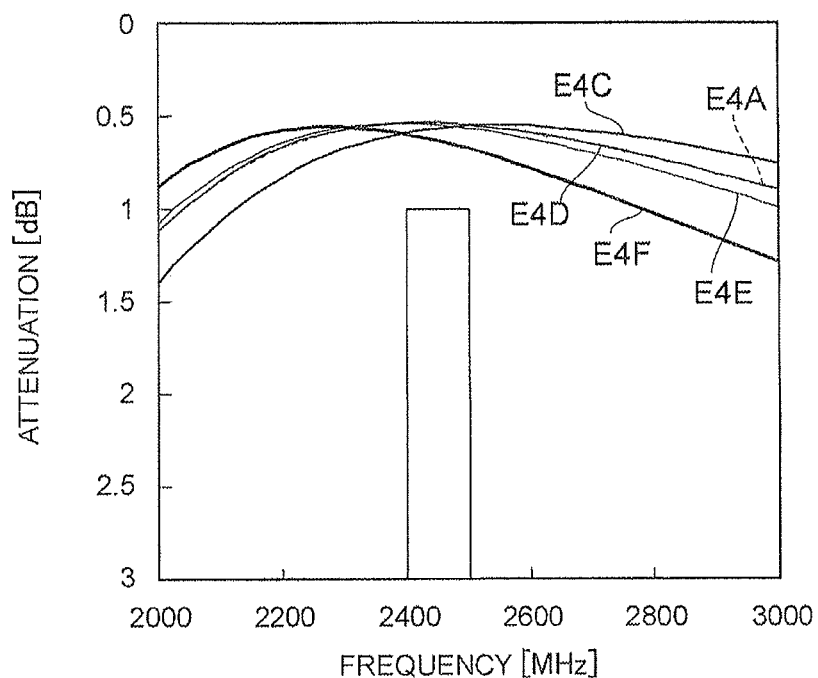
FIG. 59 is a graph showing passage characteristic evaluation results.
Figure 60:
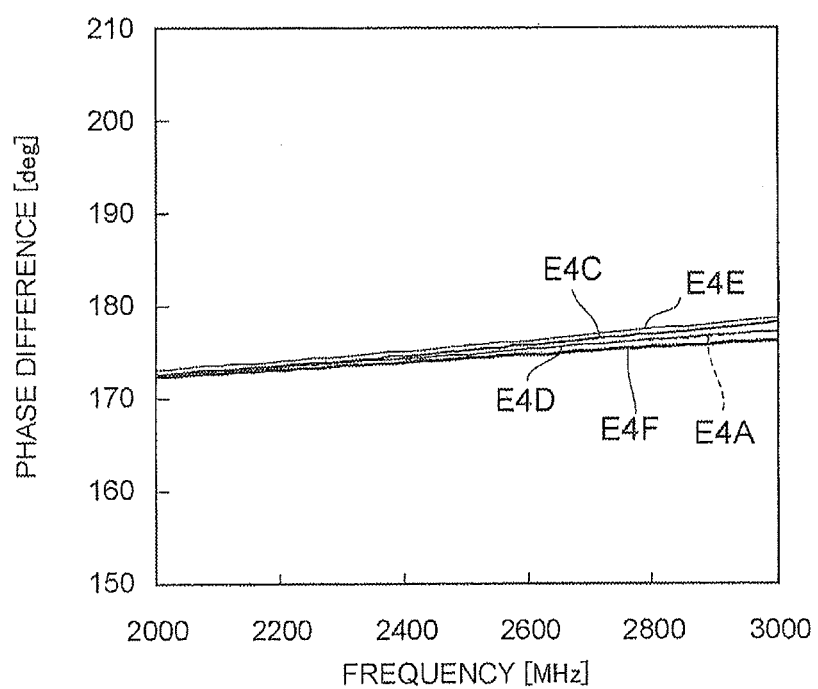
FIG. 60 is a graph showing phase difference evaluation results.
Figure 61:
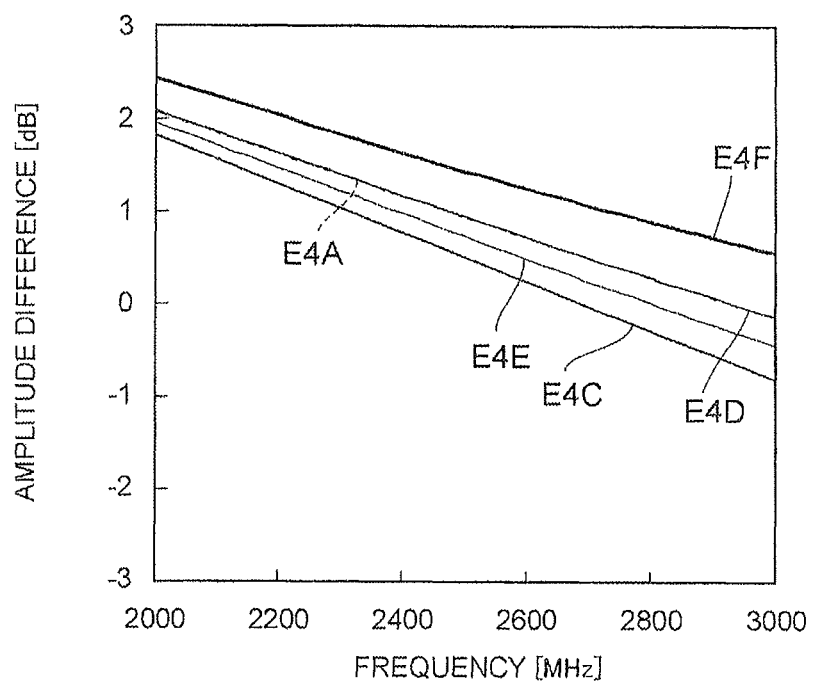
FIG. 61 is a graph showing amplitude difference evaluation results.

Passage characteristics (insertion loss) and balance characteristics (phase difference and amplitude difference of balanced signals) of each of the thin film baluns 4C to 4F described above were measured by simulation. Evaluation target frequencies (resonant frequencies fr) of a transmission signal were set at 2400 MHz to 2500 MHz. FIG. 59 is a diagram showing passage characteristic evaluation results, FIG. 60 is a diagram showing phase difference evaluation results, and FIG. 61 is a diagram showing amplitude difference evaluation results. In each of FIGS. 59 to 61, curves E4A and E4C to E4F respectively indicate evaluation results of the thin film baluns 4A and 4C to 4F.

The phase difference is a difference in phase between two balanced signals output from the balanced terminals BT1 and BT2, so that 180 deg is a more ideal phase balance. The amplitude difference is a difference in amplitude between two balanced signals output from the balanced terminals BT1 and BT2, so that 0 dB is a more ideal output balance.

These results demonstrate that the thin film baluns 4A and 4C to 4F of the examples maintain excellent characteristics in both the passage characteristics and the balance characteristics. The results also demonstrate that, of the examples, the thin film baluns 4A and 4C to 4E in which the capacitor electrode DE1 faces a part of the coil conductor 12 other than the open end exhibit excellent balance characteristics as compared with the thin film balun 4F in which the capacitor electrode DE1 faces the open end of the coil portion C2.

Example 2

Figure 62:
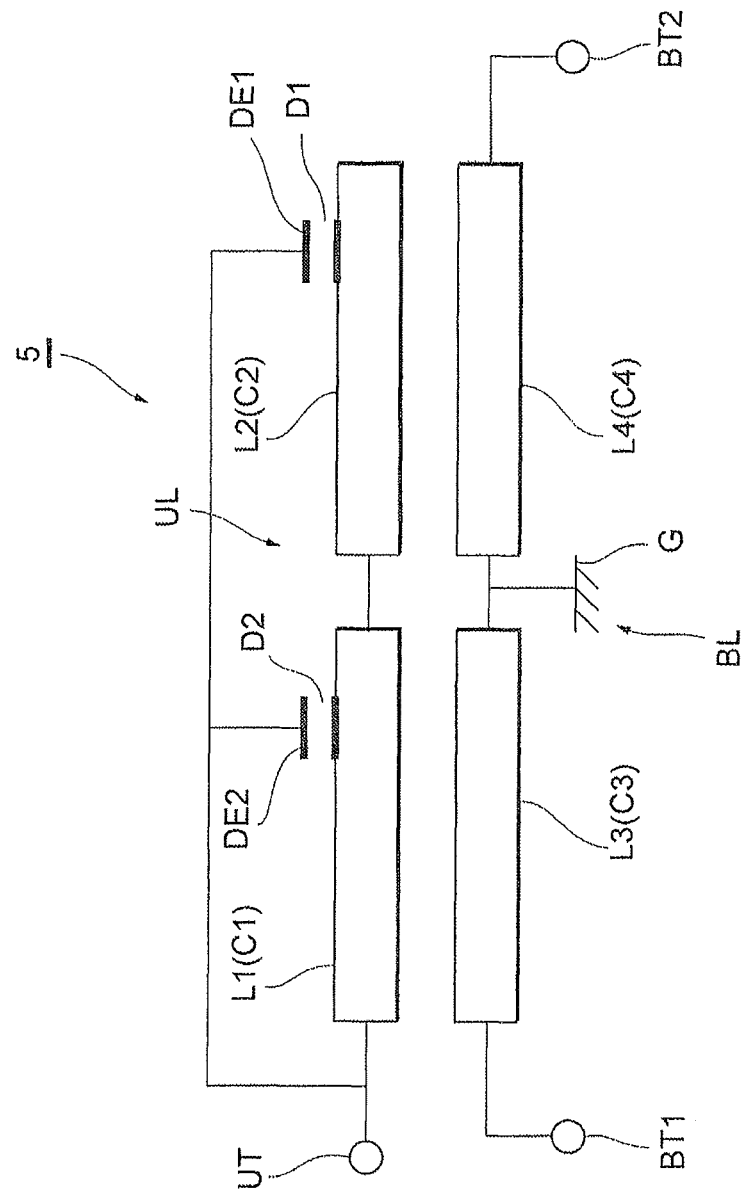
FIG. 62 is an equivalent circuit diagram showing a structure of a thin film balun 5 in the third embodiment of the present invention.

FIG. 62 is an equivalent circuit diagram showing a structure of a thin film balun of an example 2 in the third embodiment of the present invention. In a thin film balun 5 of the example 2, not only the capacitor D1 is introduced between the unbalanced terminal UT and the line portion L2, but also a capacitor D2 is introduced between the unbalanced terminal UT and the line portion L1.

Example 2A

Figure 63:
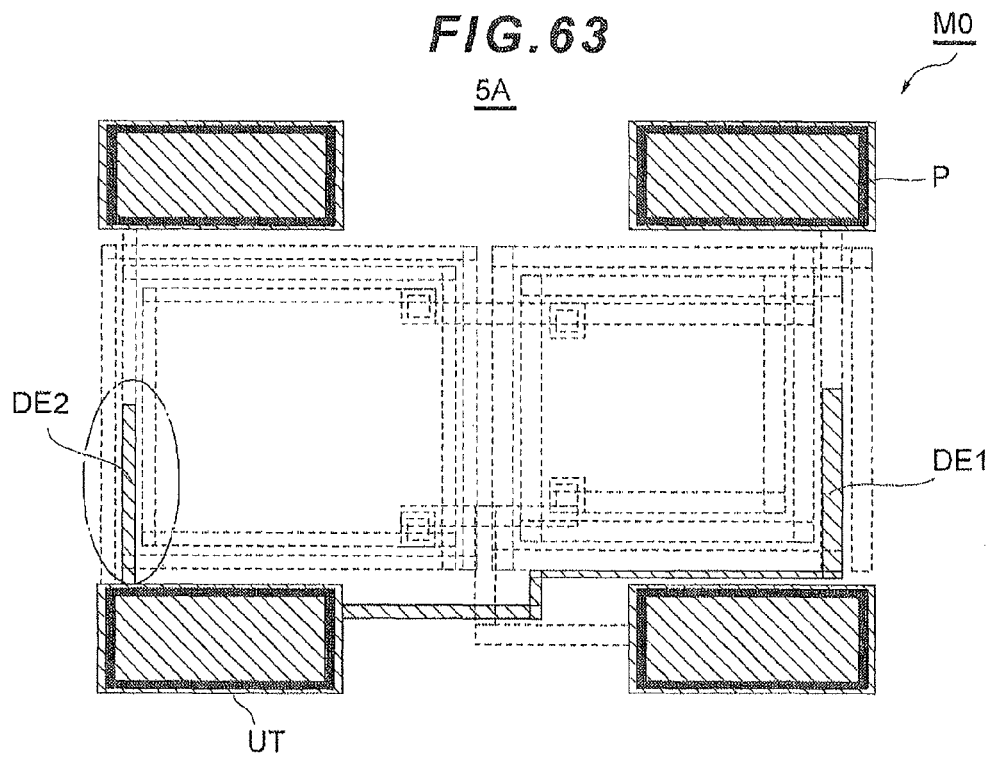
FIG. 63 is a horizontal sectional view showing the wiring layer M0 of a thin film balun 5A.

A pattern of the wiring layer M0 in the example 2 of the thin film balun having the circuit structure shown in FIG. 62 is described in detail below. FIG. 63 is a horizontal sectional view schematically showing the wiring layer M0 of a thin film balun 5A of an example 2A according to the present invention. Structures other than the wiring layer M0 are the same as those in the example 1A. In the thin film balun 5A shown in FIG. 63, two capacitor electrodes DE1 and DE2 connected to the unbalanced terminal UT are formed in the wiring layer M0. The capacitor electrode DE1 is positioned in the same way as in the example 1E. The capacitor electrode DE2 is positioned extending vertically so as to face the coil conductor 11 of the second line from the left of the coil portion C1 in plan view.

Example 2B

Figure 64:
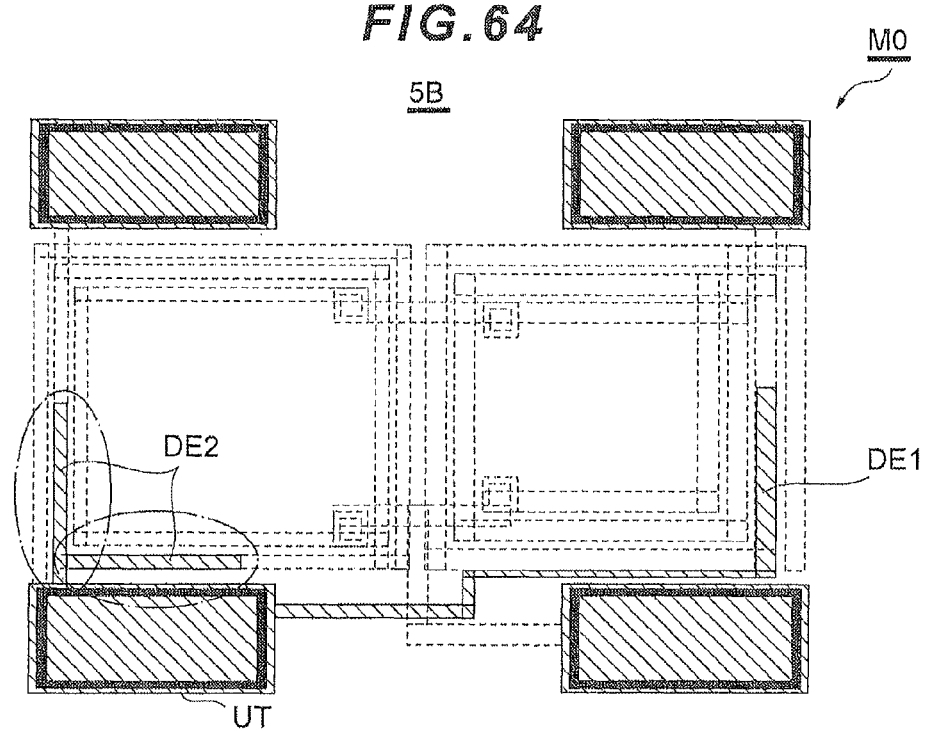
FIG. 64 is a horizontal sectional view showing the wiring layer M0 of a thin film balun 5B.

FIG. 64 is a horizontal sectional view schematically showing the wiring layer M0 of a thin film balun 5B of an example 2B. Structures other than the wiring layer M0 are the same as those in the example 1A. In the thin film balun 5B shown in FIG. 64, the two capacitor electrodes DE1 and DE2 connected to the unbalanced terminal UT are formed in the wiring layer M0. The capacitor electrode DE1 is positioned in the same way as in the example 1E. The capacitor electrode DE2 is branched to have a larger electrode area than in the example 2A.

(Characteristic Evaluation)

Figure 65:
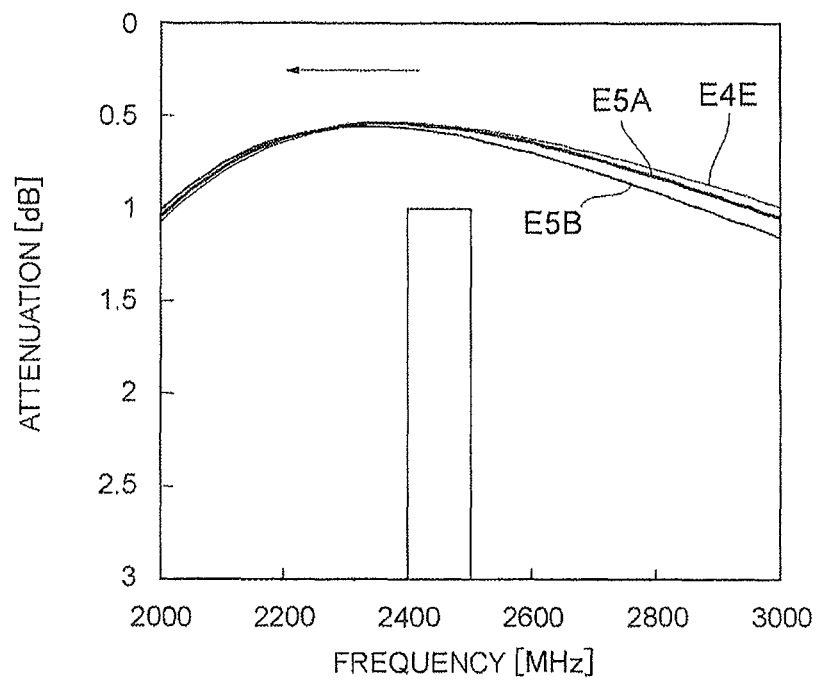
FIG. 65 is a graph showing passage characteristic evaluation results.
Figure 66:
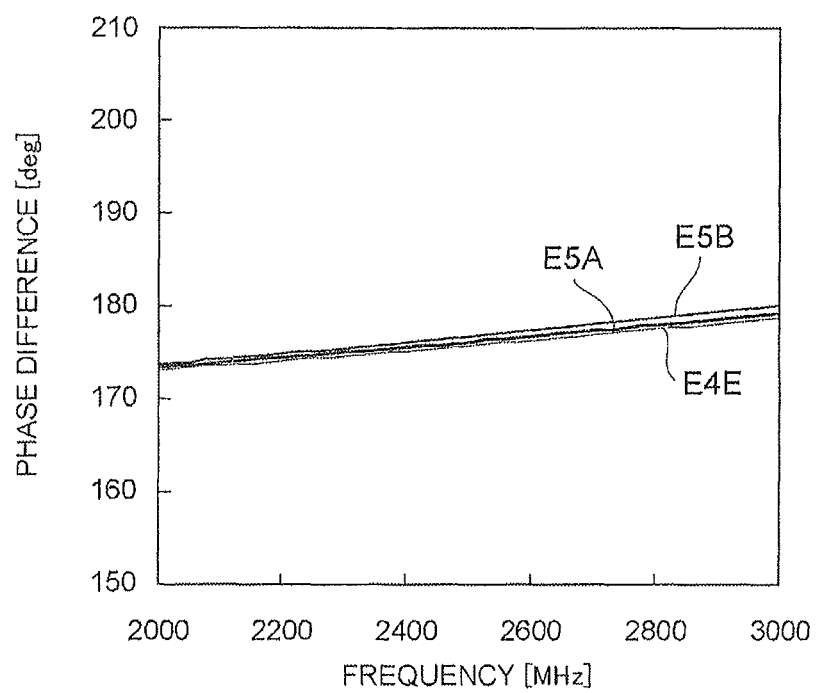
FIG. 66 is a graph showing phase difference evaluation results.
Figure 67:
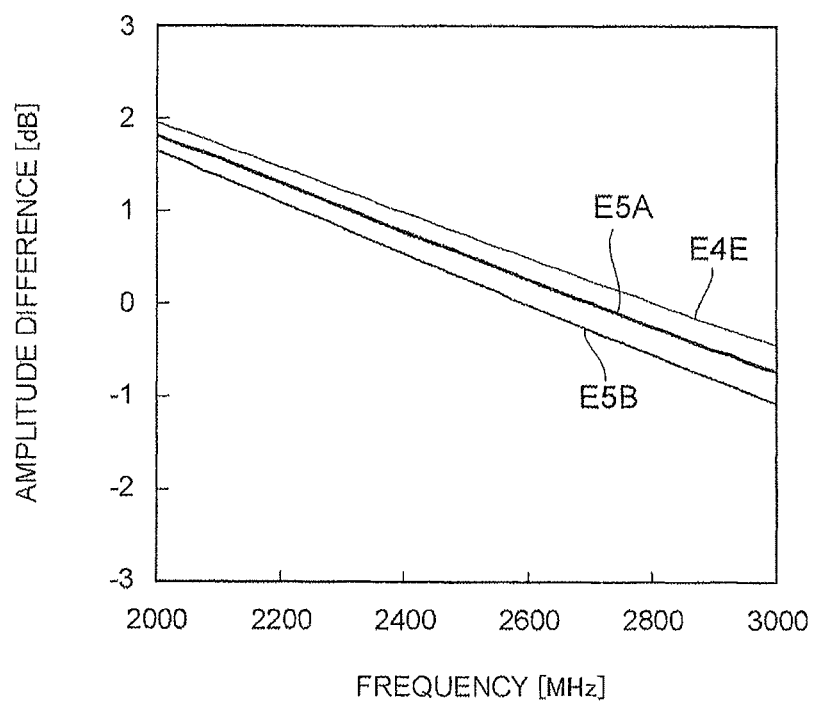
FIG. 67 is a graph showing amplitude difference evaluation results.

Passage characteristics (insertion loss) and balance characteristics (phase difference and amplitude difference of balanced signals) of each of the thin film baluns 5A and 5B described above were measured by simulation. Evaluation target frequencies (resonant frequencies fr) of a transmission signal were set at 2400 MHz to 2500 MHz. FIG. 65 is a diagram showing passage characteristic evaluation results, FIG. 66 is a diagram showing phase difference evaluation results, and FIG. 67 is a diagram showing amplitude difference evaluation results. In each of FIGS. 65 to 67, curves E5A and E5B respectively indicate evaluation results of the thin film baluns 5A and 5B. Meanwhile, a curve E4E in each of FIGS. 65 to 67 indicates evaluation results of the thin film balun 4E of the example that does not include the capacitor electrode DE2.

The results shown in FIGS. 66 and 67 demonstrate that the thin film baluns 5A and 5B of the examples exhibit excellent balance characteristics as compared with the thin film balun 4E. Moreover, the results shown in FIG. 65 demonstrate that the thin film balun 5B has the resonant frequency shifted slightly toward lower frequencies as compared with the thin film balun 4E.

As noted earlier, the present invention is not limited to the above examples, and various changes can be made without departing from the scope of the present invention. For example, though the part of the coil portion C1 or C2 constituting the unbalanced transmission line UL serves as a capacitor electrode in the examples, a layer of another capacitor electrode connected to the coil portion C1 or C2 may be formed between the coil portion C1 or C2 and the capacitor electrode DE2 or DE1. Moreover, the arrangement of the unbalanced terminal UT, the balanced terminals BT1 and BT2, and the ground terminal G is not limited to the positions shown in the drawings. Besides, the wiring layers on the insulating substrate 100 may be reversed in order. Furthermore, various coil arrangements may be employed without departing from the scope of the present invention.

According to the thin film balun in the third embodiment of the present invention, the capacitor is introduced between the unbalanced terminal and a part of the unbalanced transmission line facing the balanced transmission line, so that the thin film balun can be made smaller and thinner while maintaining required balun characteristics. Such a thin film balun is widely applicable, in particular to wireless communication devices, apparatuses, modules, and systems which are required to be smaller and thinner, facilities including them, and manufacturing thereof.

Fourth Embodiment

Figure 68:
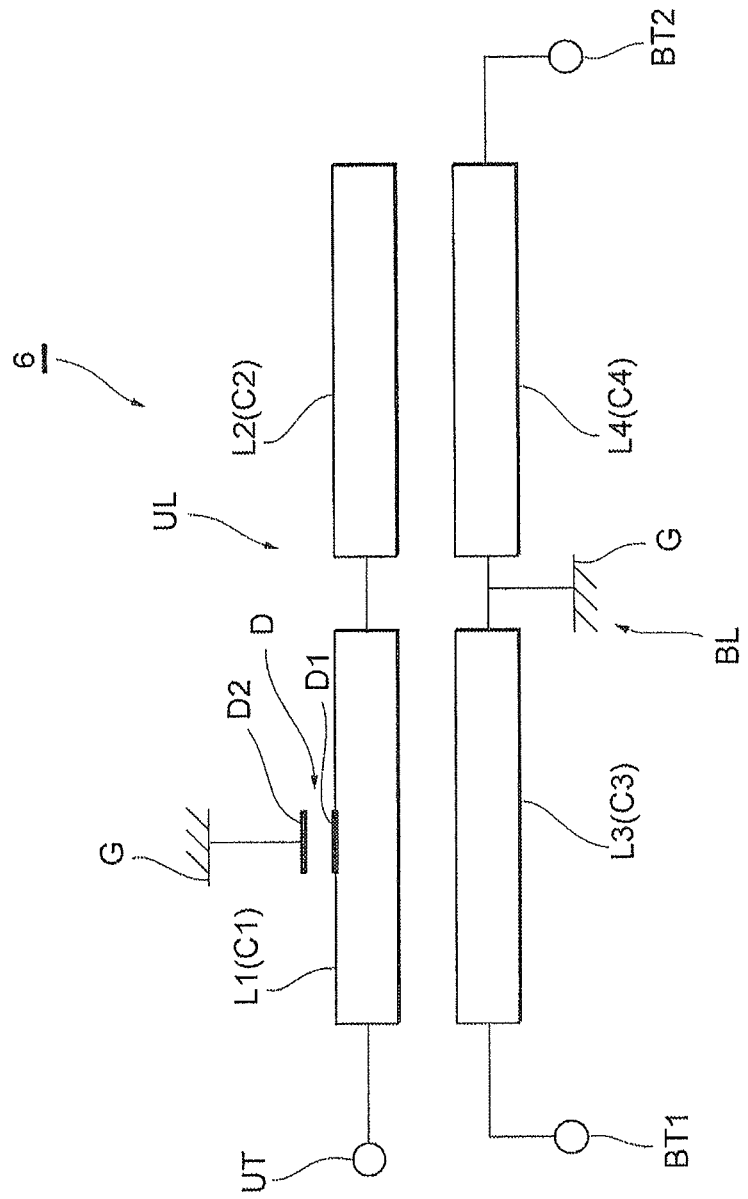
FIG. 68 is an equivalent circuit diagram showing a structure of a thin film balun 6 in a fourth embodiment of the present invention.

A thin film balun in a fourth embodiment corresponding to the fourth aspect of the present invention is described below. FIG. 68 is an equivalent circuit diagram showing a structure of a preferred embodiment of the thin film balun in the fourth embodiment of the present invention. A thin film balun 6 includes the unbalanced transmission line (unbalanced circuit) UL in which the line portion L1 (first line portion) and the line portion L2 (second line portion) are connected in series, and the balanced transmission line (balanced circuit) BL in which the line portion L3 (third line portion) and the line portion L4 (fourth line portion) are connected in series. The line portions L1 and L3 form magnetic coupling, and the line portions L2 and L4 form magnetic coupling.

In the thin film balun 6, the end of the line portion L1 other than the end connected to the line portion L2 is connected to the unbalanced terminal UT, and a part of the line portion L1 is connected to the ground terminal G (ground potential) via the capacitor D which is a C component (capacitance component). The capacitor D is formed by the electrode D1 composed of the part of the line portion L1 and the electrode D2 (opposite electrode) connected to the ground terminal G where the electrodes D1 and D2 face each other via an appropriate dielectric. The end of the line portion L2 other than the end connected to the line portion L1 is open. On the other hand, the end of the line portion L3 other than the end connected to the line portion L4 is connected to the balanced terminal BT1, and the end of the line portion L4 other than the end connected to the line portion L3 is connected to the balanced terminal BT2. Moreover, the connected parts of the line portions L3 and L4 are connected to the ground terminal G.

Lengths of the above-mentioned line portions L1 to L4 vary depending on specifications of the thin film balun 6. For example, the lengths may be set so as to form a quarter-wavelength (?14) resonator circuit of a transmission signal which is subject to conversion. Moreover, the line portions L1 to L4 may be arbitrarily shaped so long as the above-mentioned magnetic coupling is formed. Example shapes include a spiral (coil form), a zigzag, a straight line, and a curved line.

A basic operation of the thin film balun 6 is described below, with reference to FIG. 68. In the thin film balun 6, when an unbalanced signal is input to the unbalanced terminal UT, the unbalanced signal propagates through the line portions L1 and L2. By the magnetic coupling (first magnetic coupling) of the line portions L1 and L3 and the magnetic coupling (second magnetic coupling) of the line portions L2 and L4, the input unbalanced signal is converted to two balanced signals that differ in phase by 180° ($\pi$), and the two balanced signals are output from the balanced terminals BT1 and BT2. A converting operation from balanced signals to an unbalanced signal is the reverse of the above-mentioned converting operation from an unbalanced signal to balanced signals.

Figure 69:
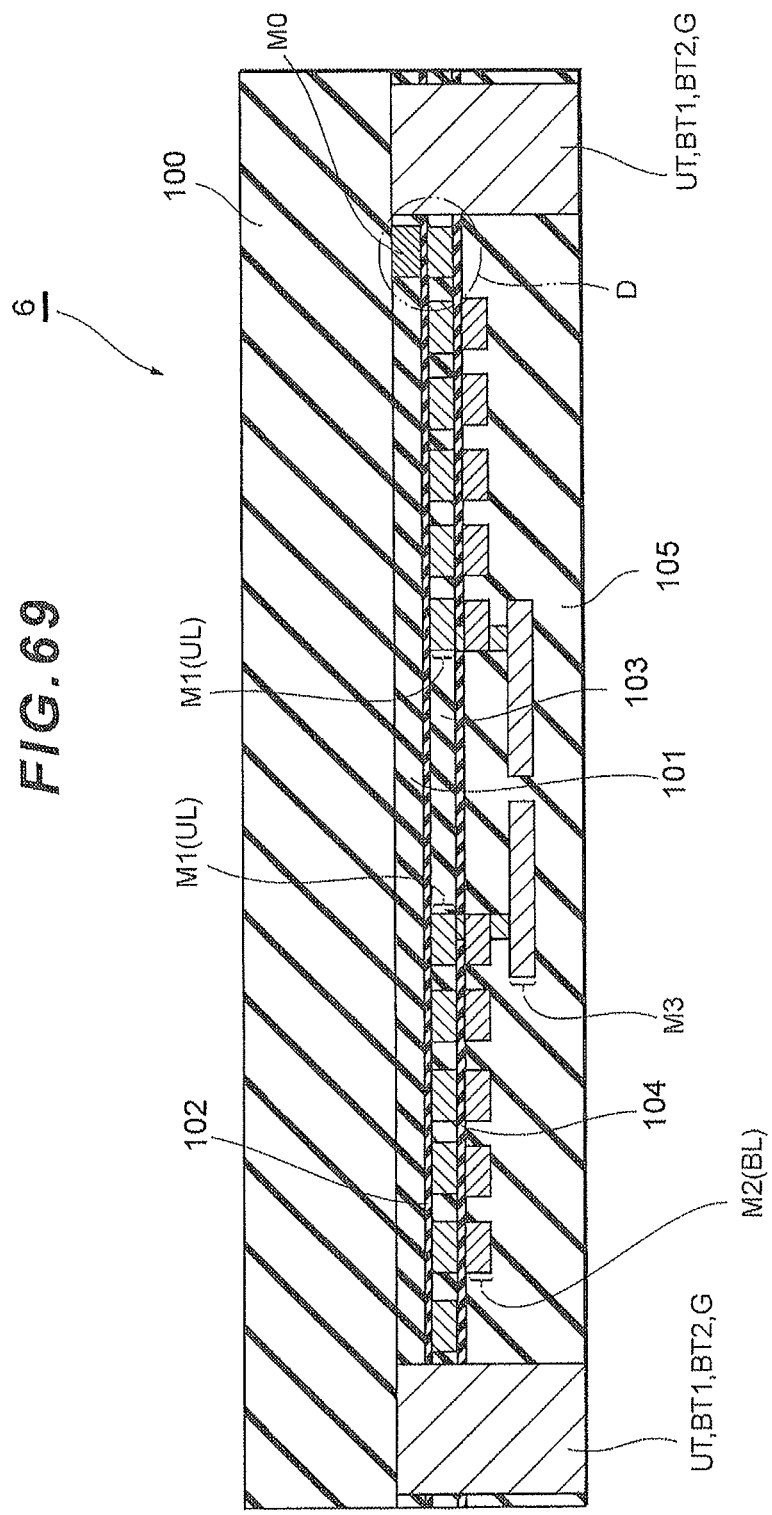
FIG. 69 is a vertical sectional view showing the structure of the thin film balun 6.

A wiring structure of the thin film balun is described below. FIG. 69 is a vertical sectional view schematically showing the wiring structure of the thin film balun 6. As shown in FIG. 69, the wiring layers M0, M1, M2, and M3 are formed in this order on the insulating substrate 100 of alumina or the like. For instance, the unbalanced transmission line UL mentioned above is formed by the wiring layer M1, and the balanced transmission line BL is formed by the wiring layer M2. The dielectric layers 101 to 105 are formed between wires in the same wiring layer and between different wiring layers. For example, silicon nitride is used as the dielectric layer 102 between the wiring layers M0 and M1 where the capacitor D is formed, and the dielectric layer 104 between the wiring layers M1 and M2 where the magnetic coupling between the unbalanced transmission line UL and the balanced transmission line BL is formed. For example, alumina is used as the dielectric layers 101 and 103 in other parts. For example, polyimide is used as the dielectric layer 105. Note that the materials of these layers are not limited to the above, and not only inorganic insulators such as silicon nitride, alumina, and silica but also organic insulators such as polyimide and epoxy resin may be selected according to need. The unbalanced terminal UT, the balanced terminals BT1 and BT2, and the ground terminal G are formed through all dielectric layers. Thus, the thin film balun 6 is composed of a thin film multilayer structure formed on the insulating substrate 100.

A pattern of each of the wiring layers M0, M1, M2, and M3 of the thin film balun in the fourth embodiment is described in detail below. Coil portions are used as the line portions L1 to L4 in each of the following examples.

Example 1

FIGS. 70 to 73 are each a horizontal sectional view schematically showing a different one of the wiring layers of the thin film balun 6 of an example 1. As shown in FIGS. 70 to 73, the unbalanced terminal UT, the balanced terminals BT1 and BT2, and the ground terminal G are formed in all of the wiring layers M0 to M3. Each of the terminals UT, BT1, BT2, and G is electrically connected between different layers via a through hole P. Note that all through holes P shown in FIGS. 70 to 73 are plated with metal for electrical conduction of upper and lower layers. A structure of each wiring layer is described in detail below.

Figure 70:
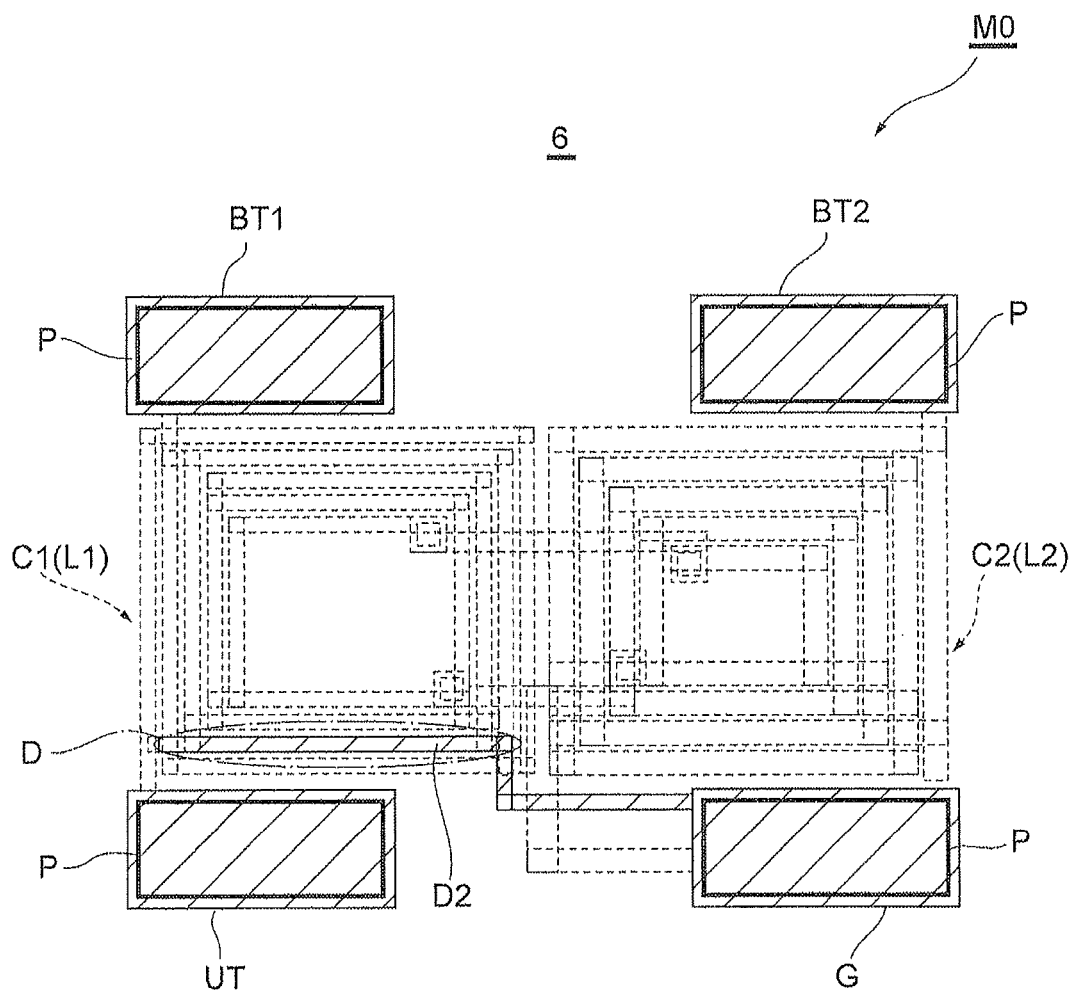
FIG. 70 is a horizontal sectional view showing the wiring layer M0 of the thin film balun 6.

As shown in FIG. 70, the electrode D2 of the capacitor D is formed in the wiring layer M0 on the insulating substrate 100, at a position facing a part of the coil portion C1 in the wiring layer M1. The electrode D2 is connected to the ground terminal G. The electrode D2 of the capacitor D is positioned so as to face the coil conductor 11 of the second line from the bottom of the coil portion C1 in plan view.

Figure 71:
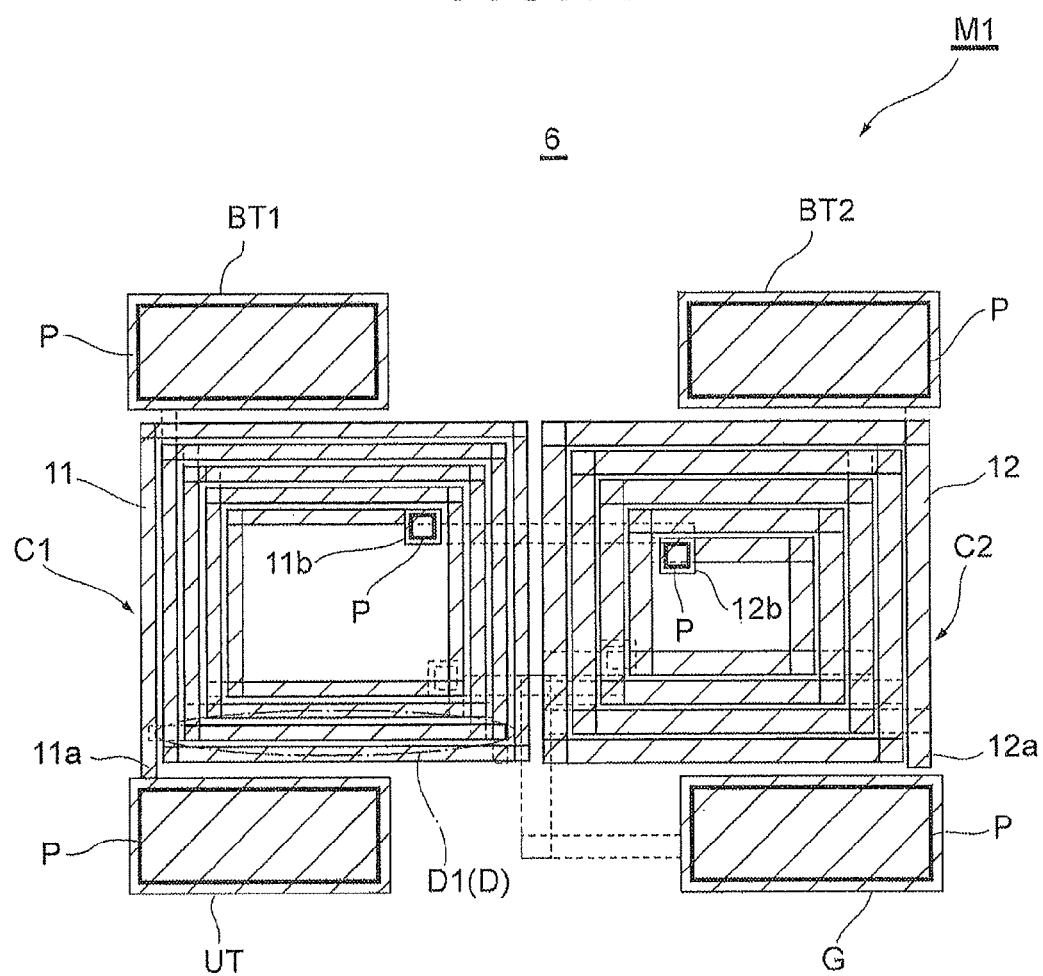
FIG. 71 is a horizontal sectional view showing the wiring layer M1 of the thin film balun 6.

As shown in FIG. 71, the coil portion C1 (first coil portion, first line portion) and the coil portion C2 (second coil portion, second line portion) that constitute the unbalanced transmission line UL are formed adjacent to each other in the wiring layer M1. Each of the coil portions C1 and C2 forms an equivalent of a quarter-wavelength ($\lambda/4$) resonator. The outer end 11a of the coil conductor 11 constituting the coil portion C1 is connected to the unbalanced terminal UT, and the inner end 11b of the coil conductor 11 is connected to a through hole P. The inner end 12b of the coil conductor 12 constituting the coil portion C2 is connected to a through hole P, and the outer end 12a of the coil conductor 12 is open. A part of the coil conductor 11 in the outer periphery of the coil portion C1 serves as the electrode D1 of the capacitor D, and faces the electrode D2 in the wiring layer M0. Moreover, the coil conductor 12 constituting the coil portion C2 has a larger width than the coil conductor 11 constituting the coil portion C1, as shown in FIG. 71. As a result of conducting intense study, the present inventor has found that, in the case of inserting the capacitor D so that a part of the coil portion C1 serves as the electrode D1 of the capacitor D, excellent passage characteristics and balance characteristics can be obtained by forming the coil conductor 12 wider than the coil conductor 11. Note, however, that there is no limitation on the widths and the numbers of turns of the coil conductors 12 and 11, and the widths and the numbers of turns of the coil conductors 12 and 11 may be equal or different.

Figure 72:
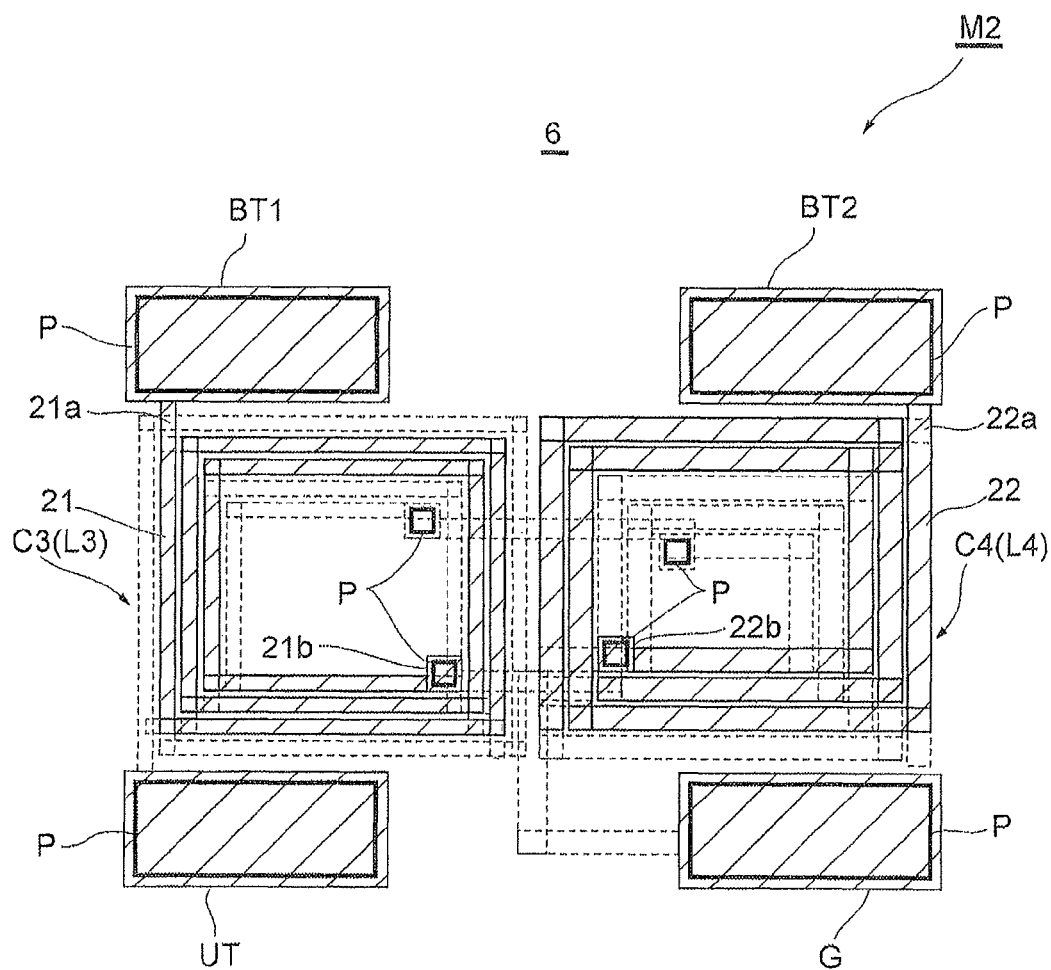
FIG. 72 is a horizontal sectional view showing the wiring layer M2 of the thin film balun 6.

As shown in FIG. 72, the coil portion C3 (third coil portion, third line portion) and the coil portion C4 (fourth coil portion, fourth line portion) that constitute the balanced transmission line BL are formed adjacent to each other in the wiring layer M2. Each of the coil portions C3 and C4 forms an equivalent of a quarter-wavelength ($\lambda/4$) resonator, as with the coil portions C1 and C2. The coil portions C3 and C4 of the balanced transmission line BL are positioned facing the coil portions C1 and C2 of the unbalanced transmission line UL respectively, and the facing portions are magnetically coupled to form couplers. The outer end 21a of the coil conductor 21 constituting the coil portion C3 is connected to the balanced terminal BT1, and the inner end 21b of the coil conductor 21 is connected to a through hole P. The outer end 22a of the coil conductor 22 constituting the coil portion C4 is connected to the balanced terminal BT2, and the inner end 22b of the coil conductor 22 is connected to a through hole P. Moreover, the coil conductor 22 constituting the coil portion C4 has a larger width than the coil conductor 21 constituting the coil portion C3, as shown in FIG. 72. As noted earlier, as a result of conducting intense study, the present inventor has found that, in the case of inserting the capacitor D so that a part of the coil portion C1 serves as the electrode D1 of the capacitor D, excellent passage characteristics and balance characteristics can be obtained by forming the coil conductor 22 wider than the coil conductor 21. Note, however, that there is no limitation on the widths and the numbers of turns of the coil conductors 22 and 21, and the widths and the numbers of turns of the coil conductors 22 and 21 may be equal or different.

Figure 73:
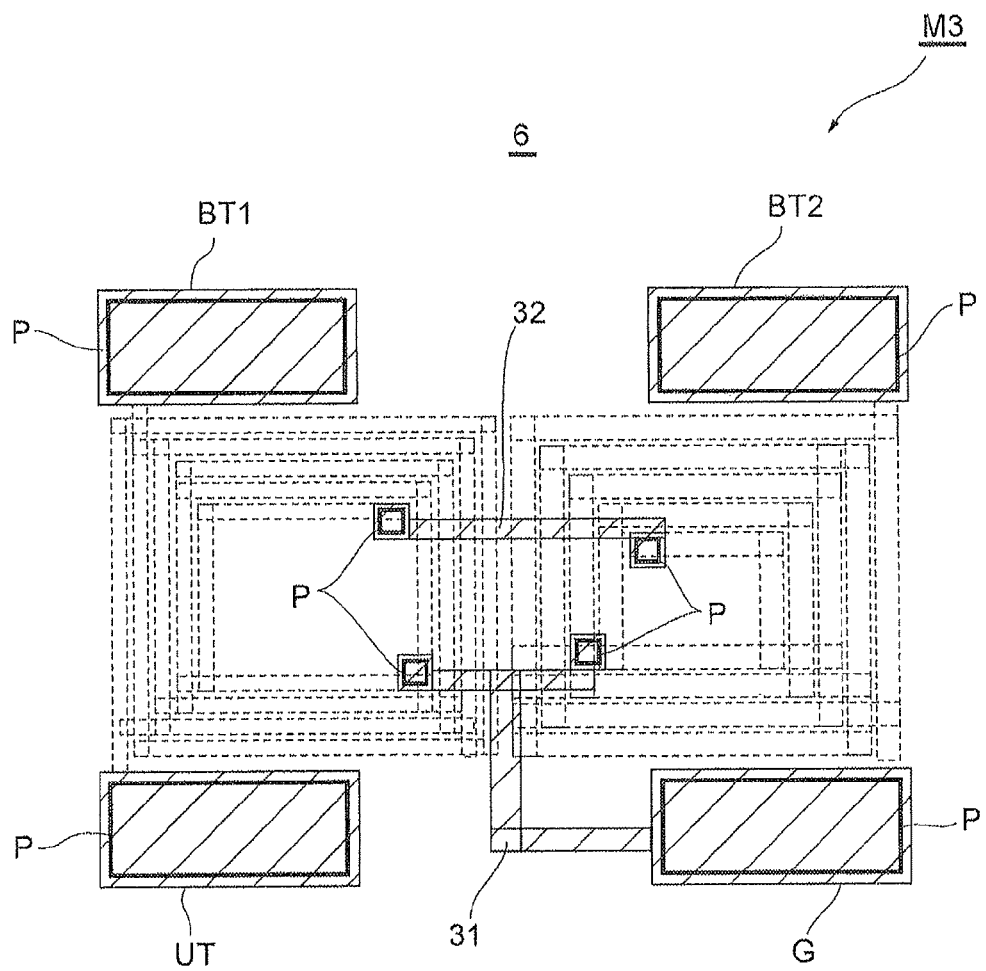
FIG. 73 is a horizontal sectional view showing the wiring layer M3 of the thin film balun 6.

As shown in FIG. 73, the wire 31 for connecting the coil portions C3 and C4 to the ground terminal G and the wire 32 for connecting the coil portions C1 and C2 are formed in the wiring layer M3. The wire 31 is a branch wire formed so as to connect two through holes P to the ground terminal G. The wire 31 is connected to the end 21b of the coil conductor 21 and the end 22b of the coil conductor 22 formed in the wiring layer M2, via the two through holes P. The wire 32 is connected to the end 11b of the coil conductor 11 and the end 12b of the coil conductor 12 formed in the wiring layer M1, via through holes P.

Thus, in the example 1, the thin film balun 6 forming the equivalent circuit shown in FIG. 68 is obtained by a multi-layer wiring structure in which the two coil portions C1 and C2 constituting the unbalanced transmission line are formed in the wiring layer M1 which is one layer, the two coil portions C3 and C4 constituting the balanced transmission line are formed in the wiring layer M2 which is another layer adjacent to the wiring layer M1, the wire 32 connecting the coil portions C1 and C2 and the wire 31 connecting the coil portions C3 and C4 are formed in the wiring layer M3 which is another layer adjacent to the wiring layer M2 on an opposite side to the wiring layer M1, and the electrode D2 facing the part of the coil conductor 11 in the coil portion C1 to form the capacitor D is formed in the wiring layer M0 which is another layer adjacent to the wiring layer M1 on an opposite side to the wiring layer M2.

Example 1A

Figure 74:
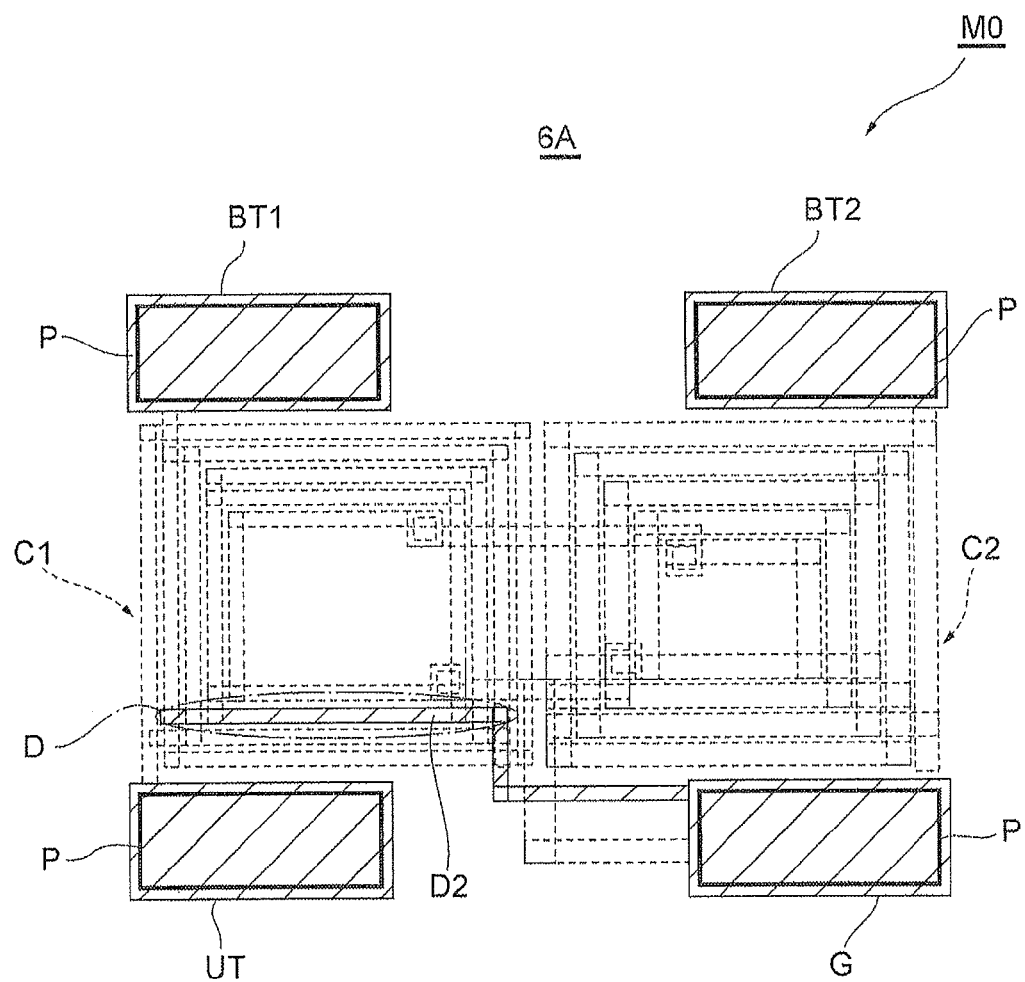
FIG. 74 is a horizontal sectional view showing the wiring layer M0 of a thin film balun 6A.

FIG. 74 is a horizontal sectional view schematically showing the wiring layer M0 of a thin film balun 6A of an example 1A in the fourth embodiment. Structures other than the wiring layer M0 are the same as those in the example 1. In the thin film balun 6A shown in FIG. 74, the electrode D2 of the capacitor D is positioned so as to face the coil conductor 11 of the third line from the bottom of the coil portion C1 in plan view.

Example 1B

Figure 75:
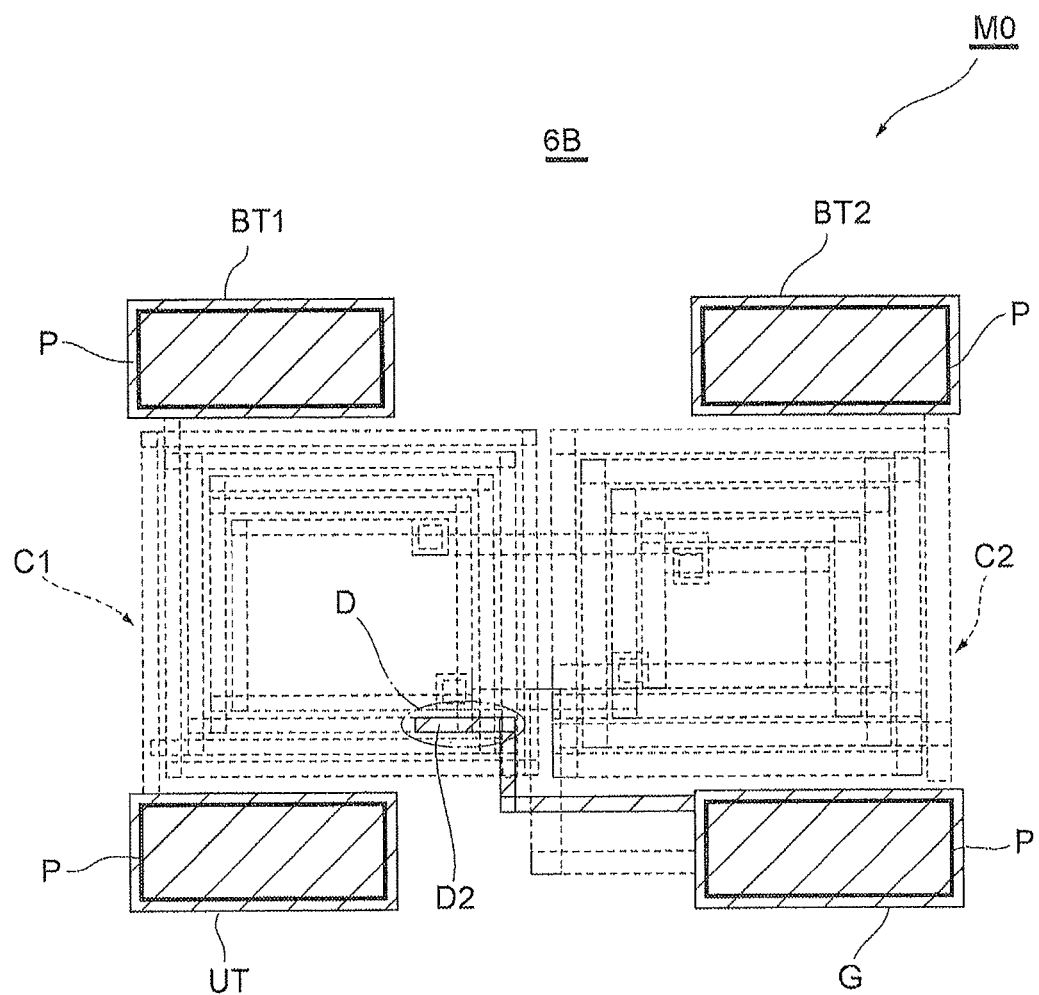
FIG. 75 is a horizontal sectional view showing the wiring layer M0 of a thin film balun 6B.

FIG. 75 is a horizontal sectional view schematically showing the wiring layer M0 of a thin film balun 6B of an example 1B. Structures other than the wiring layer M0 are the same as those in the example 1. In the thin film balun 6B shown in FIG. 75, the electrode D2 of the capacitor D in the thin film balun 6A of the example 1A is shortened in length.

(Characteristic Evaluation)

Figure 76:
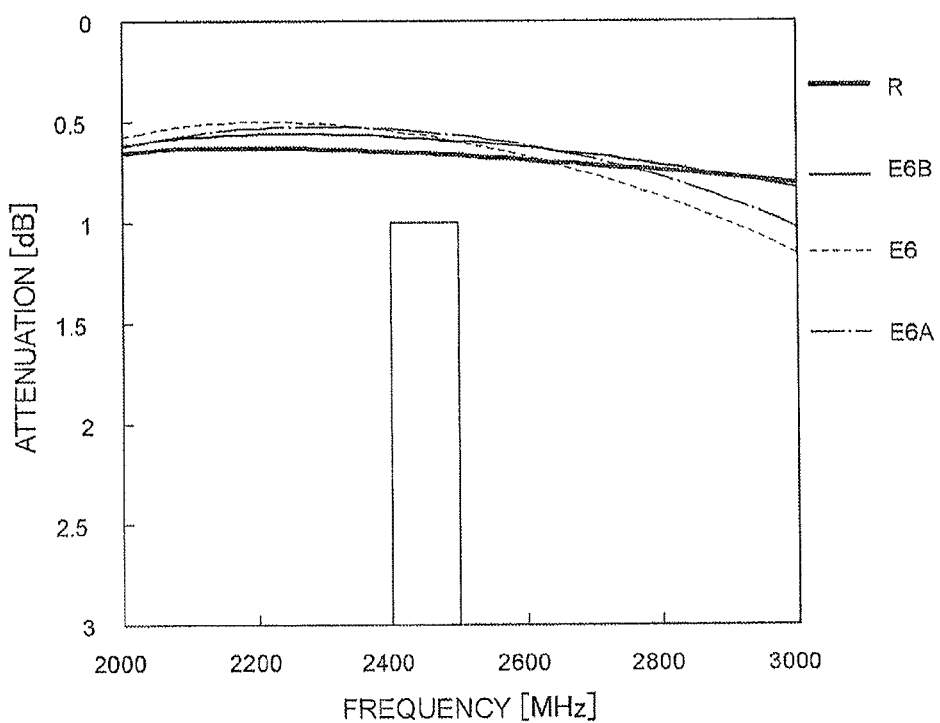
FIG. 76 is a graph showing passage characteristic evaluation results.
Figure 77:
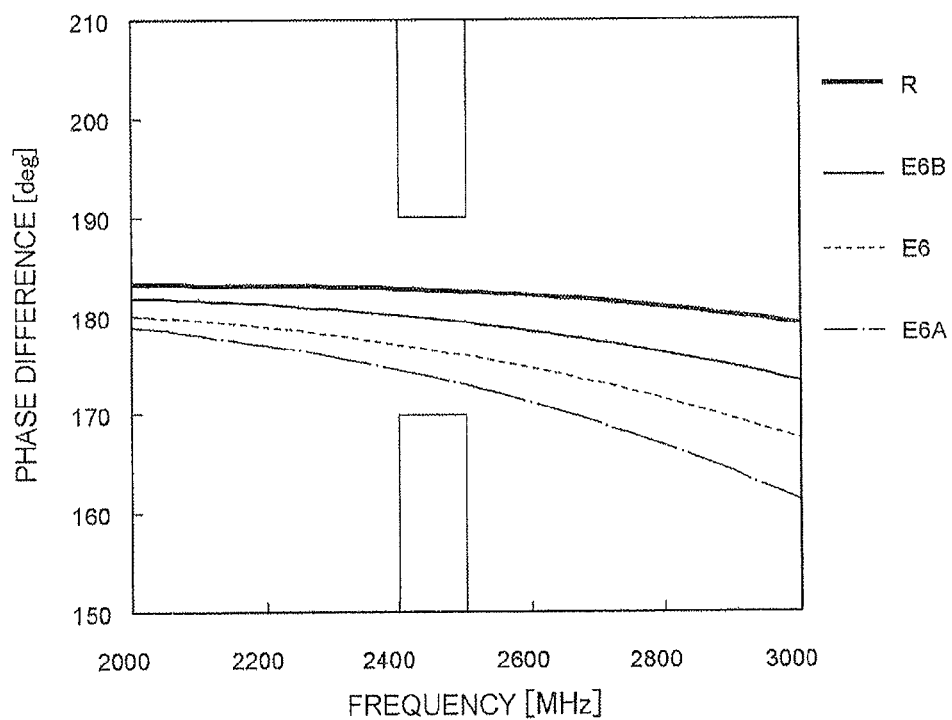
FIG. 77 is a graph showing phase difference evaluation results.
Figure 78:
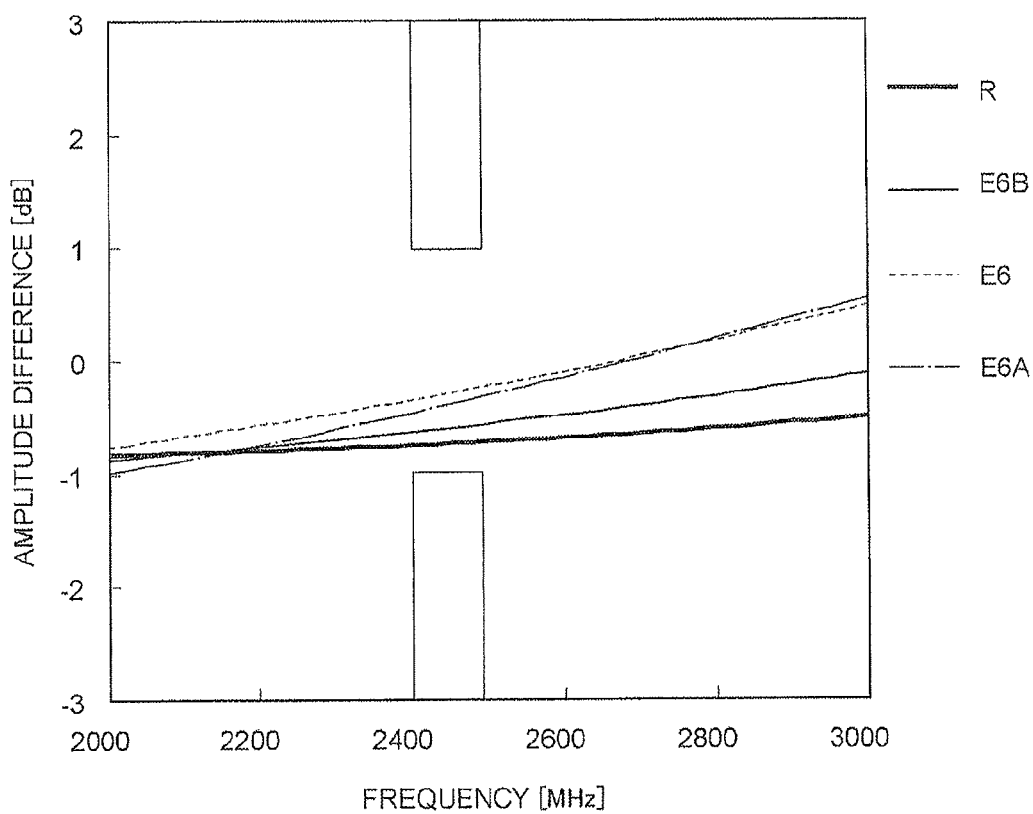
FIG. 78 is a graph showing amplitude difference evaluation results.

Passage characteristics (insertion loss) and balance characteristics (phase difference and amplitude difference of balanced signals) of each of the thin film baluns 6, 6A, and 6B of the examples described above were measured by simulation. Evaluation target frequencies (resonant frequencies fr) of a transmission signal were set at 2400 MHz to 2500 MHz. FIG. 76 is a diagram showing passage characteristic evaluation results, FIG. 77 is a diagram showing phase difference evaluation results, and FIG. 78 is a diagram showing amplitude difference evaluation results. In each of FIGS. 76 to 78, curves E6, E6A, and E6B respectively indicate evaluation results of the thin film baluns 6, 6A, and 6B. Meanwhile, a curve R indicates evaluation results of a thin film balun (comparative example) having the same structure except that the capacitor D is not included.

The passage characteristics represent with how little loss a signal passes through in an evaluation target frequency domain. 0 dB is ideal passage characteristics in the evaluation target frequency domain. The passage characteristics of each thin film balun were evaluated with desired specifications being less than 1 dB in attenuation in the evaluation target frequency range. The phase difference is a difference in phase between two balanced signals output from the balanced terminals BT1 and BT2, so that 180 deg is a more ideal phase balance. The phase balance of each thin film balun was evaluated with desired specifications being from 170 deg to less than 190 deg in phase difference in the evaluation target frequency range. The amplitude difference is a difference in amplitude between two balanced signals output from the balanced terminals BT1 and BT2, so that 0 dB is a more ideal output balance. The amplitude balance of each thin film balun was evaluated with desired specifications being from −1 dB to 1 dB in amplitude difference in the evaluation target frequency range.

These results demonstrate that the thin film baluns 6, 6A, and 6B of the examples maintain excellent characteristics in the passage characteristics and the phase balance. In particular, these results demonstrate that the thin film baluns 6, 6A, and 6B exhibit excellent passage characteristics as compared with the thin film balun R that does not include the capacitor, achieving an improvement of 0.13 dB at the maximum in passage characteristics relative to the comparative example. This value represents a significant improvement in passage characteristics while meeting the demand for smaller and thinner models. The results also demonstrate that the phase balance and the amplitude balance can be adjusted by the position of the electrode D2 of the capacitor D. In detail, it is demonstrated that the thin film balun 6 in which the electrode D2 faces a part of the coil conductor closer to the outer peripheral coil conductor than the inner peripheral coil conductor in the coil portion C1 exhibits most excellent passage characteristics, phase balance, and amplitude balance.

As noted earlier, the present invention is not limited to the above examples, and various changes can be made without departing from the scope of the present invention. For example, the arrangement of the unbalanced terminal UT, the balanced terminals BT1 and BT2, and the ground terminal G is not limited to the positions shown in the drawings. Moreover, the number of layers of the multilayer wiring structure forming the thin film balun may be smaller or larger than the number shown in the drawings. Besides, the wiring layers on the insulating substrate 100 may be reversed in order. Furthermore, various coil arrangements may be employed without departing from the scope of the present invention.

According to the thin film balun in the fourth embodiment of the present invention, a part of the first line portion that constitutes the unbalanced transmission line and is connected to the unbalanced terminal serves as one electrode of the capacitor, so that the thin film balun can be made smaller and thinner while maintaining required balun characteristics. Such a thin film balun is widely applicable, in particular to wireless communication devices, apparatuses, modules, and systems which are required to be smaller and thinner, facilities including them, and manufacturing thereof.

Fifth Embodiment

Figure 79:
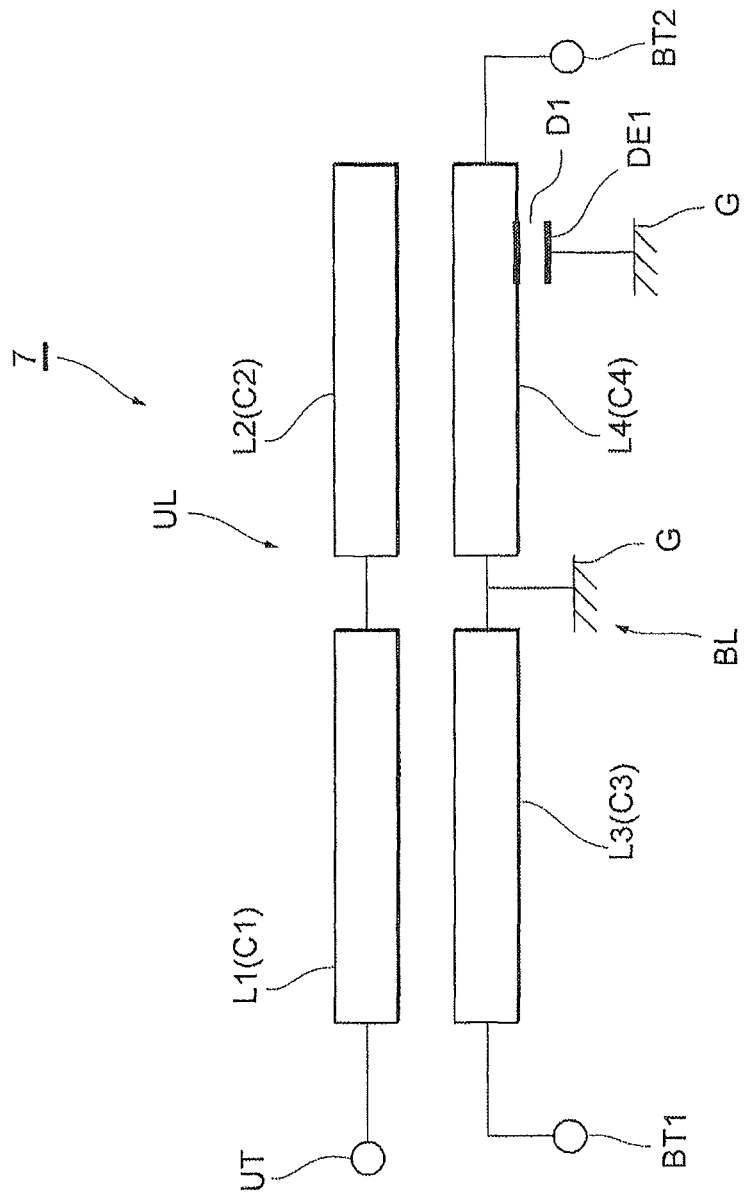
FIG. 79 is an equivalent circuit diagram showing a structure of a thin film balun 7 in a fifth embodiment of the present invention.

A thin film balun in a fifth embodiment corresponding to the fifth aspect of the present invention is described below. FIG. 79 is an equivalent circuit diagram showing a structure of a thin film balun 7 in the fifth embodiment of the present invention. The thin film balun 7 includes the unbalanced transmission line (unbalanced circuit) UL in which the line portion L1 (first line portion) and the line portion L2 (second line portion) are connected in series, and the balanced transmission line (balanced circuit) BL in which the line portion L3 (third line portion) and the line portion L4 (fourth line portion) are connected in series. The line portions L1 and L3 form electromagnetic coupling, and the line portions L2 and L4 form electromagnetic coupling.

In the thin film balun 7, the end of the line portion L1 other than the end connected to the line portion L2 is connected to the unbalanced terminal UT, and the end of the line portion L2 other than the end connected to the line portion L1 is an open end. On the other hand, the end of the line portion L3 other than the end connected to the line portion L4 is connected to the balanced terminal BT1, and the end of the line portion L4 other than the end connected to the line portion L3 is connected to the balanced terminal BT2. Moreover, the connected ends of the line portions L3 and L4 are connected to the ground terminal G. Furthermore, in this embodiment, a part of the line portion L4 of the balanced transmission line BL is electrically connected to the ground terminal G via the capacitor D1.

Lengths of the above-mentioned line portions L1 to L4 vary depending on specifications of the thin film balun 7. For example, the lengths may be set so as to form a quarter-wavelength ($\lambda/4$) resonator circuit of a transmission signal which is subject to conversion. Moreover, the line portions L1 to L4 may be arbitrarily shaped so long as the above-mentioned electromagnetic coupling is formed. Example shapes include a spiral (coil form), a zigzag, a straight line, and a curved line.

A basic operation of the thin film balun 7 is described below, with reference to FIG. 79. When an unbalanced signal is input to the unbalanced terminal UT, the unbalanced signal propagates through the line portions L1 and L2. By the electromagnetic coupling (first electromagnetic coupling) of the line portions L1 and L3 and the electromagnetic coupling (second electromagnetic coupling) of the line portions L2 and L4, the input unbalanced signal is converted to two balanced signals that have the same frequency as the unbalanced signal and differ in phase by 180° ($\pi$), and the two balanced signals are output from the balanced terminals BT1 and BT2. On the other hand, when two balanced signals of the same magnitude that have a predetermined frequency and differ in phase by 180° are input to the balanced terminals BT1 and BT2, an unbalanced signal of the same frequency as the balanced signals is output from the unbalanced terminal UT.

Figure 80:
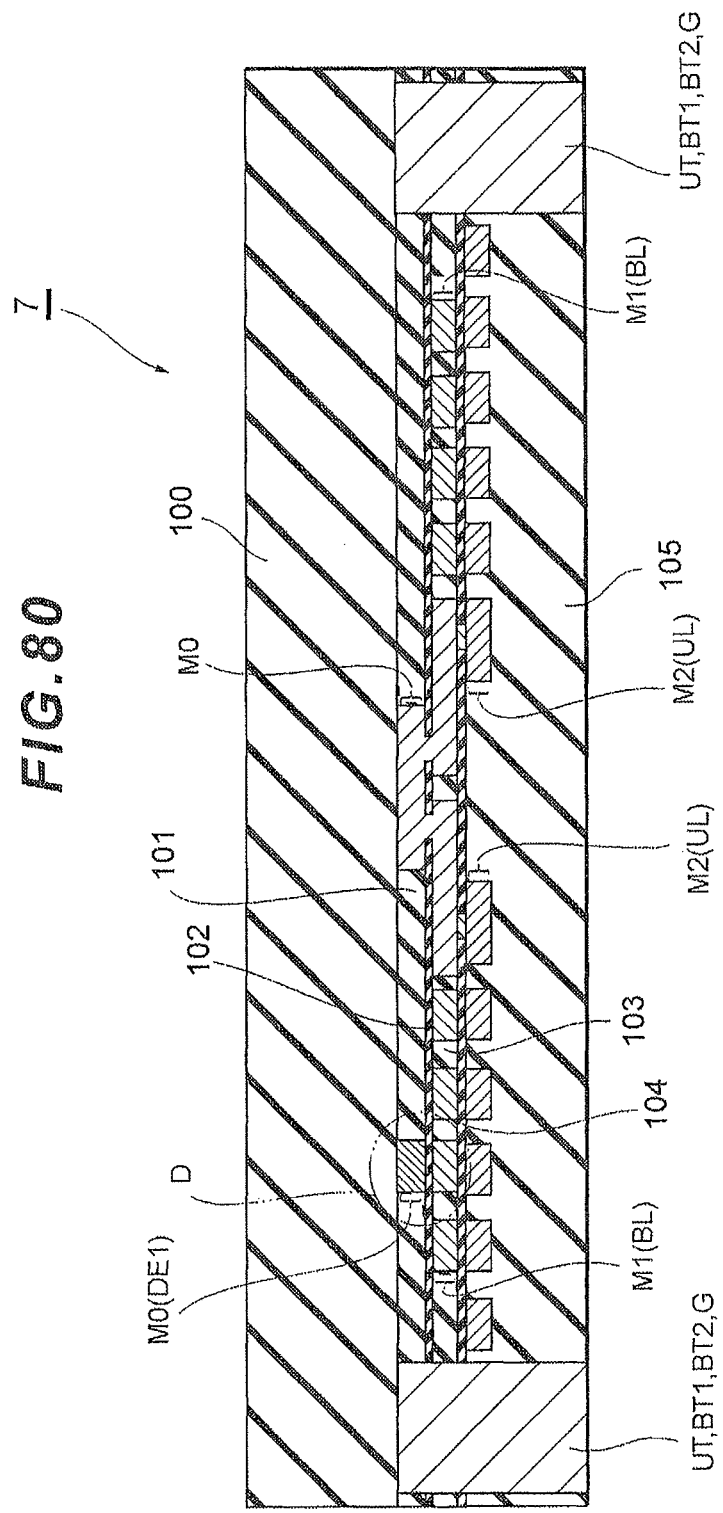
FIG. 80 is a vertical sectional view showing the structure of the thin film balun 7.

A wiring structure of the thin film balun in the fifth embodiment is described below. FIG. 80 is a vertical sectional view schematically showing the wiring structure of the thin film balun 7. As shown in FIG. 80, the wiring layers M0, M1, and M2 are formed in this order on the insulating substrate 100 of alumina or the like. For instance, the capacitor electrode DE1 and the connection wires (connectors) connecting the line portions in the balanced transmission line BL and the unbalanced transmission line UL are formed by the wiring layer M0, the balanced transmission line BL is formed by the wiring layer M1, and the unbalanced transmission line UL is formed by the wiring layer M2. The dielectric layers 101 to 105 are formed between wires in the same wiring layer and between different wiring layers. For example, silicon nitride is used as the dielectric layer 102 between the wiring layers M0 and M1 where the capacitor D1 is formed, and the dielectric layer 104 between the wiring layers M1 and M2 where the electromagnetic coupling between the unbalanced transmission line UL and the balanced transmission line BL is formed. For example, alumina is used as the dielectric layers 101 and 103 covering the wiring layers M0 and M1. For example, polyimide is used as the dielectric layer 105 covering the wiring layer M2. Note that the materials of these layers are not limited to the above, and not only inorganic insulators such as silicon nitride, alumina, and silica but also organic insulators such as polyimide and epoxy resin may be selected according to need. The unbalanced terminal UT, the balanced terminals BT1 and BT2, and the ground terminal G are formed through all dielectric layers. Thus, the thin film balun 7 is composed of a thin film multilayer structure formed on the insulating substrate 100.

As shown in FIG. 80, in the fifth embodiment, the above-mentioned capacitor D1 is formed between the wiring layer M1 that includes the balanced transmission line BL and the wiring layer M0 that faces the wiring layer M1 via the dielectric layer 102 and includes the capacitor electrode DE1

A pattern of each of the wiring layers M0, M1, and M2 of the thin film balun in the fifth embodiment is described in detail below. Coil portions are used as the line portions L1 to L4 in each of the following examples.

Example 1A

Figure 81:
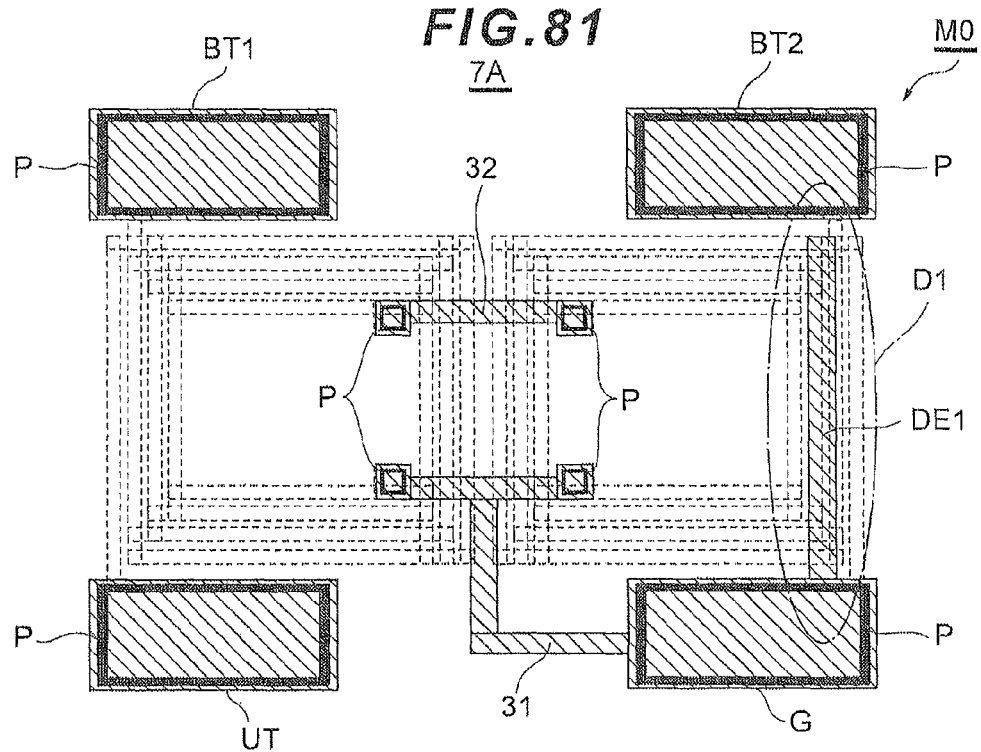
FIG. 81 is a horizontal sectional view showing the wiring layer M0 of a thin film balun 7A.
Figure 82:
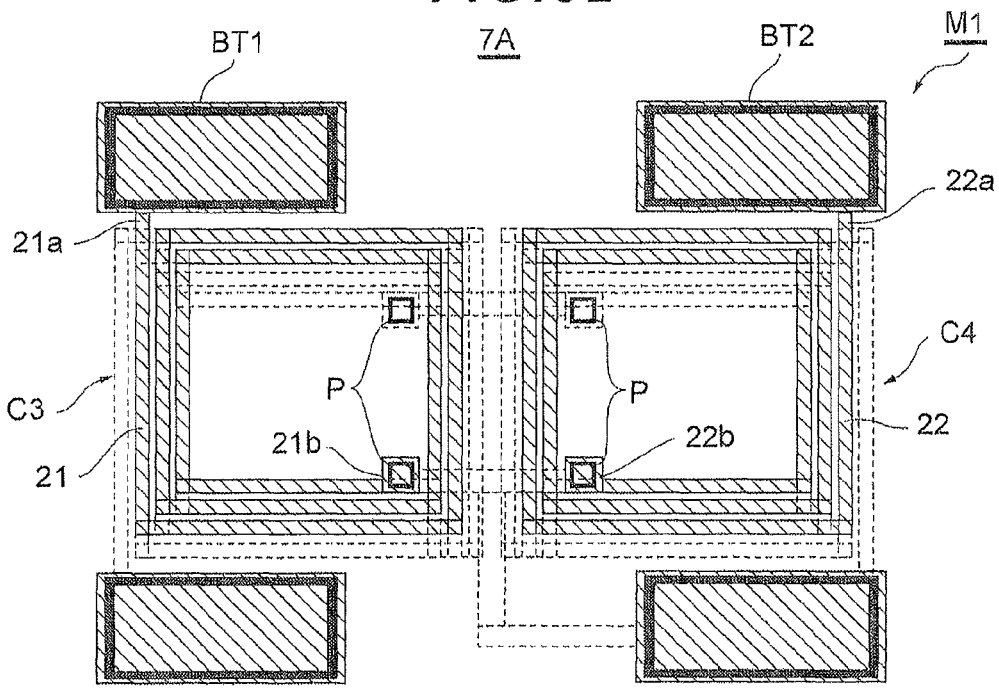
FIG. 82 is a horizontal sectional view showing the wiring layer M1 of the thin film balun 7A.
Figure 83:
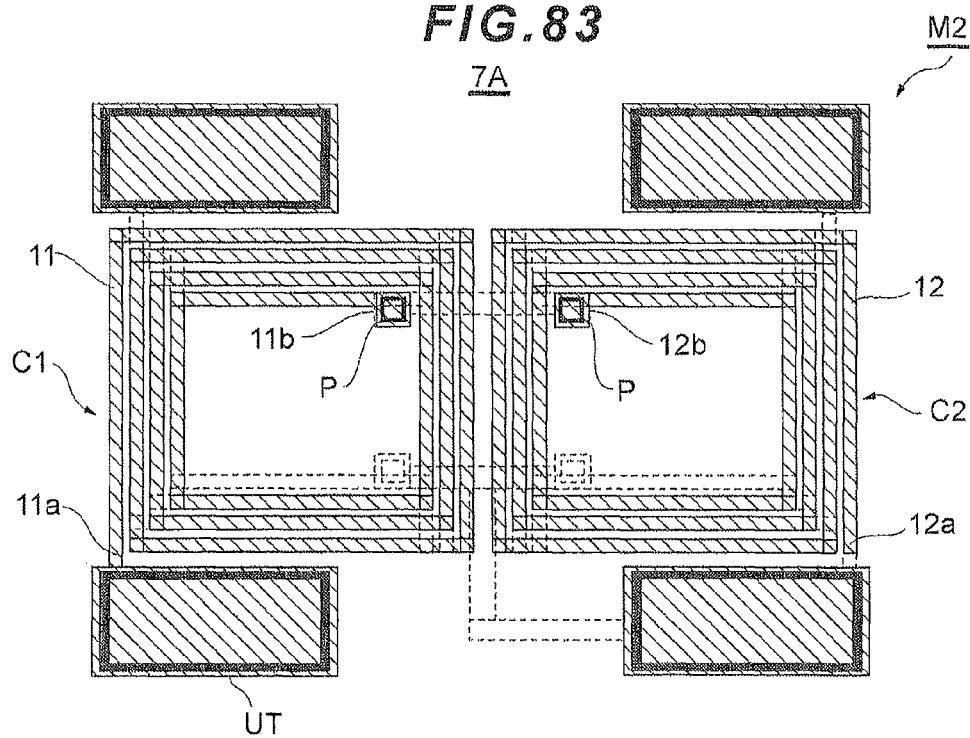
FIG. 83 is a horizontal sectional view showing the wiring layer M2 of the thin film balun 7A.

FIGS. 81 to 83 are each a horizontal sectional view schematically showing a different one of the wiring layers of a thin film balun 7A of an example 1A in the fifth embodiment. As shown in FIGS. 81 to 83, the unbalanced terminal UT, the balanced terminals BT1 and BT2, and the ground terminal G are formed in all of the wiring layers M0 to M2. Each of the terminals UT, BT1, BT2, and G is electrically connected between different layers via a through hole P. Note that all through holes P shown in FIGS. 81 to 83 are plated with a metal conductor for electrical conduction of upper and lower layers. A structure of each wiring layer is described in detail below.

As shown in FIG. 81, the wire 31 for connecting the coil portions C3 and C4 of the balanced transmission line BL to the ground terminal G and the wire 32 for connecting the coil portions C1 and C2 of the unbalanced transmission line UL are formed in the wiring layer M0 on the insulating substrate 100. The wire 31 is a branch wire formed so as to connect two through holes P to the ground terminal G. In addition, the capacitor electrode DE1 of the capacitor D1 is formed in the wiring layer M0 at a position facing a part of the coil portion C4 in the wiring layer M1. The capacitor electrode DE1 is connected to the ground terminal G. In more detail, the capacitor electrode DE1 of the capacitor D1 is positioned extending vertically so as to face the coil conductor of the second line and one half of the coil conductor of the first line from the right of the coil portion C4 in plan view.

As shown in FIG. 82, the coil portion C3 (third line portion) and the coil portion C4 (fourth line portion) that constitute the balanced transmission line BL are formed adjacent to each other in the wiring layer M1. Each of the coil portions C3 and C4 forms an equivalent of a quarter-wavelength ($\lambda$/4) resonator. The outer end 21a of the coil conductor 21 constituting the coil portion C3 is connected to the balanced terminal BT1, and the inner end 21b of the coil conductor 21 is connected to a through hole P. The outer end 22a of the coil conductor 22 constituting the coil portion C4 is connected to the balanced terminal BT2, and the inner end 22b of the coil conductor 22 is connected to a through hole P. The coil conductors 21 and 22 are connected to each other and also connected to the ground terminal G, via the wire 31 in the wiring layer M0. A part of the coil conductor 22 of the coil portion C4 serves as a capacitor electrode of the capacitor D1, and faces the capacitor electrode DE1 in the wiring layer M0. Note that there is no limitation on the widths and the numbers of turns of the coil conductors 22 and 21, and the widths and the numbers of turns of the coil conductors 22 and 21 may be equal or different.

As shown in FIG. 83, the coil portion C1 (first line portion) and the coil portion C2 (second line portion) that constitute the unbalanced transmission line UL are formed adjacent to each other in the wiring layer M2. Each of the coil portions C1 and C2 forms an equivalent of a quarter-wavelength ($\lambda$/4) resonator. The coil portions C1 and C2 of the unbalanced transmission line UL are positioned facing the coil portions C3 and C4 of the balanced transmission line BL respectively, and the facing portions are electromagnetically coupled to form couplers. The outer end 11a of the coil conductor 11 constituting the coil portion C1 is connected to the unbalanced terminal UT, and the inner end 11b of the coil conductor 11 is connected to a through hole P. The inner end 12b of the coil conductor 12 constituting the coil portion C2 is connected to a through hole P, and the outer end 12a (open end) of the coil conductor 12 is open. The coil conductors 11 and 12 are connected to each other via the wire 32 in the wiring layer M0. Note that there is no limitation on the widths and the numbers of turns of the coil conductors 12 and 11, and the widths and the numbers of turns of the coil conductors 12 and 11 may be equal or different.

Thus, in the example 1A, the thin film balun 7A forming the equivalent circuit shown in FIG. 79 is obtained by a multilayer wiring structure in which the two coil portions C3 and C4 constituting the balanced transmission line BL are formed in the wiring layer M1 which is one layer, the two coil portions C1 and C2 constituting the unbalanced transmission line UL are formed in the wiring layer M2 which is another layer adjacent to the wiring layer M1, and the wire 32 connecting the coil portions C1 and C2, the wire 31 connecting the coil portions C3 and C4, and the capacitor electrode DE1 facing the part of the coil conductor 22 in the coil portion C4 to form the capacitor D1 are formed in the wiring layer M0 which is another layer adjacent to the wiring layer M1 on an opposite side to the wiring layer M2.

Example 1B

Figure 84:
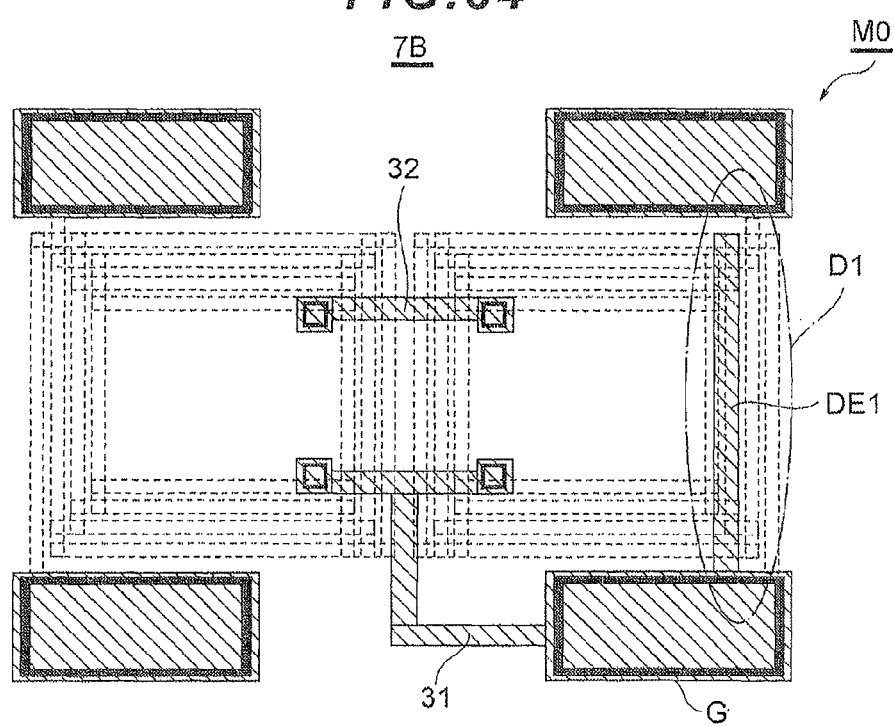
FIG. 84 is a horizontal sectional view showing the wiring layer M0 of a thin film balun 7B.

FIG. 84 is a horizontal sectional view schematically showing the wiring layer M0 of a thin film balun 7B of an example 1B. Structures other than the wiring layer M0 are the same as those in the example 1A. In the thin film balun 7B shown in FIG. 84, the capacitor electrode DE1 is positioned extending vertically so as to face the coil conductor 22 of the second line and one half of the coil conductor 22 of the third line from the right of the coil portion C4 in plan view.

Comparative Example 1R

Figure 85:
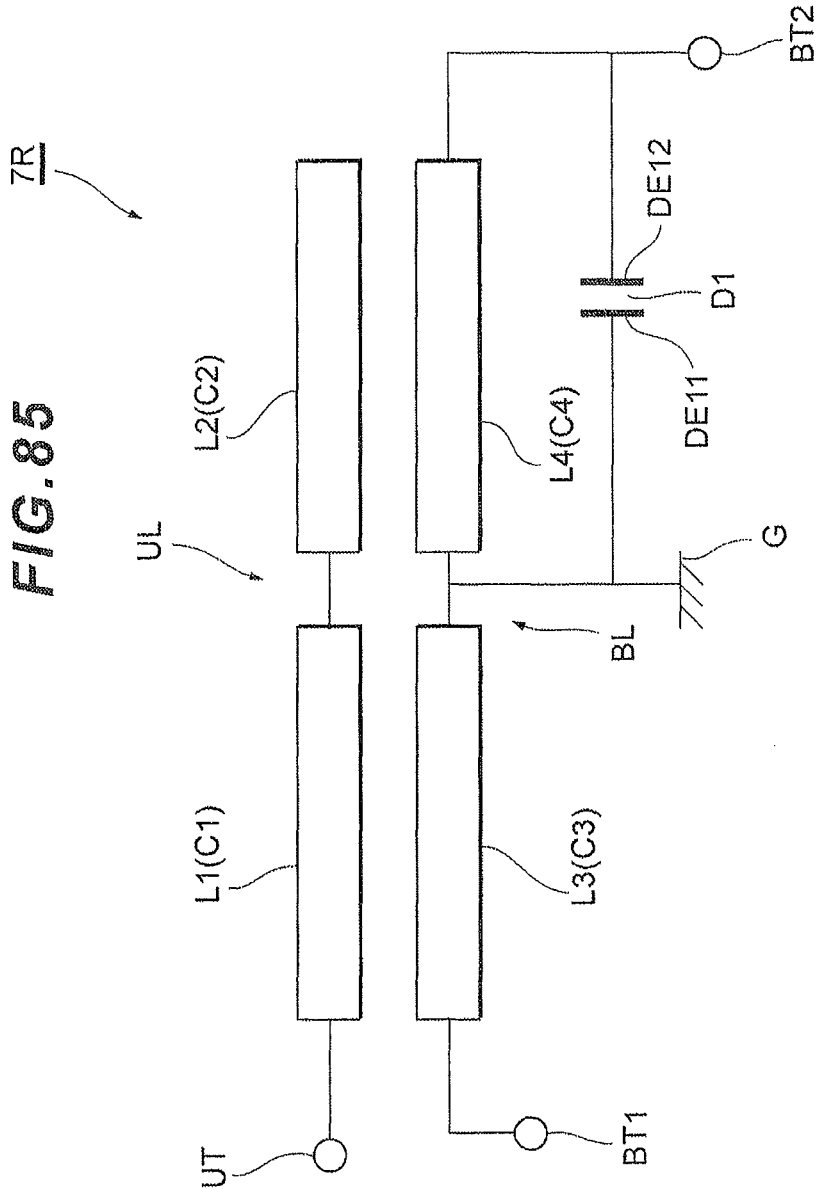
FIG. 85 is an equivalent circuit diagram showing a structure of a thin film balun 7R of a comparative example.

FIG. 85 is an equivalent circuit diagram showing a structure of a thin film balun 7R of a comparative example 1R. FIGS. 86 and 87 are horizontal sectional views schematically showing the wiring layers M0 and M1 of the thin film balun 7R of the comparative example 1R, respectively. Structures other than the wiring layers M0 and M1 are the same as those in the example 1A.

As shown in FIG. 85, in the thin film balun 7R of the comparative example, the capacitor D1 is connected between the ground terminal G and the balanced terminal BT2 in a form of branching from the line portion L4 independently. As shown in FIG. 86, a capacitor electrode DE11 connected to the ground terminal G is provided in the wiring layer M0 so as to face a region outside the coil portion C4 in the wiring layer M1. As shown in FIG. 87, a capacitor electrode DE12 facing the capacitor electrode DE11 is formed in the wiring layer M1. The capacitor electrode DE12 is provided independently of the coil portion C4 of the balanced transmission line BL, and has one end connected to the balanced terminal BT2.

(Characteristic Evaluation)

Figure 88:
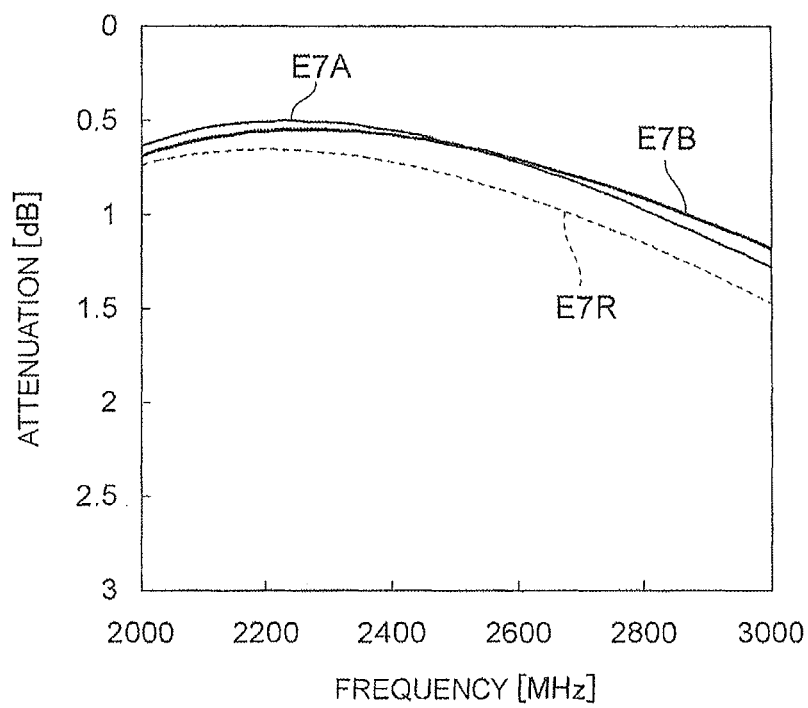
FIG. 88 is a graph showing passage characteristic evaluation results.
Figure 89:
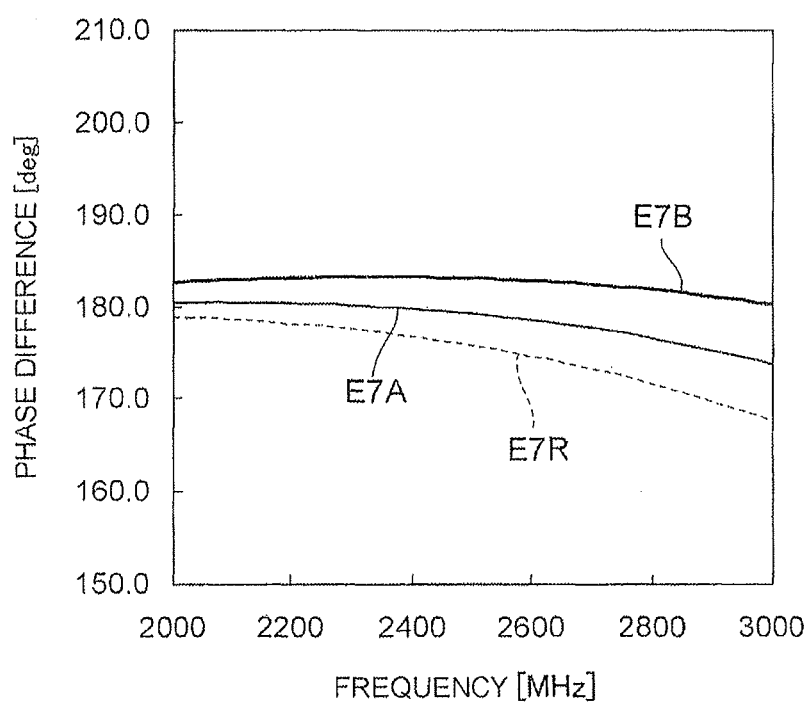
FIG. 89 is a graph showing phase difference evaluation results.
Figure 90:
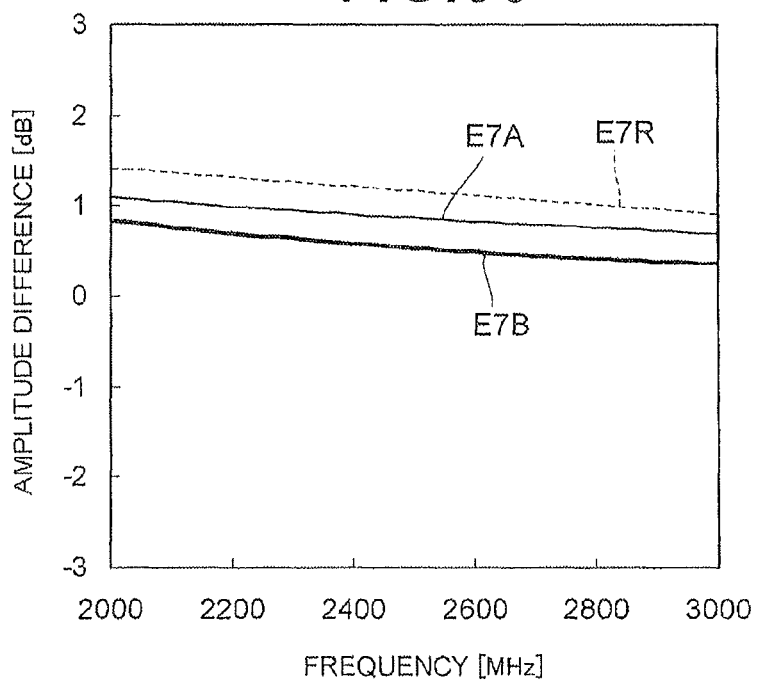
FIG. 90 is a graph showing amplitude difference evaluation results.

Passage characteristics (insertion loss) and balance characteristics (phase difference and amplitude difference of balanced signals) of each of the thin film baluns 7A, 7B, and 7R described above were measured by simulation. Evaluation target frequencies (resonant frequencies fr) of a transmission signal were set at 2400 MHz to 2500 MHz. FIG. 88 is a diagram showing passage characteristic evaluation results, FIG. 89 is a diagram showing phase difference evaluation results, and FIG. 90 is a diagram showing amplitude difference evaluation results. In each of FIGS. 88 to 90, curves E7A, E7B, and E7R respectively indicate evaluation results of the thin film baluns 7A, 7B, and 7R.

The passage characteristics represent with how little loss a signal passes through in an evaluation target frequency domain. 0 dB is ideal passage characteristics in the evaluation target frequency domain. The phase difference is a difference in phase between two balanced signals output from the balanced terminals BT1 and BT2, so that 180 deg is a more ideal phase balance. The amplitude difference is a difference in amplitude between two balanced signals output from the balanced terminals BT1 and BT2, so that 0 dB is a more ideal output balance.

These results demonstrate that the thin film baluns 7A and 7B of the examples maintain excellent characteristics in both the passage characteristics and the balance characteristics, as compared with the thin film balun 7R of the comparative example. Moreover, the results of the examples 1A and 1B demonstrate that, by adjusting the position of the capacitor D1, the balance characteristics can be adjusted while maintaining excellent passage characteristics.

Example 1C

Figure 91:
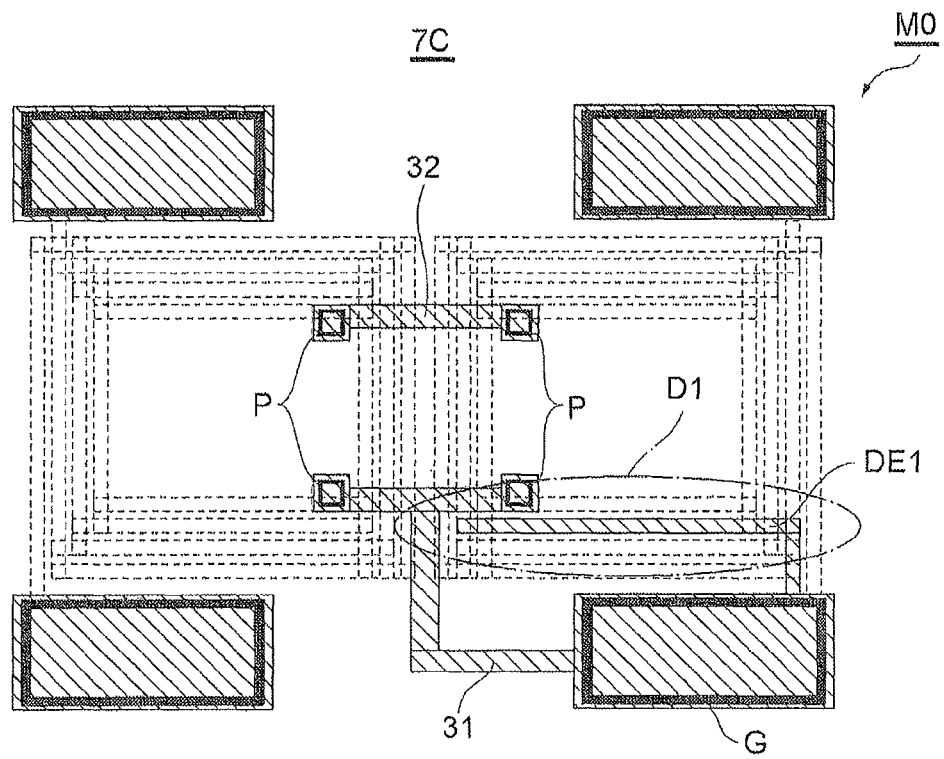
FIG. 91 is a horizontal sectional view showing the wiring layer M0 of a thin film balun 7C.

FIG. 91 is a horizontal sectional view schematically showing the wiring layer M0 of a thin film balun 7C of an example 1C according to the present invention. Structures other than the wiring layer M0 are the same as those in the example 1A. In the thin film balun 7C shown in FIG. 91, the capacitor electrode DE1 is positioned extending horizontally so as to face the coil conductor 22 of the second line from the bottom of the coil portion C4 in plan view.

(Characteristic Evaluation)

Figure 92:
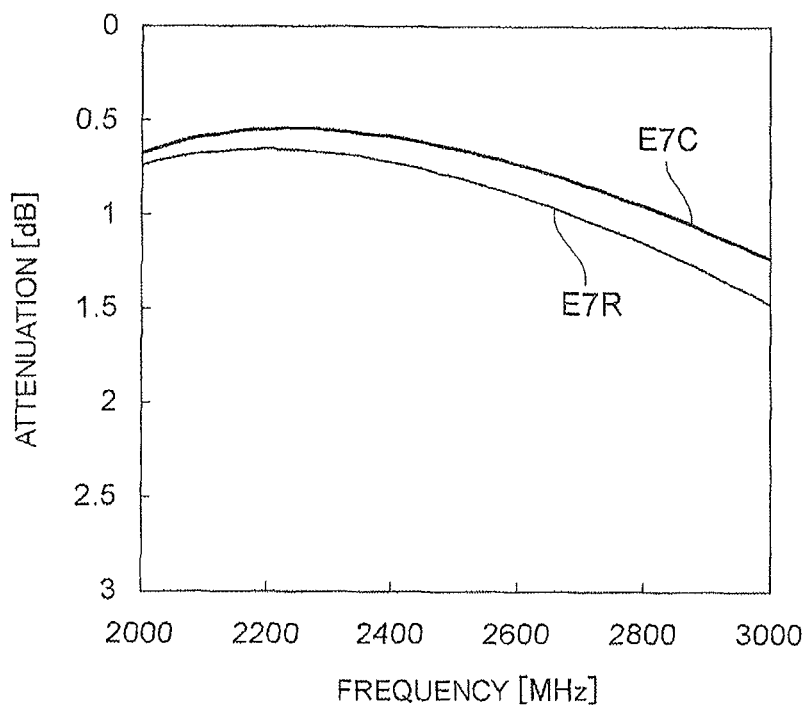
FIG. 92 is a graph showing passage characteristic evaluation results.
Figure 93:
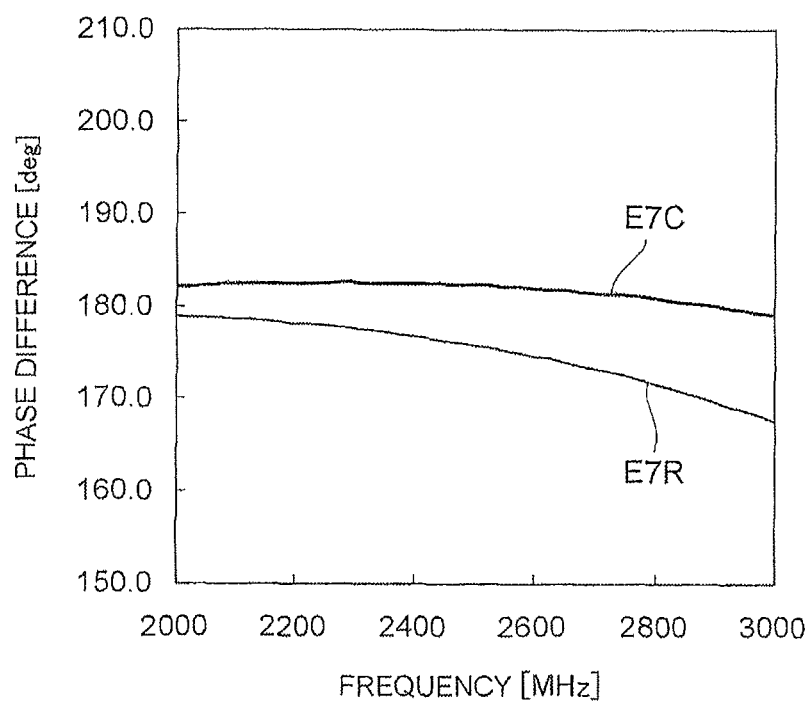
FIG. 93 is a graph showing phase difference evaluation results.
Figure 94:
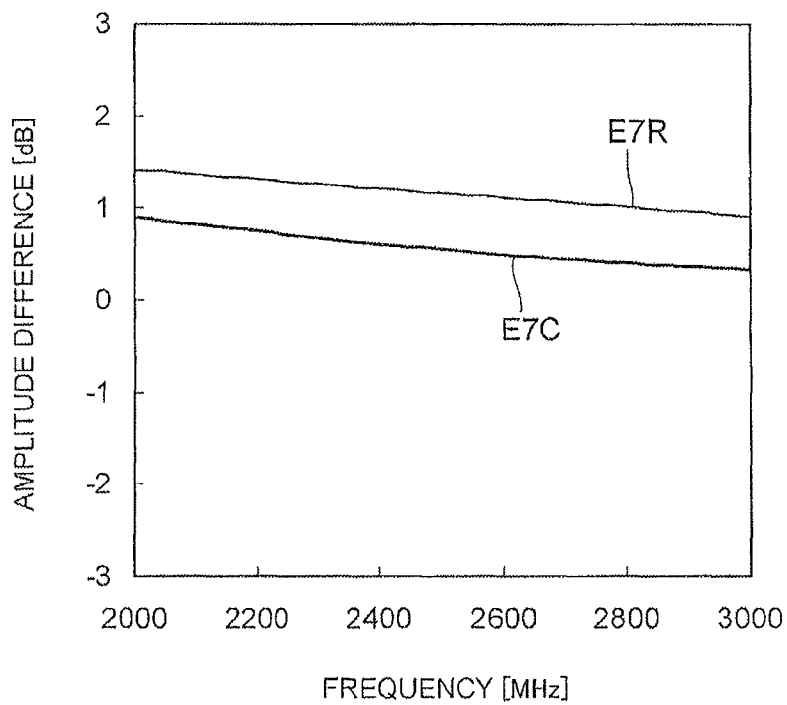
FIG. 94 is a graph showing amplitude difference evaluation results.

Passage characteristics (insertion loss) and balance characteristics (phase difference and amplitude difference of balanced signals) of the thin film balun 7C described above were measured by simulation. Evaluation target frequencies (resonant frequencies fr) of a transmission signal were set at 2400 MHz to 2500 MHz. FIG. 92 is a diagram showing passage characteristic evaluation results, FIG. 93 is a diagram showing phase difference evaluation results, and FIG. 94 is a diagram showing amplitude difference evaluation results. In each of FIGS. 92 to 94, curves E7C and E7R respectively indicate evaluation results of the thin film baluns 7C and 7R.

These results demonstrate that the thin film balun 7C of the example 1C maintains excellent characteristics in both the passage characteristics and the balance characteristics, as compared with the thin film balun 7R of the comparative example 1R.

Example 1D

Figure 95:
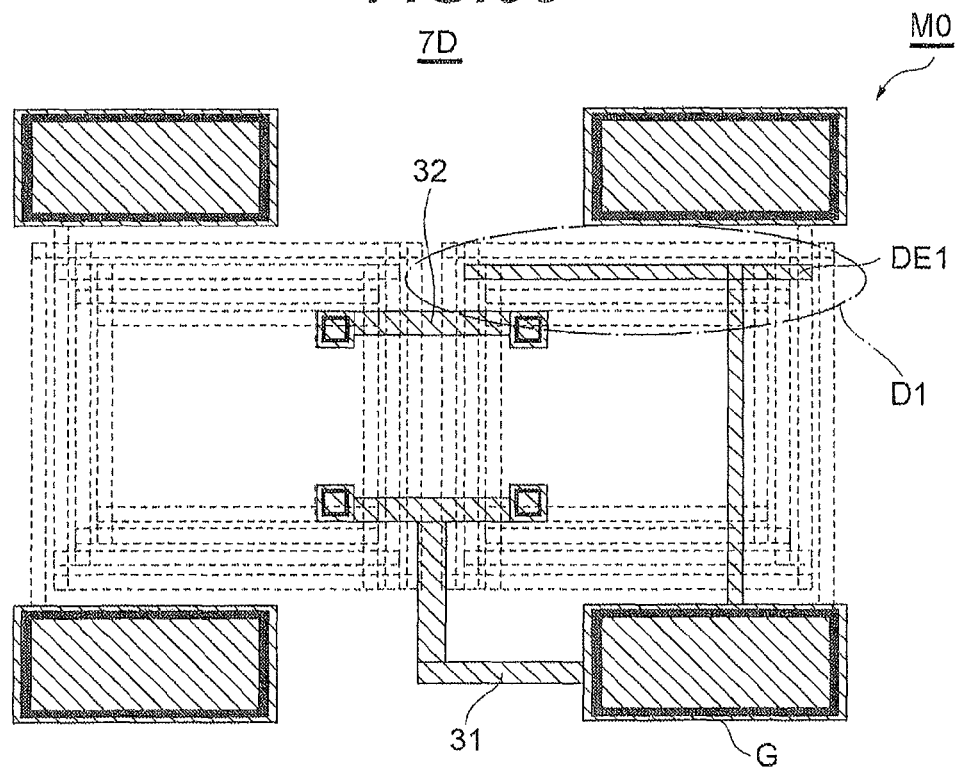
FIG. 95 is a horizontal sectional view showing the wiring layer M0 of a thin film balun 7D.

FIG. 95 is a horizontal sectional view schematically showing the wiring layer M0 of a thin film balun 7D of an example 1D. Structures other than the wiring layer M0 are the same as those in the example 1A. In the thin film balun 7D shown in FIG. 95, the capacitor electrode DE1 is positioned extending horizontally so as to face the coil conductor 22 of the second line from the top of the coil portion C4 in plan view.

Example 1E

Figure 96:
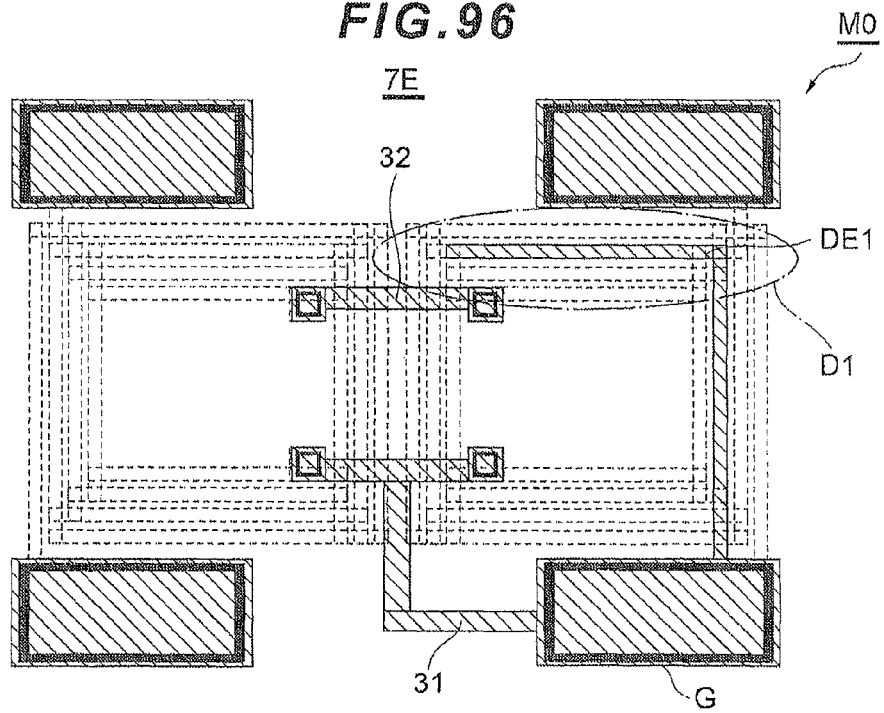
FIG. 96 is a horizontal sectional view showing the wiring layer M0 of a thin film balun 7E.

FIG. 96 is a horizontal sectional view schematically showing the wiring layer M0 of a thin film balun 7E of an example 1E. Structures other than the wiring layer M0 are the same as those in the example 1A. In the thin film balun 7E shown in FIG. 96, the capacitor electrode DE1 is positioned extending horizontally and vertically so as to face the coil conductor 22 of the second line from the top of the coil portion C4 and the coil conductor 22 of the second line from the right of the coil portion C4 in plan view.

(Characteristic Evaluation)

Figure 97:
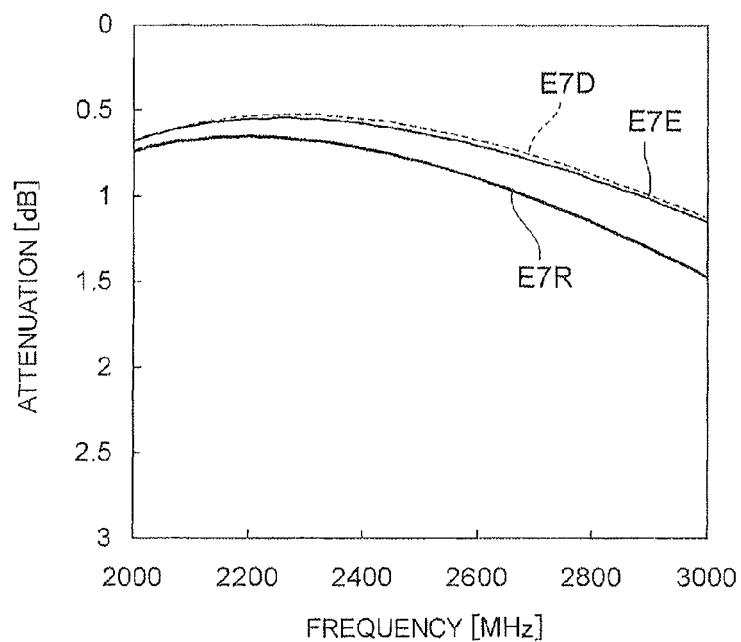
FIG. 97 is a graph showing passage characteristic evaluation results.
Figure 98:
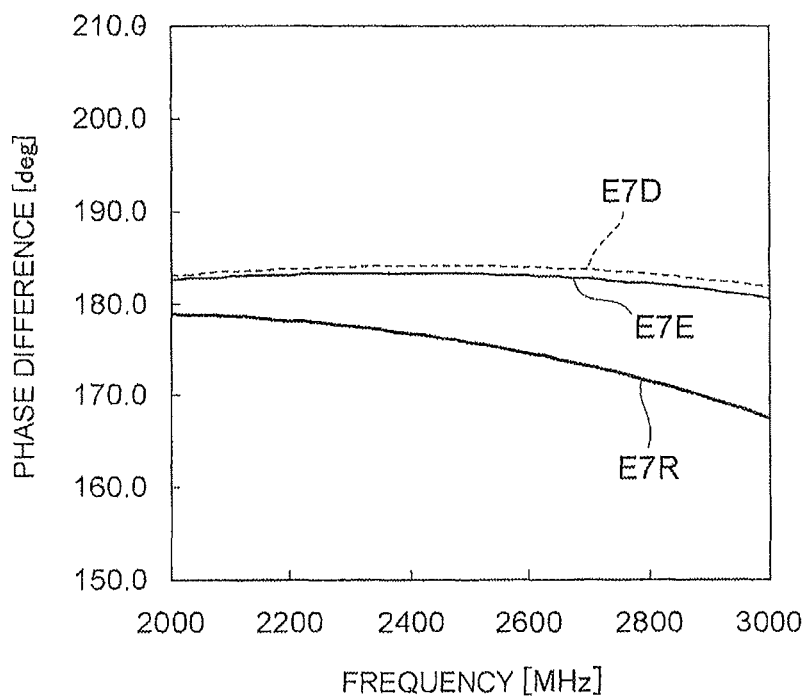
FIG. 98 is a graph showing phase difference evaluation results.
Figure 99:
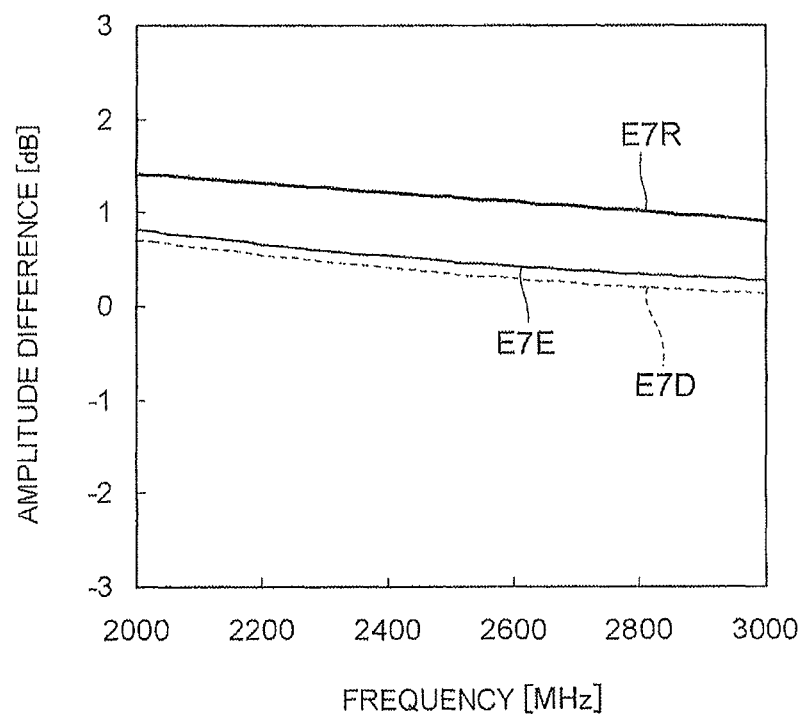
FIG. 99 is a graph showing amplitude difference evaluation results.

Passage characteristics (insertion loss) and balance characteristics (phase difference and amplitude difference of balanced signals) of each of the thin film baluns 7D and 7E described above were measured by simulation. Evaluation target frequencies (resonant frequencies fr) of a transmission signal were set at 2400 MHz to 2500 MHz. FIG. 97 is a diagram showing passage characteristic evaluation results, FIG. 98 is a diagram showing phase difference evaluation results, and FIG. 99 is a diagram showing amplitude difference evaluation results. In each of FIGS. 97 to 99, curves E7D, E7E, and E7R respectively indicate evaluation results of the thin film baluns 7D, 7E, and 7R.

These results demonstrate that the thin film baluns of the examples 1D and 1E according to the present invention maintain excellent characteristics in both the passage characteristics and the balance characteristics, as compared with the thin film balun of the comparative example 1R.

Example 2

Figure 100:
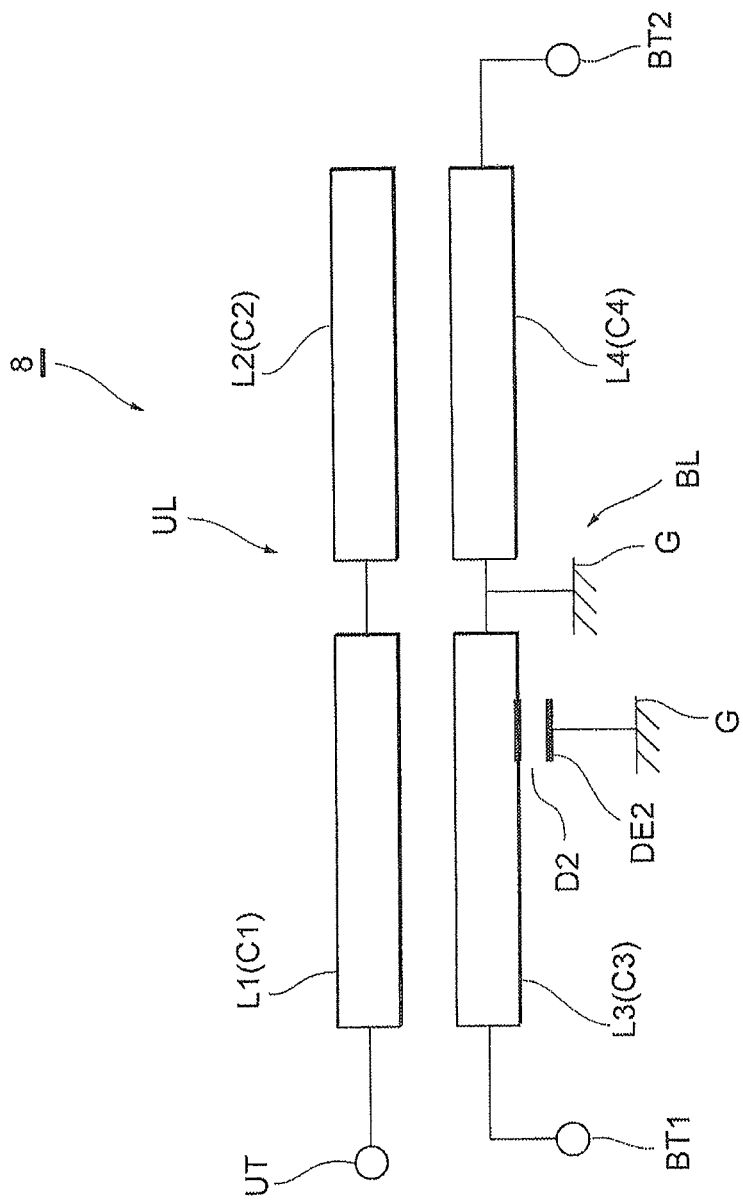
FIG. 100 is an equivalent circuit diagram showing a structure of a thin film balun 8 in the fifth embodiment of the present invention.

FIG. 100 is an equivalent circuit diagram showing a structure of a thin film balun of an example 2 in the fifth embodiment. In a thin film balun 8 of the example 2, the capacitor D2 is introduced between the ground terminal G and the line portion L3 of the balanced transmission line BL.

Example 2A

Figure 101:
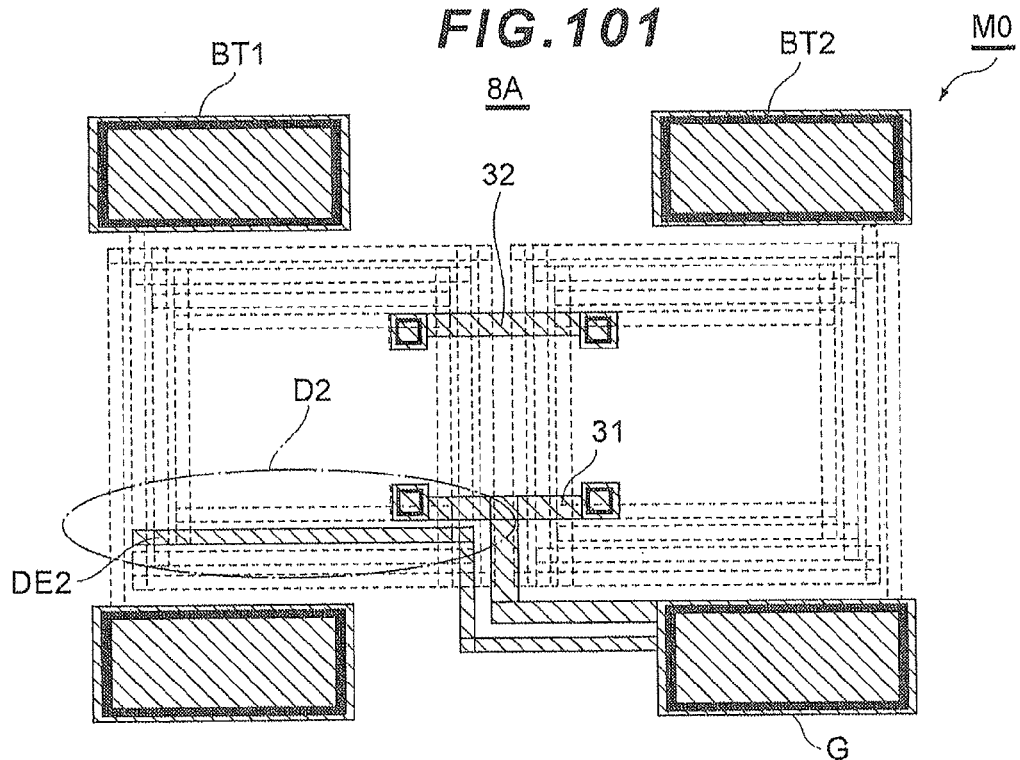
FIG. 101 is a horizontal sectional view showing the wiring layer M0 of a thin film balun 8A.

A pattern of the wiring layer M0 in the example of the thin film balun having the circuit structure shown in FIG. 100 is described in detail below. FIG. 101 is a horizontal sectional view schematically showing the wiring layer M0 of a thin film balun 8A of an example 2A. Structures other than the wiring layer M0 are the same as those in the example 1A. In the thin film balun 8A shown in FIG. 101, the capacitor electrode DE2 is positioned extending horizontally so as to face the coil conductor 21 of the second line from the bottom of the coil portion C3 of the balanced transmission line BL in plan view.

Example 2B

Figure 102:
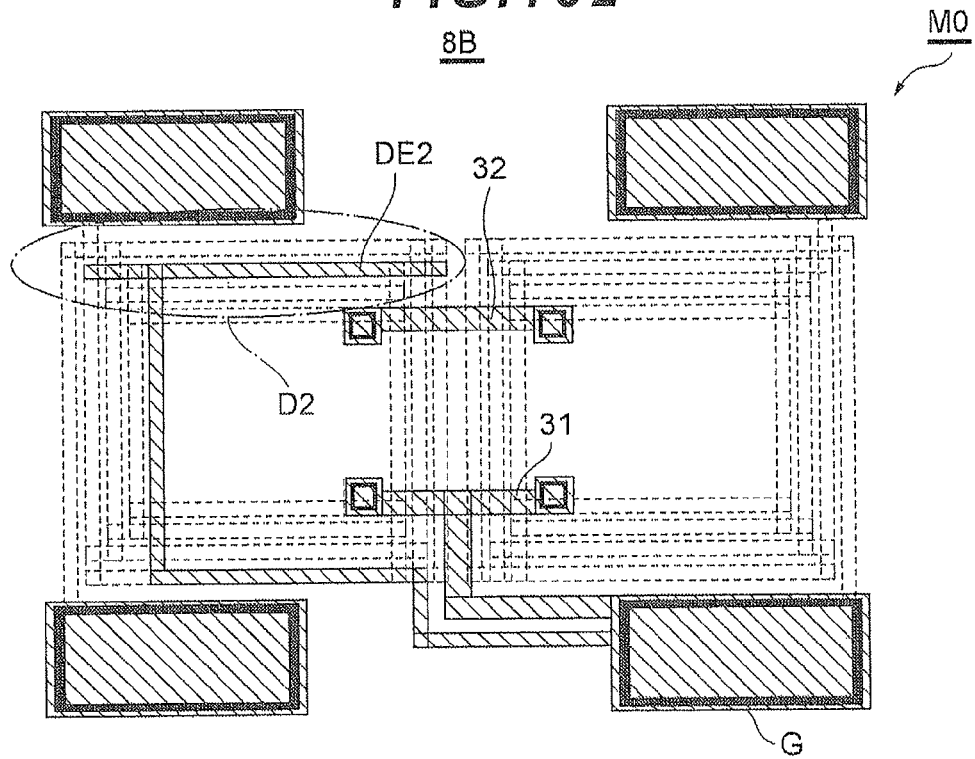
FIG. 102 is a horizontal sectional view showing the wiring layer M0 of a thin film balun 8B.

FIG. 102 is a horizontal sectional view schematically showing the wiring layer M0 of a thin film balun 8B of an example 2B. Structures other than the wiring layer M0 are the same as those in the example 1A. In the thin film balun 8B shown in FIG. 102, the capacitor electrode DE2 is positioned extending horizontally so as to face the coil conductor 21 of the second line from the top of the coil portion C3 in plan view.

Comparative Example 2R

Figure 103:
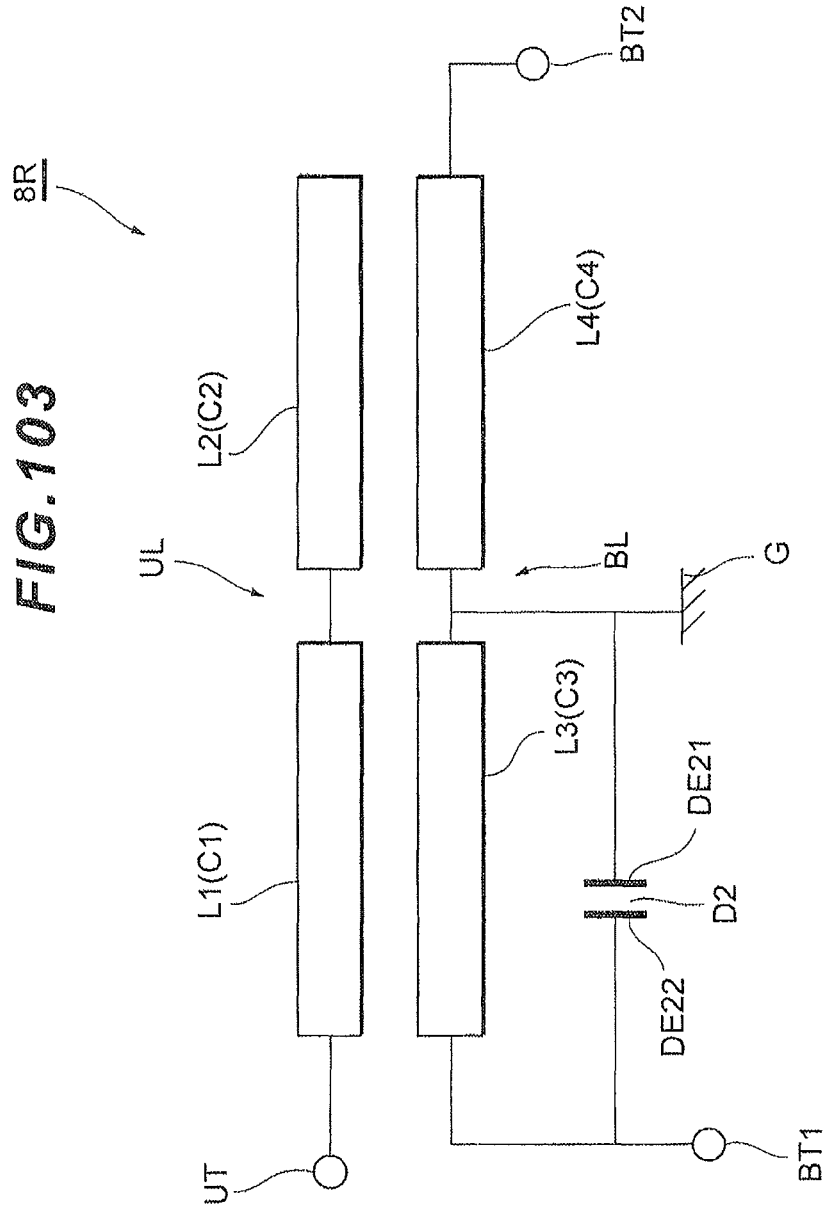
FIG. 103 is an equivalent circuit diagram showing a structure of a thin film balun 8R of a comparative example.
Figure 104:
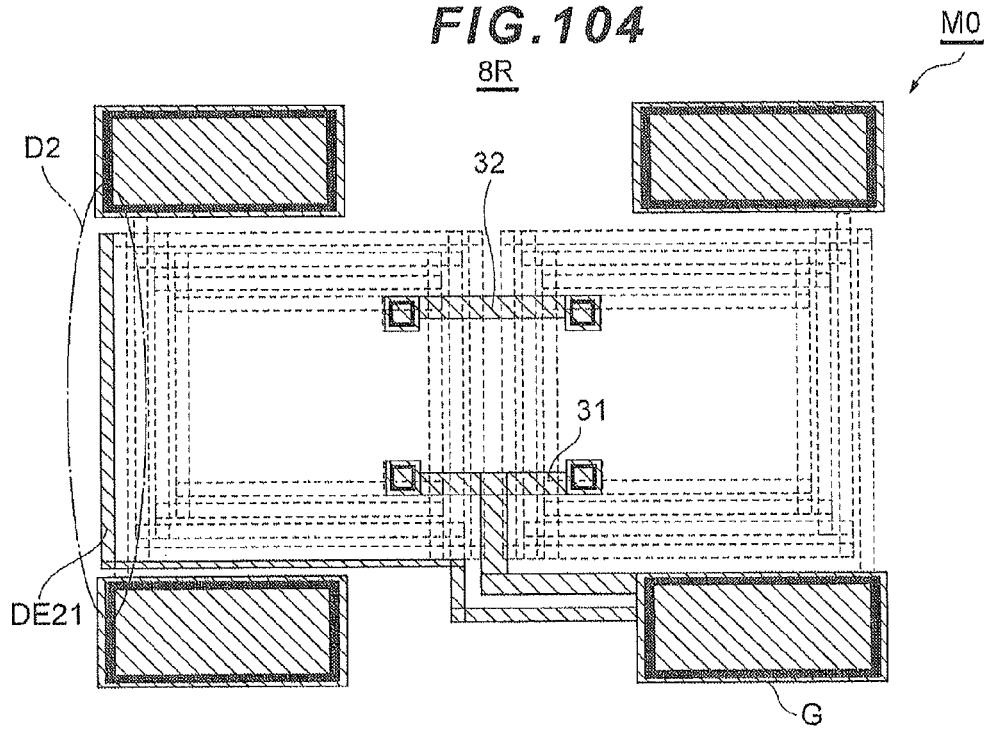
FIG. 104 is a horizontal sectional view showing the wiring layer M0 of the thin film balun 8R.
Figure 105:
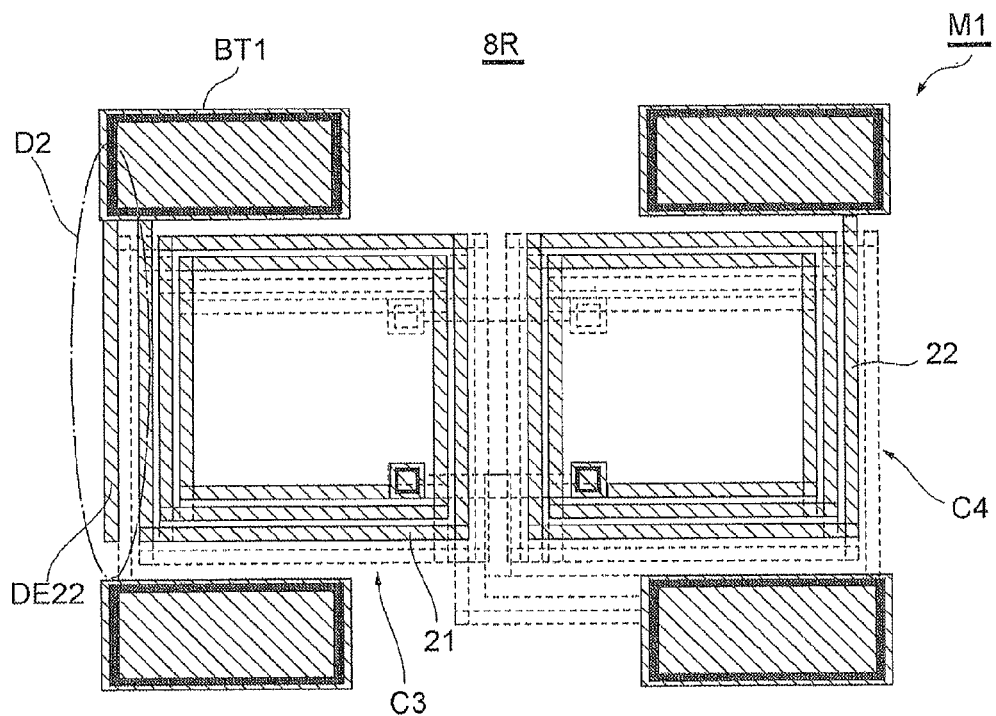
FIG. 105 is a horizontal sectional view showing the wiring layer M1 of the thin film balun 8R.

FIG. 103 is an equivalent circuit diagram showing a structure of a thin film balun 8R of a comparative example FIGS. 104 and 105 are horizontal sectional views schematically showing the wiring layers M0 and M1 of the thin film balun 8R of the comparative example, respectively. Structures other than the wiring layers M0 and M1 are the same as those in the example 1A.

As shown in FIG. 103, in the thin film balun 8R of the comparative example, the capacitor D2 is connected between the ground terminal G and the balanced terminal BT1 in a form of branching from the line portion L3 independently. As shown in FIG. 104, a capacitor electrode DE21 connected to the ground terminal G is provided in the wiring layer M0 so as to face a region outside the coil portion C3 in the wiring layer M1. As shown in FIG. 105, a capacitor electrode DE22 facing the capacitor electrode DE21 is formed in the wiring layer M1. The capacitor electrode DE22 is provided independently of the coil portion C3 of the balanced transmission line BL, and has one end connected to the balanced terminal BT1.

(Characteristic Evaluation)

Figure 106:
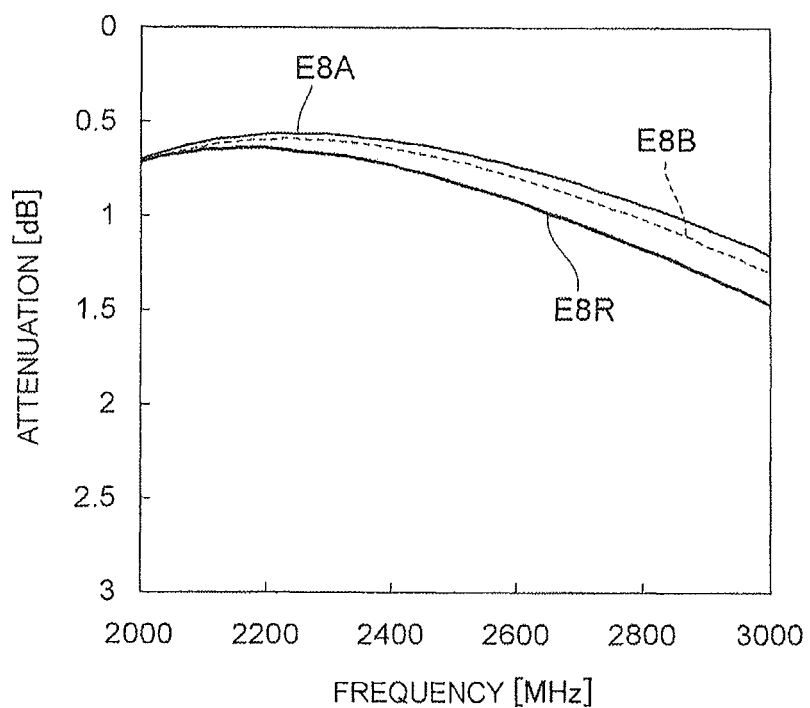
FIG. 106 is a graph showing passage characteristic evaluation results.
Figure 107:
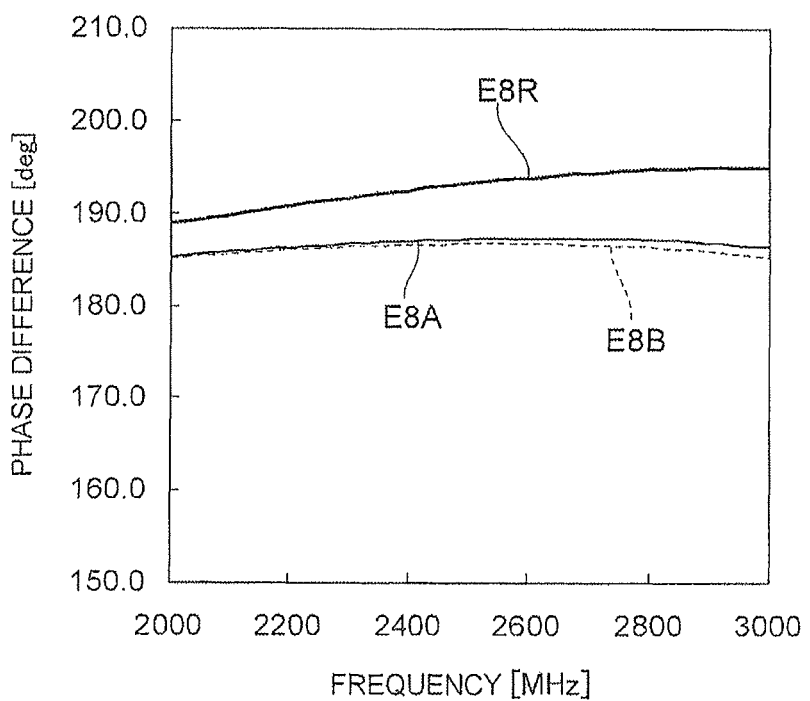
FIG. 107 is a graph showing phase difference evaluation results.
Figure 108:
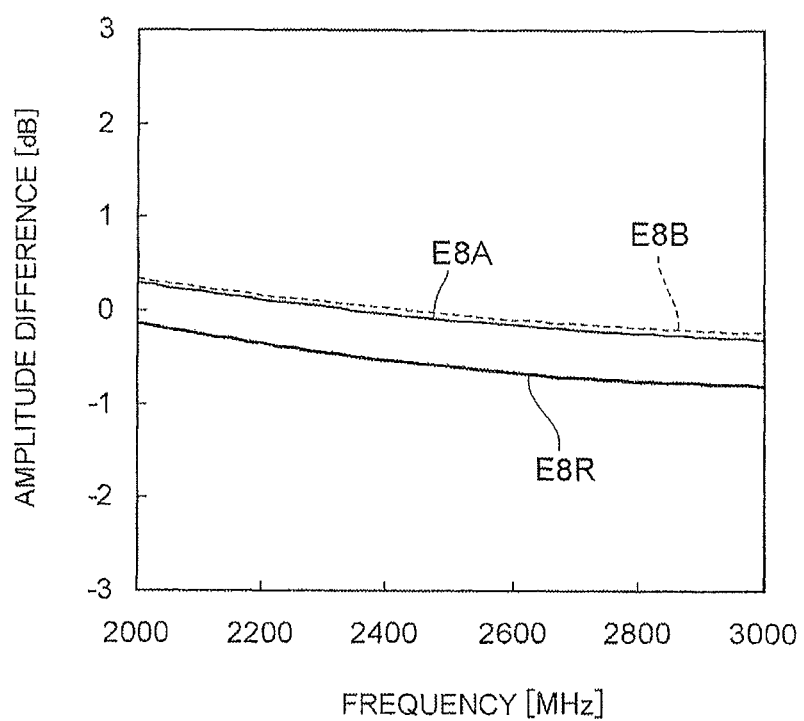
FIG. 108 is a graph showing amplitude difference evaluation results.

Passage characteristics (insertion loss) and balance characteristics (phase difference and amplitude difference of balanced signals) of each of the thin film baluns 8A, 8B, and 8R described above were measured by simulation. Evaluation target frequencies (resonant frequencies fr) of a transmission signal were set at 2400 MHz to 2500 MHz. FIG. 106 is a diagram showing passage characteristic evaluation results, FIG. 107 is a diagram showing phase difference evaluation results, and FIG. 108 is a diagram showing amplitude difference evaluation results. In each of FIGS. 106 to 108, curves E8A, E8B, and E8R respectively indicate evaluation results of the thin film baluns 8A, 8B, and 8R.

These results demonstrate that the thin film baluns 8A and 8B of the examples maintain excellent characteristics in both the passage characteristics and the balance characteristics, as compared with the thin film balun 8R of the comparative example.

Example 3

Figure 109:
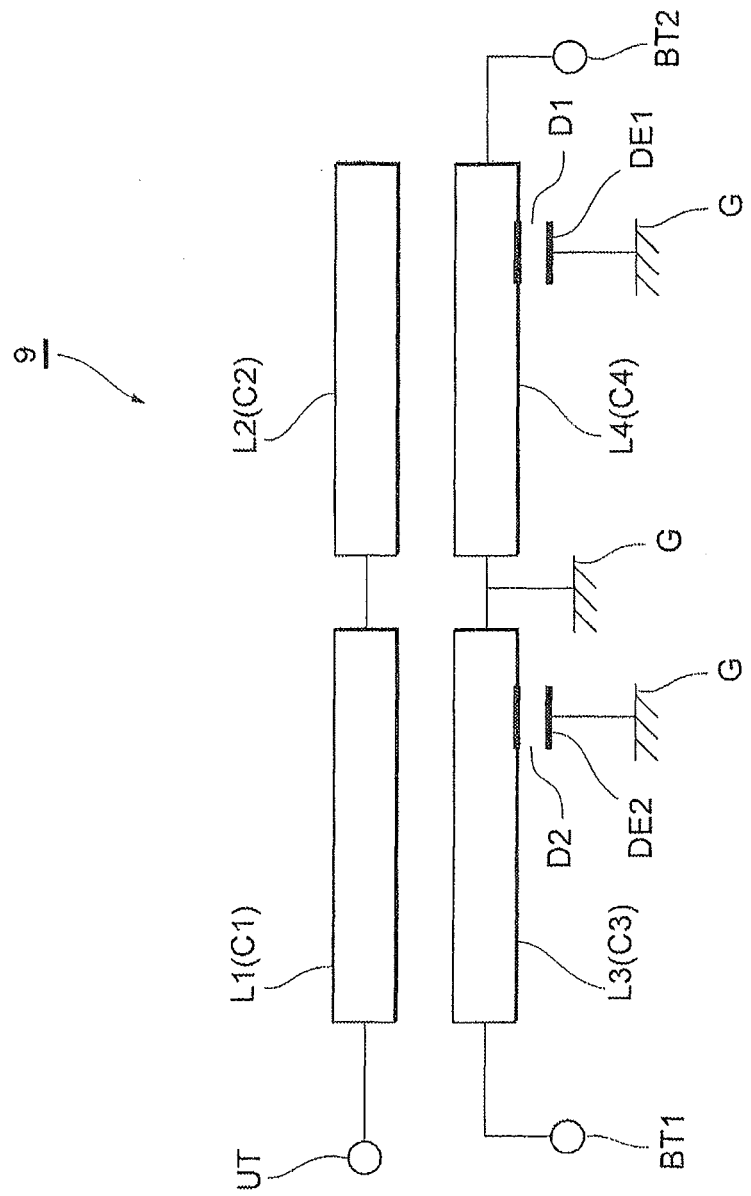
FIG. 109 is an equivalent circuit diagram showing a structure of a thin film balun 9 in the fifth embodiment of the present invention.

FIG. 109 is an equivalent circuit diagram showing a structure of a thin film balun of an example 3 in the fifth embodiment of the present invention. In a thin film balun 9 of the example 3, not only the capacitor D1 is introduced between the ground terminal G and the line portion L4 of the balanced transmission line BL, but also the capacitor D2 is introduced between the ground terminal G and the line portion L3.

Example 3A

Figure 110:
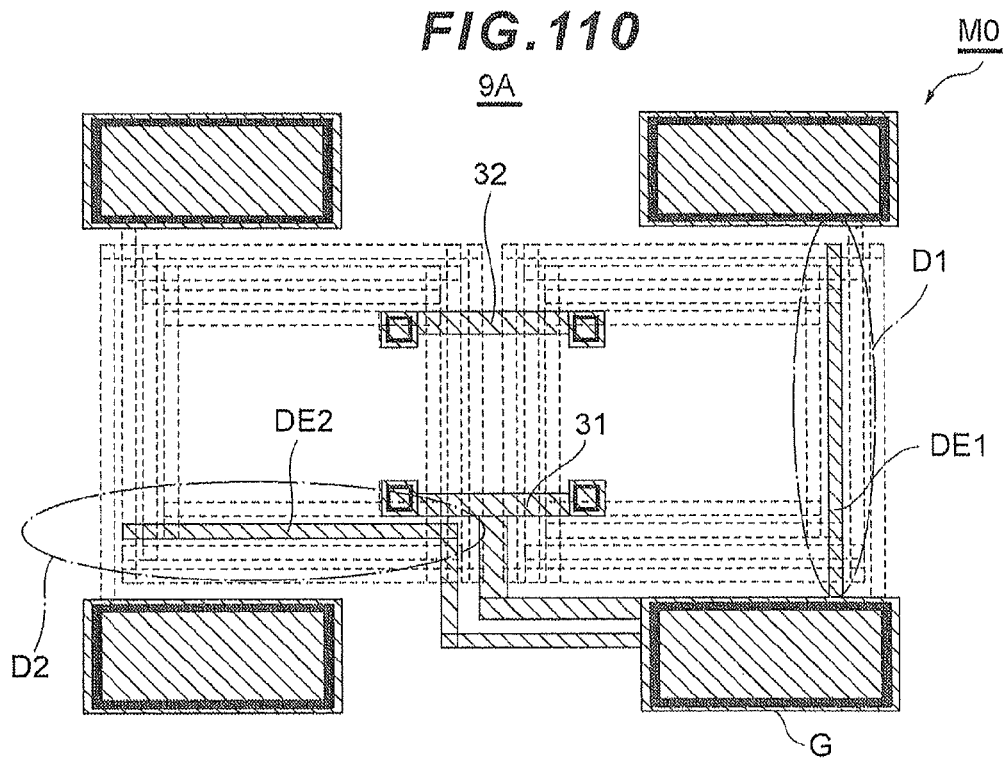
FIG. 110 is a horizontal sectional view showing the wiring layer M0 of a thin film balun 9A.

A pattern of the wiring layer M0 in the example of the thin film balun having the circuit structure shown in FIG. 109 is described in detail below. FIG. 110 is a horizontal sectional view schematically showing the wiring layer M0 of a thin film balun 9A of an example 3A according to the present invention. Structures other than the wiring layer M0 are the same as those in the example 1A. In the thin film balun 9A shown in FIG. 110, the two capacitor electrodes DE1 and DE2 connected to the ground terminal G are formed in the wiring layer M0. The capacitor electrode DE1 is positioned extending vertically so as to face the coil conductor 22 of the second line from the right of the coil portion C4 in plan view. The capacitor electrode DE2 is positioned extending horizontally so as to face the coil conductor 21 of the second line from the bottom of the coil portion C3 in plan view.

(Characteristic Evaluation)

Figure 111:
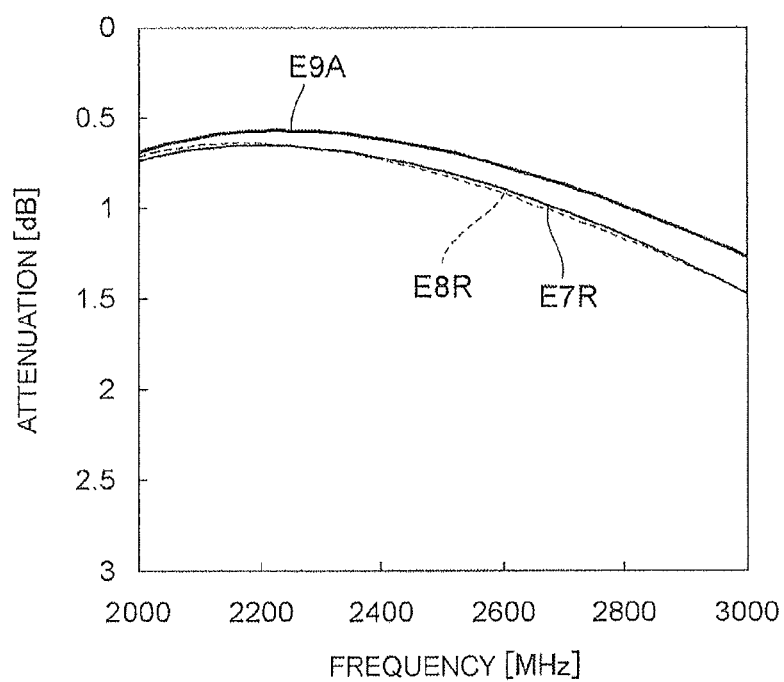
FIG. 111 is a graph showing passage characteristic evaluation results.
Figure 112:
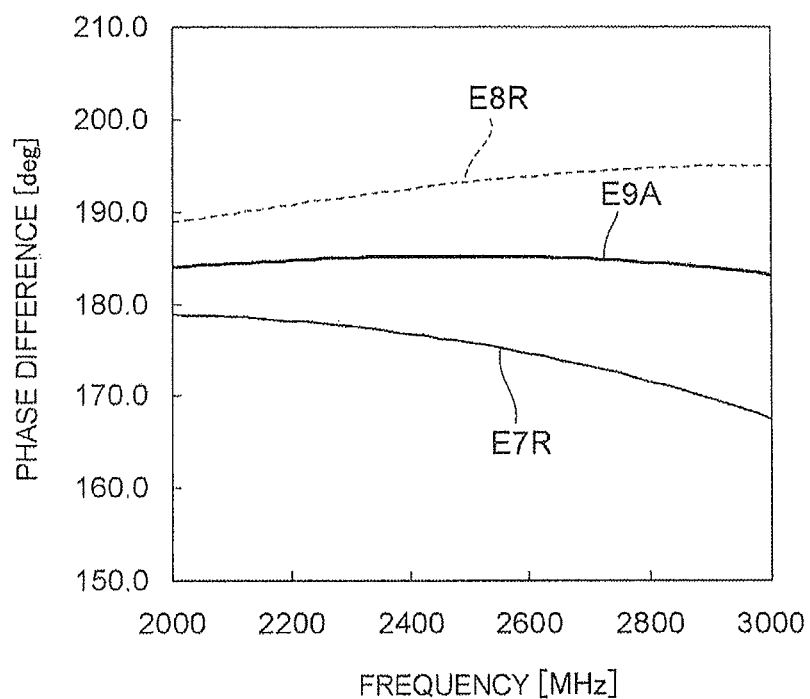
FIG. 112 is a graph showing phase difference evaluation results.
Figure 113:
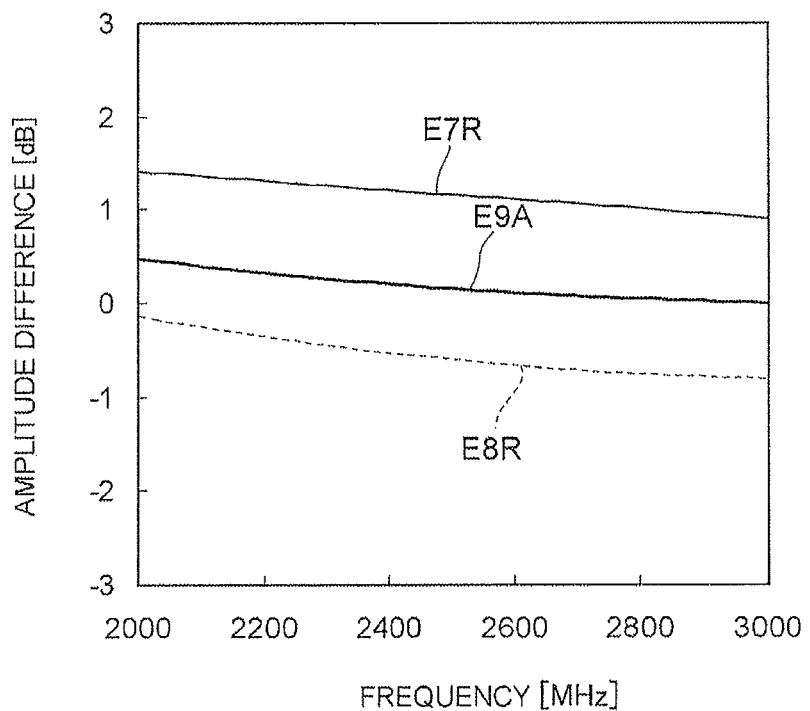
FIG. 113 is a graph showing amplitude difference evaluation results.

Passage characteristics (insertion loss) and balance characteristics (phase difference and amplitude difference of balanced signals) of the thin film balun 9A described above were measured by simulation. Evaluation target frequencies (resonant frequencies fr) of a transmission signal were set at 2400 MHz to 2500 MHz. FIG. 111 is a diagram showing passage characteristic evaluation results, FIG. 112 is a diagram showing phase difference evaluation results, and FIG. 113 is a diagram showing amplitude difference evaluation results. In each of FIGS. 111 to 113, a curve E9A indicates evaluation results of the thin film balun 9A. Meanwhile, curves E7R and E8R in each of FIGS. 111 to 113 respectively indicate evaluation results of the thin film baluns 7R and 8R of the comparative examples where the capacitor is provided independently.

These results demonstrate that the thin film balun 9A of the example exhibits excellent characteristics in both the passage characteristics and the balance characteristics, as compared with the thin film baluns 7R and 8R of the comparative examples.

As noted earlier, the present invention is not limited to the above examples, and various changes can be made without departing from the scope of the present invention. For example, though the part of the coil portion C3 or C4 constituting the balanced transmission line BL serves as a capacitor electrode in the examples, a layer of another capacitor electrode connected to the coil portion C3 or C4 may be formed between the coil portion C3 or C4 and the capacitor electrode DE2 or DE1. Moreover, the arrangement of the unbalanced terminal UT, the balanced terminals BT1 and BT2, and the ground terminal G is not limited to the positions shown in the drawings. Besides, the wiring layers on the insulating substrate 100 may be reversed in order. Furthermore, various coil arrangements may be employed without departing from the scope of the present invention.

According to the thin film balun in the fifth embodiment of the present invention, the capacitor is introduced between the ground terminal and a part of the balanced transmission line, so that the thin film balun can be made smaller and thinner while maintaining required balun characteristics. Such a thin film balun is widely applicable, in particular to wireless communication devices, apparatuses, modules, and systems which are required to be smaller and thinner, facilities including them, and manufacturing thereof.

What is claimed is:

1. A thin film balun comprising:
   an unbalanced transmission line provided in a first layer;
   a balanced transmission line provided in a second layer, facing the unbalanced transmission line in a lamination direction and electromagnetically coupled to the unbalanced transmission line;
   a capacitor including a capacitor electrode, the capacitor electrode facing a part of the unbalanced transmission line in the lamination direction and the part of the unbalanced transmission line facing the balanced transmission line in the lamination direction; and
   an unbalanced terminal connected to the unbalanced transmission line and the capacitor electrode.

2. The thin film balun according to claim 1, wherein the part of the unbalanced transmission line serves as an opposite electrode to form the capacitor together with the capacitor electrode.

3. The thin film balun according to claim 1, wherein
   the capacitor electrode is provided in a third layer facing the part of the unbalanced transmission line in the lamination direction.

4. A thin film balun comprising
an unbalanced transmission line formed in a first wiring layer and including a first line portion and a second line portion;
a balanced transmission line formed in a second wiring layer and including a third line portion and a fourth line portion, the third line portion facing the first line portion in the lamination direction and electromagnetically coupled to the first line portion and the fourth line portion facing the second line portion in the lamination direction and electromagnetically coupled to the second line portion;
a first capacitor including a first capacitor electrode, the first capacitor electrode facing a part of the second line portion in the lamination direction and the part of the second line portion facing the fourth line portion in the lamination direction; and
an unbalanced terminal connected to the first line portion and the first capacitor electrode.

5. The thin film balun according to claim 4, further comprising:
a second capacitor including a second capacitor electrode, the second capacitor electrode facing apart of the first line portion in the lamination direction and the part of the first line portion facing the third line portion in the lamination direction, wherein
the unbalanced terminal is connected to the first line portion, the first capacitor electrode and the second capacitor electrode.

6. The thin film balun according to claim 5, wherein the first and second capacitor electrodes are formed in a third wiring layer.

7. The thin film balun according to claim 6, wherein
one end of the first line portion is connected an unbalanced terminal,
the other end of the first line portion is connected to one end of the second line portion through a first wiring formed in a fourth wiring layer,
the other end of the second line portion is an open end,
one end of the third line portion is connected to a first balanced terminal,
the other end of the third line portion is connected to one end of the fourth line portion through a second wiring formed in the fourth wiring layer, and
the other end of the fourth line portion is connected to a second balanced terminal.

8. The thin film balun according to claim 7, wherein the second wiring is connected to a ground terminal through a third wiring formed in the fourth wiring layer.

9. The thin film balun according to claim 4, wherein the first line portion is longer than the third line portion.

10. The thin film balun according to claim 4, wherein the unbalanced terminal is disposed closer to the first line portion than the second line portion.

11. A thin film balun comprising:
an unbalanced transmission line including a first line portion and a second line portion;
a balanced transmission line including a third line portion and a fourth line portion that are positioned facing the first line portion and the second line portion and electromagnetically coupled to the first line portion and the second line portion, respectively;
an unbalanced terminal connected to the first line portion;
a group terminal connected to the first line portion via a C component; and
an opposite electrode connected to the ground terminal and facing a part of the first line portion, wherein
the second line portion has a larger width than the first line portion,
the fourth line portion has a larger width than the third line portion, and
the C component is formed by the opposite electrode and the part of the first line portion.

12. The thin film balun according to claim 11, wherein each of the second line portion and the fourth line portion has a larger width than the first line portion and the third line portion.

13. The thin film balun according to claim 11, wherein
the first line portion includes a first coil portion,
the second lone portion includes a second coil portion,
the third line portion include a third coil portion, and
the fourth line portion includes a fourth coil portion.

14. The thin film balun according to claim 13, wherein the opposite electrode faces a part of a coil conductor that is closer to an outer peripheral coil conductor than an inner peripheral coil conductor in the first coil portion.

15. The thin film balun according to claim 11, wherein
the first line portion and the second line portion are formed in a first wiring layer,
the third line portion and the fourth line portion are formed in a second wiring layer, and
the opposite electrode is formed in a third wiring layer.

16. The thin film balun according to claim 15, wherein
one end of the first line portion is connected to the unbalanced terminal,
the other end of the first line portion is connected to one end of the second line portion through a first wiring formed in a fourth wiring layer,
the other end of the second line portion is an open end,
one end of the third line portion is connected to a first balanced terminal,
the other end of the third line portion is connected to one end of the fourth line portion through a second wiring formed in the fourth wiring layer, and
the other end of the fourth line portion is connected to a second balanced terminal.

17. The thin film balun according to claim 16, wherein the second wiring is connected to a ground terminal through a third wiring formed in the fourth wiring layer.

18. The thin film balun according to claim 11, wherein
the first line portion is longer than the third line portion, and
the second line portion is longer than the fourth line portion.

* * * * *